(12) United States Patent
Lin et al.

(10) Patent No.: US 7,494,843 B1
(45) Date of Patent: Feb. 24, 2009

(54) METHOD OF MAKING A SEMICONDUCTOR CHIP ASSEMBLY WITH THERMAL CONDUCTOR AND ENCAPSULANT GRINDING

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 321 days.

(21) Appl. No.: 11/645,488

(22) Filed: Dec. 26, 2006

(51) Int. Cl.
*H01L 21/44* (2006.01)
(52) U.S. Cl. .............. 438/106; 438/108; 438/109; 438/112; 438/118; 438/119; 438/122; 438/124; 438/126; 438/127; 257/E21.502
(58) Field of Classification Search .............. 438/106, 438/108, 109, 112, 118, 119, 122, 124, 126, 438/127; 257/E21.502
See application file for complete search history.

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,706,166 A | 11/1987 | Go | 361/403 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,897,708 A | 1/1990 | Clements | 357/65 |
| 4,925,083 A | 5/1990 | Farassat et al. | 228/102 |
| 4,937,653 A | 6/1990 | Blonder et al. | 357/68 |
| 4,954,875 A | 9/1990 | Clements | 357/75 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 4,996,583 A | 2/1991 | Hatada | 357/70 |
| 5,014,111 A | 5/1991 | Tsuda et al. | 357/68 |
| 5,049,979 A | 9/1991 | Hashemi et al. | 357/75 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,104,820 A | 4/1992 | Go et al. | 437/51 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,138,438 A | 8/1992 | Masayuki et al. | 357/75 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |

(Continued)

OTHER PUBLICATIONS

"Thermal Interface Materials," Application Note by Indium Corporation of America, pp. 1-2, available at http://www.indium.com/techlibrary/applicationnotes.php (last visited Nov. 12, 2006).

(Continued)

*Primary Examiner*—Thanh V Pham
(74) *Attorney, Agent, or Firm*—David M. Sigmond

(57) ABSTRACT

A method of making a semiconductor chip assembly includes mechanically attaching a semiconductor chip to a routing line, forming a thermal conductor on the chip, forming an encapsulant that covers the chip and the thermal conductor, grinding the encapsulant without grinding the thermal conductor or the chip and then grinding the encapsulant and the thermal conductor without grinding the chip such that the encapsulant and the thermal conductor are laterally aligned.

100 Claims, 45 Drawing Sheets

U.S. PATENT DOCUMENTS

| | | | |
|---|---|---|---|
| 5,209,817 A | 5/1993 | Ahmad et al. ............... 156/643 |
| 5,237,130 A | 8/1993 | Kulesza et al. ............. 174/260 |
| 5,260,234 A | 11/1993 | Long ......................... 437/203 |
| 5,261,593 A | 11/1993 | Casson et al. .......... 228/180.22 |
| 5,275,330 A | 1/1994 | Isaacs et al. ............. 228/180.2 |
| 5,284,796 A | 2/1994 | Nakanishi et al. ........... 437/183 |
| 5,293,067 A | 3/1994 | Thompson et al. ......... 257/668 |
| 5,294,038 A | 3/1994 | Nakano et al. ............ 228/179.1 |
| 5,327,010 A | 7/1994 | Uenaka et al. .............. 257/679 |
| 5,332,922 A | 7/1994 | Oguchi et al. ............... 257/723 |
| 5,334,804 A | 8/1994 | Love et al. .................. 174/267 |
| 5,346,750 A | 9/1994 | Hatakeyama et al. ....... 428/209 |
| 5,355,283 A | 10/1994 | Marrs et al. ................. 361/760 |
| 5,358,621 A | 10/1994 | Oyama ....................... 205/123 |
| 5,364,004 A | 11/1994 | Davidson .................... 228/1.1 |
| 5,394,303 A | 2/1995 | Yamaji ....................... 361/749 |
| 5,397,921 A | 3/1995 | Karnezos .................... 257/779 |
| 5,407,864 A | 4/1995 | Kim ............................ 437/203 |
| 5,424,245 A | 6/1995 | Gurtler et al. ............... 437/183 |
| 5,438,477 A | 8/1995 | Pasch ......................... 361/689 |
| 5,439,162 A | 8/1995 | George et al. .......... 228/180.22 |
| 5,447,886 A | 9/1995 | Rai ............................. 437/183 |
| 5,454,161 A | 10/1995 | Beilin et al. ................. 29/852 |
| 5,454,928 A | 10/1995 | Rogers et al. ............... 205/125 |
| 5,475,236 A | 12/1995 | Yoshizaki ..................... 257/48 |
| 5,477,933 A | 12/1995 | Nguyen ...................... 174/262 |
| 5,478,007 A | 12/1995 | Marrs ..................... 228/180.22 |
| 5,483,421 A | 1/1996 | Gedney et al. .............. 361/771 |
| 5,484,647 A | 1/1996 | Nakatani et al. ............ 428/209 |
| 5,484,959 A | 1/1996 | Burns .......................... 174/524 |
| 5,485,949 A | 1/1996 | Tomura et al. ........... 228/180.5 |
| 5,487,218 A | 1/1996 | Bhatt et al. .................. 29/852 |
| 5,489,804 A | 2/1996 | Pasch ......................... 257/778 |
| 5,493,096 A | 2/1996 | Koh ........................ 219/121.71 |
| 5,508,229 A | 4/1996 | Baker ......................... 437/183 |
| 5,514,907 A | 5/1996 | Moshayedi .................. 257/723 |
| 5,525,065 A | 6/1996 | Sobhani ......................... 439/67 |
| 5,536,973 A | 7/1996 | Yamaji ....................... 257/737 |
| 5,542,601 A | 8/1996 | Fallon et al. ................ 228/119 |
| 5,547,740 A | 8/1996 | Higdon et al. .............. 428/209 |
| 5,556,810 A | 9/1996 | Fujitsu ........................ 437/209 |
| 5,556,814 A | 9/1996 | Inoue et al. ................. 437/230 |
| 5,564,181 A | 10/1996 | Dineen et al. ................ 29/841 |
| 5,572,069 A | 11/1996 | Schneider ................... 257/690 |
| 5,576,052 A | 11/1996 | Arledge et al. ................ 427/98 |
| 5,583,073 A | 12/1996 | Lin et al. ..................... 439/183 |
| 5,594,275 A | 1/1997 | Kwon et al. ................. 257/686 |
| 5,595,943 A | 1/1997 | Itabashi et al. .............. 437/230 |
| 5,599,744 A | 2/1997 | Koh et al. .................... 437/195 |
| 5,611,140 A | 3/1997 | Kulesza et al. ............... 29/832 |
| 5,611,884 A | 3/1997 | Bearinger et al. ............ 156/325 |
| 5,613,296 A | 3/1997 | Kurino et al. ................. 29/852 |
| 5,614,114 A | 3/1997 | Owen ..................... 219/121.66 |
| 5,615,477 A | 4/1997 | Sweitzer ...................... 29/840 |
| 5,619,791 A | 4/1997 | Lambrecht, Jr. et al. ....... 29/852 |
| 5,625,221 A | 4/1997 | Kim et al. .................... 257/686 |
| 5,627,405 A | 5/1997 | Chillara ....................... 257/668 |
| 5,627,406 A | 5/1997 | Pace ............................ 257/700 |
| 5,633,204 A | 5/1997 | Tago et al. ................... 438/614 |
| 5,637,920 A | 6/1997 | Loo ............................. 257/700 |
| 5,641,113 A | 6/1997 | Somaki et al. .......... 228/180.22 |
| 5,645,628 A | 7/1997 | Endo et al. ................. 106/1.23 |
| 5,646,067 A | 7/1997 | Gaul ........................... 437/180 |
| 5,648,686 A | 7/1997 | Hirano et al. ............... 257/778 |
| 5,654,584 A | 8/1997 | Fujitsu ........................ 257/666 |
| 5,656,856 A | 8/1997 | Kweon ....................... 257/686 |
| 5,656,858 A | 8/1997 | Kondo et al. ............... 257/737 |
| 5,663,598 A | 9/1997 | Lake et al. .................. 257/737 |
| 5,665,652 A | 9/1997 | Shimizu ...................... 438/127 |
| 5,666,008 A | 9/1997 | Tomita et al. ............... 257/778 |
| 5,669,545 A | 9/1997 | Pham et al. .................. 228/1.1 |
| 5,674,785 A | 10/1997 | Akram et al. ................ 437/217 |
| 5,674,787 A | 10/1997 | Zhao et al. .................. 437/230 |
| 5,682,061 A | 10/1997 | Khandros et al. ........... 257/666 |
| 5,686,353 A | 11/1997 | Yagi et al. ................... 437/183 |
| 5,691,041 A | 11/1997 | Frankeny et al. ........... 428/209 |
| 5,722,162 A | 3/1998 | Chou et al. ................... 29/852 |
| 5,723,369 A | 3/1998 | Barber ........................ 438/106 |
| 5,731,223 A | 3/1998 | Padmanabhan ............. 437/183 |
| 5,736,456 A | 4/1998 | Akram ........................ 438/614 |
| 5,739,585 A | 4/1998 | Akram et al. ............... 257/698 |
| 5,744,827 A | 4/1998 | Jeong et al. ................. 257/686 |
| 5,744,859 A | 4/1998 | Ouchida ..................... 257/668 |
| 5,757,071 A | 5/1998 | Bhansali ..................... 257/697 |
| 5,757,081 A | 5/1998 | Chang et al. ................ 257/778 |
| 5,764,486 A | 6/1998 | Pendse ........................ 361/774 |
| 5,774,340 A | 6/1998 | Chang et al. ................ 361/771 |
| 5,789,271 A | 8/1998 | Akram .......................... 438/18 |
| 5,798,285 A | 8/1998 | Bentlage et al. ............. 438/108 |
| 5,801,072 A | 9/1998 | Barber ........................ 438/107 |
| 5,801,447 A | 9/1998 | Hirano et al. ............... 257/778 |
| 5,803,340 A | 9/1998 | Yeh et al. ................... 228/56.3 |
| 5,804,771 A | 9/1998 | McMahon et al. .......... 174/255 |
| 5,804,874 A | 9/1998 | An et al. ..................... 257/676 |
| 5,808,360 A | 9/1998 | Akram ........................ 257/738 |
| 5,811,879 A | 9/1998 | Akram ........................ 257/723 |
| 5,813,115 A | 9/1998 | Misawa et al. ............... 29/832 |
| 5,817,541 A | 10/1998 | Averkiou et al. ............ 438/107 |
| 5,822,856 A | 10/1998 | Bhatt et al. ................... 29/832 |
| 5,834,844 A | 11/1998 | Akagawa et al. ............ 257/734 |
| 5,854,507 A | 12/1998 | Miremadi et al. ........... 257/666 |
| 5,861,666 A | 1/1999 | Bellaar ........................ 257/686 |
| 5,863,816 A | 1/1999 | Cho ............................ 438/123 |
| 5,870,289 A | 2/1999 | Tokuda et al. ............... 361/779 |
| 5,883,435 A | 3/1999 | Geffken et al. .............. 257/758 |
| 5,910,685 A | 6/1999 | Watanabe et al. ........... 257/777 |
| 5,925,931 A | 7/1999 | Yamamoto .................. 257/737 |
| 5,973,393 A | 10/1999 | Chia et al. ................... 257/690 |
| 5,994,222 A | 11/1999 | Smith et al. ................. 438/689 |
| 6,001,671 A | 12/1999 | Fjelstad ....................... 438/112 |
| 6,012,224 A | 1/2000 | DiStefano et al. ............. 29/840 |
| 6,013,877 A | 1/2000 | Degani et al. ............... 174/264 |
| 6,017,812 A | 1/2000 | Yonezawa et al. .......... 438/613 |
| 6,018,196 A | 1/2000 | Noddin ....................... 257/777 |
| 6,020,561 A | 2/2000 | Ishida et al. ................. 174/261 |
| 6,025,650 A | 2/2000 | Tsuji et al. .................. 257/786 |
| 6,037,665 A | 3/2000 | Miyazaki .................... 257/773 |
| 6,046,909 A | 4/2000 | Joy ............................. 361/748 |
| 6,072,233 A | 6/2000 | Corisis et al. ............... 257/686 |
| 6,084,297 A | 7/2000 | Brooks et al. ............... 257/698 |
| 6,084,781 A | 7/2000 | Klein .......................... 361/771 |
| 6,088,236 A | 7/2000 | Tomura et al. .............. 361/783 |
| 6,103,552 A | 8/2000 | Lin ............................. 438/113 |
| 6,103,992 A | 8/2000 | Noddin ................... 219/121.71 |
| 6,124,633 A | 9/2000 | Vindasius et al. ........... 257/685 |
| 6,127,204 A | 10/2000 | Isaacs et al. ................. 438/106 |
| 6,137,163 A | 10/2000 | Kim et al. ................... 257/686 |
| 6,159,770 A | 12/2000 | Tetaka et al. ................ 438/112 |
| 6,180,881 B1 | 1/2001 | Isaak ......................... 174/52.4 |
| 6,188,127 B1 | 2/2001 | Senba et al. ................. 257/686 |
| 6,190,944 B1 | 2/2001 | Choi ........................... 438/109 |
| 6,218,728 B1 | 4/2001 | Kimura ....................... 257/693 |
| 6,235,554 B1 | 5/2001 | Akram et al. ............... 438/109 |
| 6,303,997 B1 | 10/2001 | Lee ............................. 257/778 |
| 6,335,565 B1 | 1/2002 | Miyamoto et al. .......... 257/686 |
| 6,479,321 B2 | 11/2002 | Wang et al. ................. 438/109 |
| 6,483,718 B2 | 11/2002 | Hashimoto .................. 361/803 |
| 6,492,718 B2 | 12/2002 | Ohmori ....................... 257/686 |
| 6,501,165 B1 | 12/2002 | Farnworth et al. .......... 257/686 |
| 6,504,241 B1 | 1/2003 | Yanagida .................... 257/686 |
| 6,509,639 B1 | 1/2003 | Lin ............................. 257/686 |
| 6,564,454 B1 | 5/2003 | Glenn et al. .................. 29/852 |
| 6,608,371 B2 | 8/2003 | Kurashima et al. .......... 257/686 |
| 6,794,741 B1 | 9/2004 | Lin et al. ..................... 257/686 |

| | | | | |
|---|---|---|---|---|
| 7,015,128 B1 * | 3/2006 | Chiang et al. | | 438/612 |
| 7,071,573 B1 | 7/2006 | Lin | | 257/778 |
| 7,094,676 B1 * | 8/2006 | Leu et al. | | 438/611 |
| 7,129,572 B2 * | 10/2006 | Wang | | 257/686 |
| 7,138,706 B2 * | 11/2006 | Arai et al. | | 257/678 |
| 2002/0153599 A1 | 10/2002 | Chang et al. | | 257/676 |

OTHER PUBLICATIONS

U.S. Appl. No. 09/465,024, filed Dec. 16, 1999, entitled "Bumpless Flip Chip Assembly With Solder Via".

U.S. Appl. No. 09/464,562, filed Dec. 16, 1999, entitled "Bumpless Flip Chip Assembly With Strips And Via-Fill".

U.S. Appl. No. 09/464,561, filed Dec. 16, 1999, entitled "Bumpless Flip Chip Assembly With Strips-In-Via And Plating".

U.S. Appl. No. 09/120,408, filed Jul. 22, 1998, entitled "Flip Chip Assembly With Via Interconnection".

U.S. Appl. No. 09/643,212, filed Aug. 22, 2000, entitled "Semiconductor Chip Assembly With Simultaneously Electroplated Contact Terminal and Connection Joint".

U.S. Appl. No. 09/643,214, filed Aug. 22, 2000, entitled "Semiconductor Chip Assembly with Simultaneously Electrolessly Plated Contact Terminal and Connection Joint".

U.S. Appl. No. 09/643,213, filed Aug. 22, 2000, entitled "Method Of Making A Support Circuit For A Semiconductor Chip Assembly".

U.S. Appl. No. 09/643,445, filed Aug. 22, 2000, entitled "Method Of Making A Semiconductor Chip Assembly".

U.S. Appl. No. 09/665,928, filed Sep. 20, 2000, entitled "Semiconductor Chip Assembly With Ball Bond Connection Joint".

U.S. Appl. No. 09/665,931, filed Sep. 20, 2000, entitled "Method Of Making A Support Circuit With A Tapered Through-Hole For A Semiconductor Chip Assembly".

U.S. Appl. No. 09/677,207, filed Oct. 2, 2000, entitled "Method Of Making A Semiconductor Chip Assembly With A Conductive Trace Subtractively Formed Before And After Chip Attachment".

U.S. Appl. No. 09/865,367, filed May 24, 2001, entitled "Semiconductor Chip Assembly With Simultaneously Electroplated Contact Terminal and Connection Joint".

U.S. Appl. No. 09/864,555, filed May 24, 2001, entitled "Semiconductor Chip Assembly with Simultaneously Electrolessly Plated Contact Terminal and Connection Joint".

U.S. Appl. No. 09/864,773, filed May 24, 2001, entitled "Semiconductor Chip Assembly With Ball Bond Connection Joint".

U.S. Appl. No. 11/472,703, filed Jul. 22, 2006, entitled "Semiconductor Chip Assembly with Welded Metal Pillar that Includes Enlarged Ball Bond".

U.S. Appl. No. 11/586,787, filed Oct. 26, 2006, entitled "Semiconductor Chip Assembly with Welded Metal Pillar and Enlarged Plated Contact Terminal".

U.S. Appl. No. 11/586,909, filed Oct. 26, 2006, entitled "Method of Making a Semiconductor Chip Assembly with Chip and Encapsulant Grinding".

U.S. Appl. No. 11/588,012, filed Oct. 26, 2006, entitled "Semiconductor Chip Assembly with Welded Metal Pillar of Stacked Metal Balls".

* cited by examiner

METHOD OF MAKING A SEMICONDUCTOR CHIP ASSEMBLY WITH THERMAL CONDUCTOR AND ENCAPSULANT GRINDING

BACKGROUND OF THE INVENTION

1. Field of the Invention

The present invention relates to a semiconductor chip assembly, and more particularly to a semiconductor chip assembly with a chip, a thermal conductor and an encapsulant and its method of manufacture.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

The semiconductor chip assembly is subsequently connected to another circuit such as a printed circuit board (PCB) or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB.

Thermo-mechanical wear or creep of the solder joints that connect the semiconductor chip assembly to the next level assembly is a major cause of failure in most board assemblies. This is because non-uniform thermal expansion and/or contraction of different materials causes mechanical stress on the solder joints.

Thermal mismatch induced solder joint stress can be reduced by using materials having a similar coefficient of thermal expansion (CTE). However, due to large transient temperature differences between the chip and other materials during power-up of the system, the induced solder joint stress makes the assembly unreliable even when the chip and the other materials have closely matched thermal expansion coefficients.

Thermal mismatch induced solder joint stress can also be reduced by proper design of the assembly. For instance, the assembly can include a heat sink that improves thermal dissipation from the chip, thereby reducing the temperature of the solder joints. However, the chip is typically embedded in and surrounded by a plastic encapsulant with poor thermal conductivity. As a result, the thermal path between the chip and the heat sink includes the encapsulant, and thermal dissipation from the chip is constrained by the encapsulant. Moreover, the constrained thermal dissipation can be especially problematic if the chip is a high speed device such as a central processing unit (CPU) or a dynamic random access memory (DRAM).

Thermal mismatch induced solder joint stress can also be reduced by proper design of the support circuit. For instance, BGA and LGA packages have been designed with pillar post type contact terminals that extend above the package and act as a stand-off or spacer between the package and the PCB in order to absorb thermal stress and reduce solder joint fatigue. The higher the aspect ratio of the pillar, the more easily the pillar can flex to follow expansion of the two ends and reduce shear stress.

Conventional approaches to forming the pillar either on a wafer or a separate support circuit include a bonded interconnect process (BIP) and plating using photoresist.

BIP forms a gold ball on a pad of the chip and a gold pin extending upwardly from the gold ball using a thermocompression wire bonder. Thereafter, the gold pin is brought in contact with a molten solder bump on a support circuit, and the solder is reflowed and cooled to form a solder joint around the gold pin. A drawback to this approach is that when the wire bonder forms the gold ball on the pad it applies substantial pressure to the pad which might destroy active circuitry beneath the pad. In addition, gold from the pin can dissolve into the solder to form a gold-tin intermetallic compound which mechanically weakens the pin and therefore reduces reliability.

U.S. Pat. No. 5,722,162 discloses fabricating a pillar by electroplating the pillar on a selected portion of an underlying metal exposed by an opening in photoresist and then stripping the photoresist. Although it is convenient to use photoresist to define the location of the pillar, electroplating the pillar in an opening in the photoresist has certain drawbacks. First, the photoresist is selectively exposed to light that initiates a reaction in regions of the photoresist that correspond to the desired pattern. Since photoresist is not fully transparent and tends to absorb the light, the thicker the photoresist, the poorer the penetration efficiency of the light. As a result, the lower portion of the photoresist might not receive adequate light to initiate or complete the intended photo-reaction. Consequently, the bottom portion of the opening in the photoresist might be too narrow, causing a pillar formed in the narrowed opening to have a diameter that decreases with decreasing height. Such a pillar has a high risk of fracturing at its lower portion in response to thermally induced stress. Furthermore, photoresist residue on the underlying metal might cause the pillar to have poor quality or even prevent the pillar from being formed. Second, if the photoresist is relatively thick (such as 100 microns or more), the photoresist may need to be applied with multiple coatings and receive multiple light exposures and bakes, which increases cost and reduces yield. Third, if the photoresist is relatively thick, the electroplated pillar may be non-uniform due to poor current density distribution in the relatively deep opening. As a result, the pillar may have a jagged or pointed top surface instead of a flat top surface that is better suited for providing a contact terminal for the next level assembly.

In view of the various development stages and limitations in currently available semiconductor chip assemblies, there is a need for a semiconductor chip assembly that is cost-effective, reliable, manufacturable, versatile and provides excellent thermal dissipation from the chip.

SUMMARY OF THE INVENTION

An object of the present invention is to provide a semiconductor chip assembly with a chip, a thermal conductor and an encapsulant that provides a low cost, high performance, high reliability package.

Another object of the present invention is to provide a convenient, cost-effective method for manufacturing a semiconductor chip assembly.

Generally speaking, the present invention provides a method of making a semiconductor chip assembly that includes mechanically attaching a semiconductor chip to a routing line, forming a thermal conductor on the chip, forming an encapsulant that covers the chip and the thermal conductor, grinding the encapsulant without grinding the thermal conductor or the chip and then grinding the encapsulant and the thermal conductor without grinding the chip such that the encapsulant and the thermal conductor are laterally aligned.

In accordance with an aspect of the invention, a method of making a semiconductor chip assembly includes providing a routing line, then mechanically attaching a semiconductor chip to the routing line, wherein the chip includes first and second opposing surfaces, and the first surface of the chip includes a conductive pad, forming a connection joint that electrically connects the routing line and the pad, forming a thermal conductor on the chip, wherein the thermal conductor includes first and second opposing surfaces and a thermal adhesive that contacts the chip, forming an encapsulant after attaching the chip to the routing line and forming the thermal conductor on the chip, wherein the encapsulant includes first and second opposing surfaces, the first surfaces of the thermal conductor and the encapsulant face in a first direction, the second surfaces of the thermal conductor and the encapsulant face in a second direction opposite the first direction, the chip is embedded in the encapsulant and extends vertically beyond the routing line in the first direction, the thermal conductor extends vertically beyond the chip in the first direction, and the encapsulant contacts the thermal conductor and covers and extends vertically beyond the chip and the thermal conductor in the first direction, and grinding the encapsulant without grinding the thermal conductor and without grinding the chip such that the first surface of the encapsulant migrates in the second direction, then grinding the encapsulant and the thermal conductor without grinding the chip such that the first surfaces of the encapsulant and the thermal conductor migrate in the second direction, and then halting the grinding before the grinding reaches the chip, thereby exposing the thermal conductor without exposing the chip such that the thermal conductor and the encapsulant are laterally aligned with one another at a lateral surface that faces in the first direction.

The method can include forming the routing line by selectively depositing the routing line on a metal base, and attaching the chip to the routing line such that the metal base extends vertically beyond the chip in the second direction.

The method can include forming the routing line by providing a plating mask on the metal base, wherein the plating mask includes an opening that exposes a portion of the metal base, and then electroplating the routing line on the exposed portion of the metal base through the opening in the plating mask.

The method can include etching the metal base after forming the encapsulant, thereby reducing contact area between the metal base and the routing line. Etching the metal base can remove a first portion of the metal base that contacts the routing line without removing a second portion of the metal base that contacts the routing line, thereby reducing but not eliminating contact area between the metal base and the routing line. For instance, etching the metal base can remove a first portion of the metal base within a periphery of the pad without removing a second portion of the metal base outside the periphery of the pad. As another example, etching the metal base can form a tapered pillar from an unetched portion of the metal base that contacts the routing line, is disposed outside a periphery of the chip and extends vertically beyond the chip, the routing line and the encapsulant in the second direction. Alternatively, etching the metal base can eliminate contact area between the metal base and the routing line. For instance, etching the metal base can remove the metal base.

The method can include etching the metal base after forming the encapsulant, thereby electrically isolating the routing line from other routing lines formed on the metal base. Likewise, the method can include etching the metal base after forming the encapsulant, thereby electrically isolating the pad from other conductive pads of the chip.

The method can include forming the thermal conductor by forming the thermal adhesive on the chip, or alternatively, by forming the thermal adhesive on the chip and then attaching a metal plate to the thermal adhesive. The method can include forming the thermal adhesive on the chip by depositing the thermal adhesive on the chip and then hardening the thermal adhesive. Furthermore, the thermal adhesive can be epoxy, solder or silicone and the metal plate can be copper.

The method can include forming the encapsulant by transfer molding.

The method can include grinding the thermal conductor by grinding the thermal adhesive such that the thermal adhesive and the encapsulant are laterally aligned at the lateral surface, or alternatively, grinding the metal plate without grinding the thermal adhesive such that the metal plate and the encapsulant are laterally aligned at the lateral surface.

The method can include grinding the encapsulant by applying a rotating diamond sand wheel to the encapsulant, and then grinding the encapsulant and the thermal conductor by applying the rotating diamond sand wheel to the encapsulant and the thermal conductor.

The method can include forming the connection joint by plating the connection joint on the routing line and the pad. For instance, the connection joint can be electroplated or electrolessly plated on the routing line and the pad. Alternatively, the method can include forming the connection joint by depositing a non-solidified material on the routing line and the pad and then hardening the non-solidified material. For instance, solder paste can be deposited on the routing line and the pad and then hardened by reflowing, or conductive adhesive can be deposited on the routing line and the pad and then hardened by curing. Alternatively, the method can include forming the connection joint by wire bonding.

The method can include forming a metal pillar on the routing line that extends vertically beyond the chip and the routing line in the first direction and extends vertically across most or all of the thickness of the chip, and then forming the encapsulant such that the metal pillar is embedded in the encapsulant.

The method can include forming an insulative base that contacts the routing line, is spaced from and overlapped by the chip and the thermal conductor, covers the chip, the routing line and the thermal conductor in the second direction and extends vertically beyond the chip, the routing line, the thermal conductor and the encapsulant in the second direction after etching the metal base.

The method can include providing a chip adhesive that attaches the chip to the routing line before forming the encapsulant.

The method can include attaching a heat sink to the thermal conductor after grinding the encapsulant and the thermal conductor, wherein the heat sink covers and extends vertically beyond the chip and the thermal conductor in the first direction. For instance, the heat sink can be formed by depositing a second thermal adhesive on the thermal conductor, placing a metal plate on the second thermal adhesive and then hardening the second thermal adhesive such that the second thermal adhesive contacts and is sandwiched between the metal plate and the thermal conductor.

The method can include grinding the encapsulant without grinding the metal pillar and without grinding the thermal conductor and without grinding the chip, and then grinding the encapsulant, the metal pillar and the thermal conductor without grinding the chip such that the encapsulant, the metal pillar and the thermal conductor are laterally aligned at the lateral surface.

The method can include grinding the insulative base without grinding a metal conductor that contacts the routing line and without grinding the routing line and without grinding the chip, and then grinding the insulative base and the metal conductor without grinding the chip such that insulative base and the metal conductor are laterally aligned at a second lateral surface that faces in the second direction.

The method can include attaching the chip to the routing line and then forming the thermal conductor on the chip, or alternatively, forming the thermal conductor on the chip and then attaching the chip to the routing line.

The method can include attaching the chip to the routing line and then forming the metal pillar, or alternatively, forming the metal pillar and then attaching the chip to the routing line.

The method can include forming the connection joint and then forming the metal pillar, or alternatively, forming the metal pillar and then forming the connection joint.

The method can include forming the connection joint and then forming the encapsulant, or alternatively, forming the encapsulant and then forming the connection joint.

The method can include grinding the encapsulant and the thermal conductor and then forming the insulative base, or alternatively, forming the insulative base and then grinding the encapsulant and the thermal conductor.

The method can include grinding the encapsulant and the thermal conductor and then grinding the insulative base and the metal conductor, or alternatively, grinding the insulative base and the metal conductor and then grinding the encapsulant and the thermal conductor.

An advantage of the present invention is that the semiconductor chip assembly can be manufactured conveniently and cost effectively. Another advantage is that the thermal conductor can be exposed, thereby enhancing thermal dissipation from the chip. Another advantage is that the encapsulant can be provided before the metal base is etched and removed, thereby enhancing the mechanical support and protection for the chip and the routing line. Another advantage is that the connection joint can be made from a wide variety of materials and processes, thereby making advantageous use of mature connection joint technologies in a unique and improved manufacturing approach. Another advantage is that the assembly need not include wire bonds or TAB leads, although the process is flexible enough to accommodate these techniques if desired. Another advantage is that the assembly can be manufactured using low temperature processes which reduces stress and improves reliability. A further advantage is that the assembly can be manufactured using well-controlled processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 1A-25A are cross-sectional views showing a method of making a semiconductor chip assembly in accordance with a first embodiment of the present invention;

FIGS. 1B-25B are top plan views corresponding to FIGS. 1A-25A, respectively;

FIGS. 1C-25C are bottom plan views corresponding to FIGS. 1A-25A, respectively;

DETAILED DESCRIPTION OF THE PREFERRED EMBODIMENTS

FIGS. 1A-25A, 1B-25B and 1C-25C are cross-sectional, top and bottom views, respectively, of a method of making a semiconductor chip assembly in accordance with a first embodiment of the present invention.

Figure 1A:
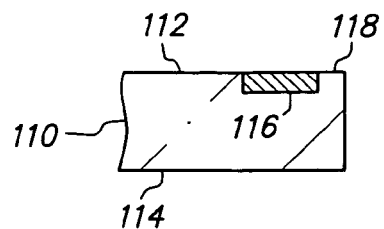
Figure 1B:
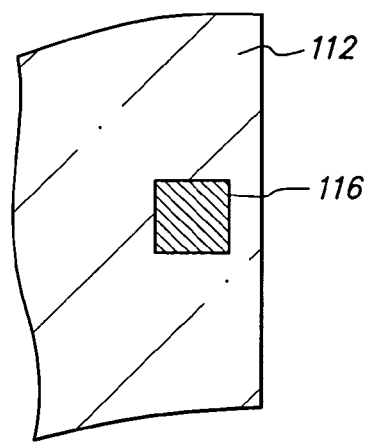
Figure 1C:
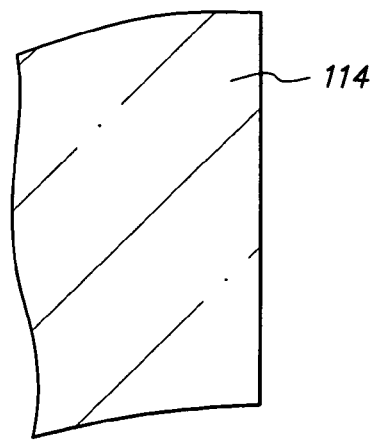

FIGS. 1A, 1B and 1C are cross-sectional, top and bottom views, respectively, of semiconductor chip 110 which is an integrated circuit in which various transistors, circuits, interconnect lines and the like are formed (not shown). Chip 110 includes opposing major surfaces 112 and 114 and has a thickness (between surfaces 112 and 114) of 150 microns. Surface 112 is the active surface and includes conductive pad 116 and passivation layer 118.

Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 100 microns.

Pad 116 has an aluminum base that is cleaned by dipping chip 110 in a solution containing 0.05 M phosphoric acid at room temperature for 1 minute and then rinsed in distilled water. Pad 116 can have the aluminum base serve as a surface layer, or alternatively, pad 116 can be treated to include a surface layer that covers the aluminum base, depending on the nature of a connection joint that shall subsequently contact the surface layer. In this embodiment, a connection joint is formed with electroplated copper. Therefore, pad 116 is treated to provide a surface layer that will accommodate this connection joint. Pad 116 can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process. Alternatively, pad 116 is treated by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of NaNO$_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Chip 110 includes many other pads on surface 112, and only pad 116 is shown for convenience of illustration. In addition, chip 110 has already been singulated from other chips that it was previously attached to on a wafer.

Figure 2A:
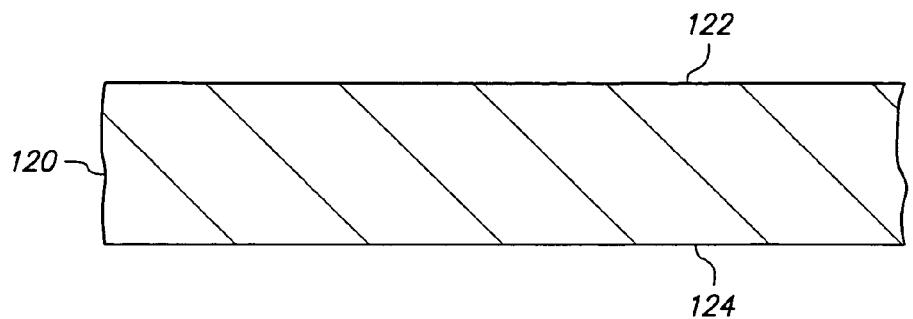
Figure 2B:
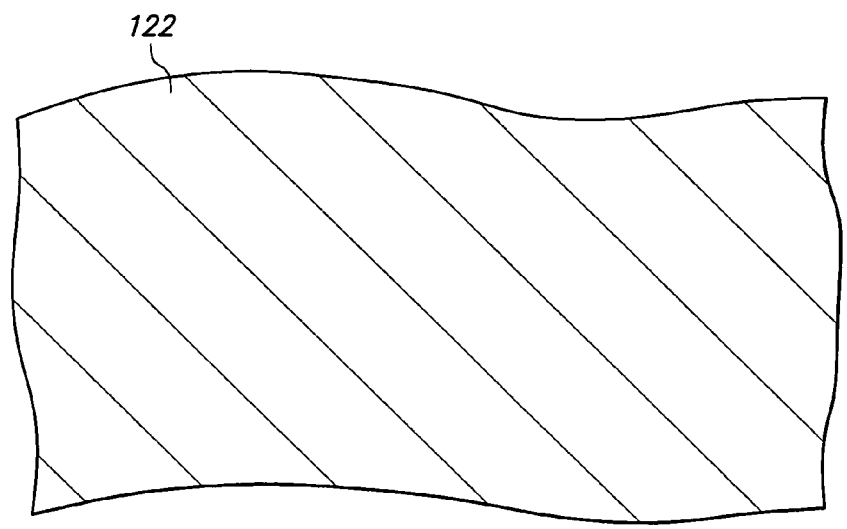
Figure 2C:
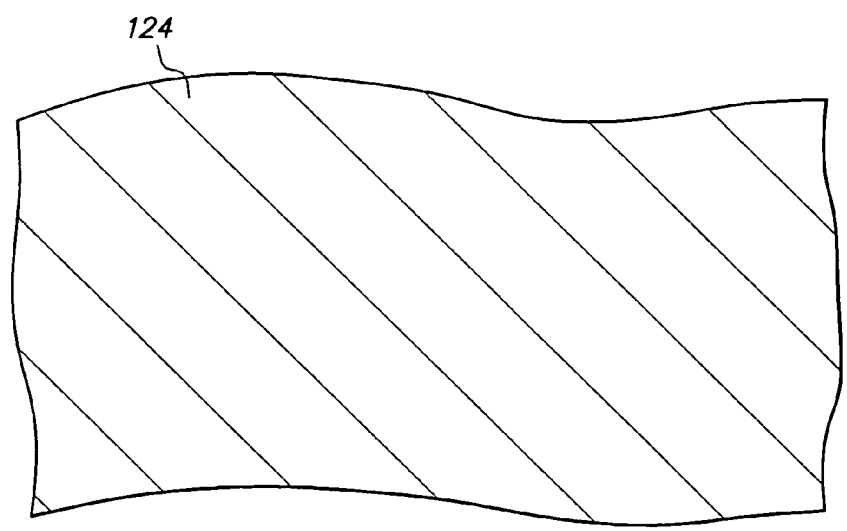

FIGS. 2A, 2B and 2C are cross-sectional, top and bottom views, respectively, of metal base 120 which includes opposing major surfaces 122 and 124. Metal base 120 is a copper plate with a thickness of 200 microns.

Figure 3A:
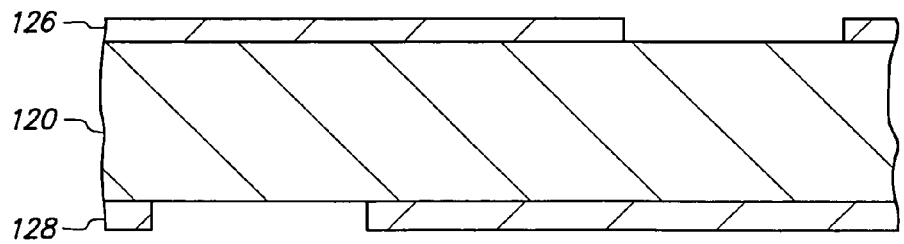
Figure 3B:
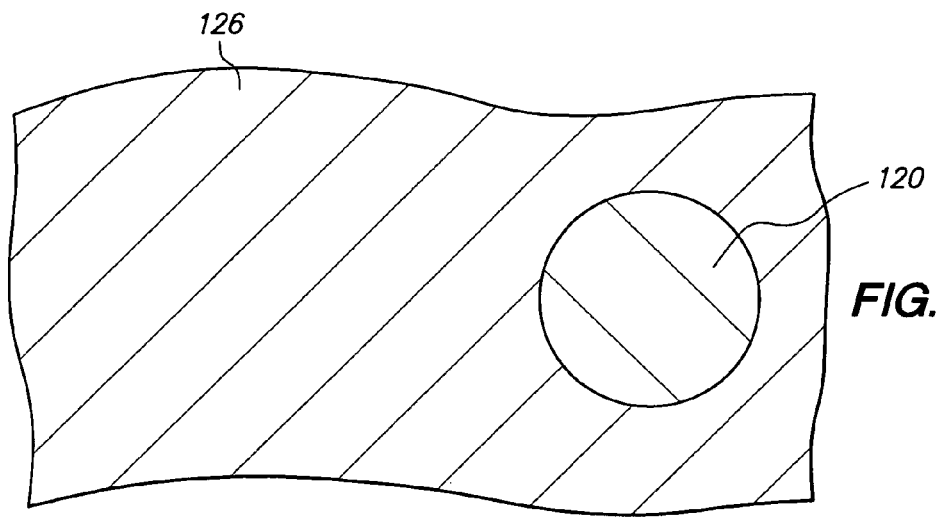
Figure 3C:
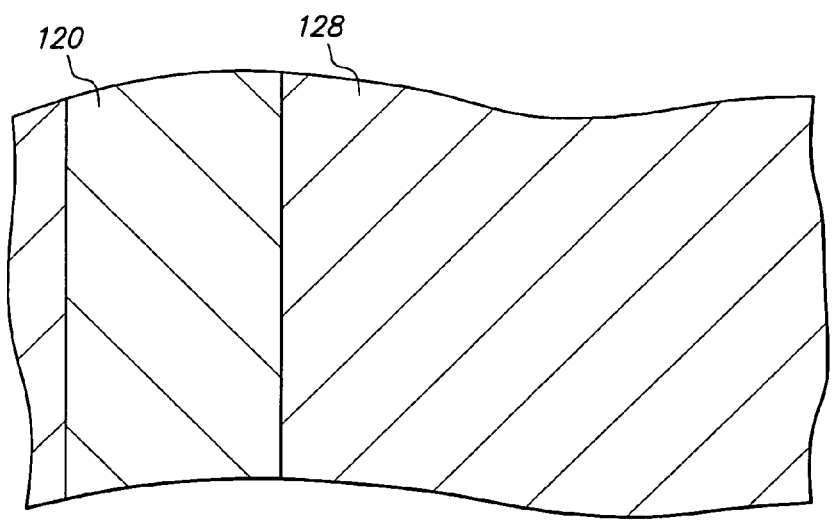

FIGS. 3A, 3B and 3C are cross-sectional, top and bottom views, respectively, of photoresist layers 126 and 128 formed on metal base 120. Photoresist layers 126 and 128 are deposited using a dry film lamination process in which hot rolls simultaneously press photoresist layers 126 and 128 onto surfaces 122 and 124, respectively. Reticles (not shown) are positioned proximate to photoresist layers 126 and 128. Thereafter, photoresist layers 126 and 128 are simultaneously patterned by selectively applying light through the reticles, applying a developer solution to remove the photoresist portions rendered soluble by the light, and then hard baking, as is conventional. As a result, photoresist layer 126 contains an opening that selectively exposes surface 122 of metal base 120, and photoresist layer 128 contains an opening that selectively exposes surface 124 of metal base 120. Photoresist layers 126 and 128 have a thickness of 25 microns beyond surfaces 122 and 124, respectively.

Figure 4A:
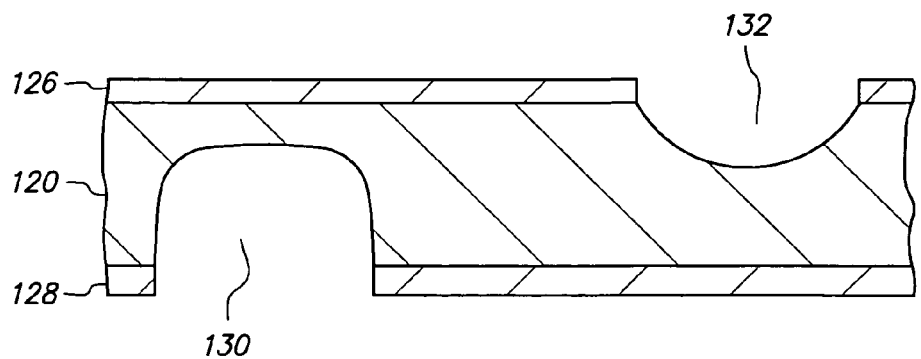
Figure 4B:
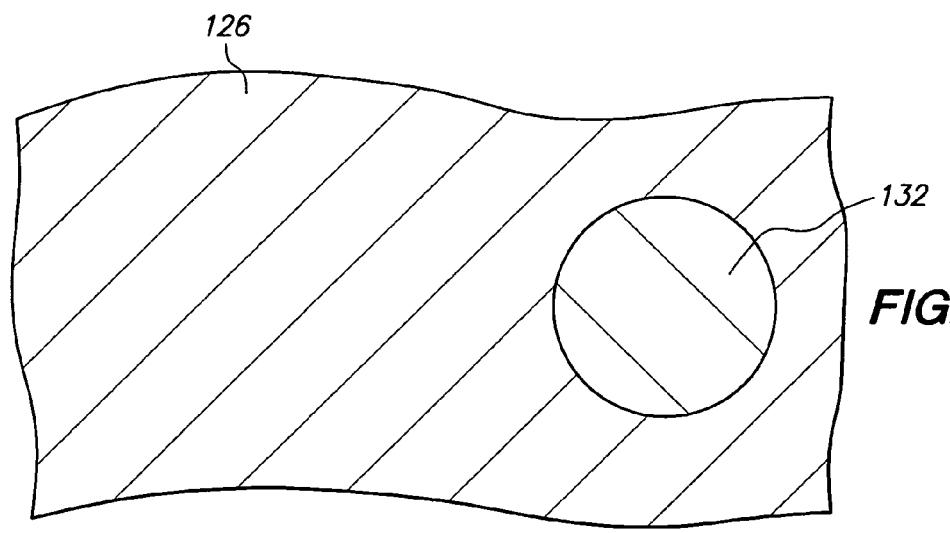
Figure 4C:
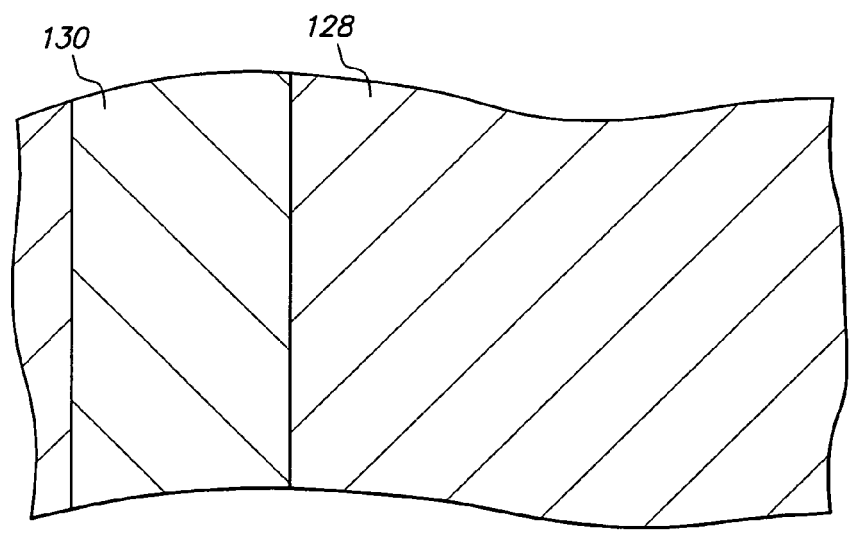

FIGS. 4A, 4B and 4C are cross-sectional, top and bottom views, respectively, of recess 130 and slot 132 formed in metal base 120.

Recess 130 is formed by applying a front-side wet chemical etch to the exposed portion of surface 122 using photoresist layer 126 as an etch mask and extends from surface 122 into but not through metal base 120, and slot 132 is formed by applying a back-side wet chemical etch to the exposed portion of surface 124 using photoresist layer 128 as an etch mask and extends from surface 124 into but not through metal base 120.

In this instance, surfaces 122 and 124 are exposed to a first wet chemical etch, and then surface 124 is exposed to a second wet chemical etch. In particular, top and bottom spray nozzles (not shown) simultaneously spray a first wet chemical etch on metal base 120 using photoresist layers 126 and 128 as etch masks. Thus, the first wet chemical etch provides front-side and back-side etches. The first wet chemical etch is highly selective of copper and etches 100 microns into metal base 120, thereby completely forming recess 130 and partially forming slot 132. At this stage, recess 130 and slot 132 each have a depth of 100 microns. Thereafter, the bottom spray nozzle sprays a second wet chemical etch on metal base 120 using photoresist layer 128 as an etch mask while the top spray nozzle is deactivated. Thus, the second wet chemical etch provides another back-side etch but does not provide a front-side etch. The second wet chemical etch is highly selective of copper and etches another 50 microns into metal base 120, thereby completely forming slot 132. At this stage, recess 130 has a depth of 100 microns, and slot 132 has a depth of 150 microns.

Recess 130 has a diameter of 300 microns at surface 122, and slot 132 has a width (orthogonal to its elongated length) of 1000 microns at surface 124. For convenience of illustration, slot 132 is shown with reduced lateral scale relative to the other features.

A suitable wet chemical etch for the first and second wet chemical etches can be provided by a solution containing alkaline ammonia. The optimal etch time for exposing metal base 120 to the first and second wet chemical etches in order to form recess 130 and slot 132 with the desired dimensions can be established through trial and error.

Figure 5A:
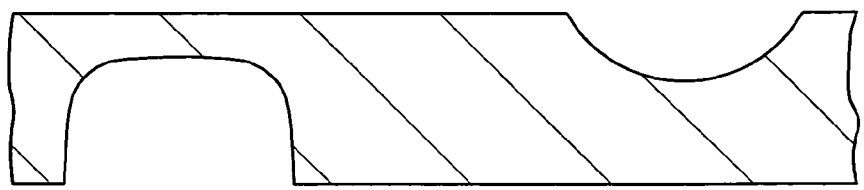
Figure 5B:
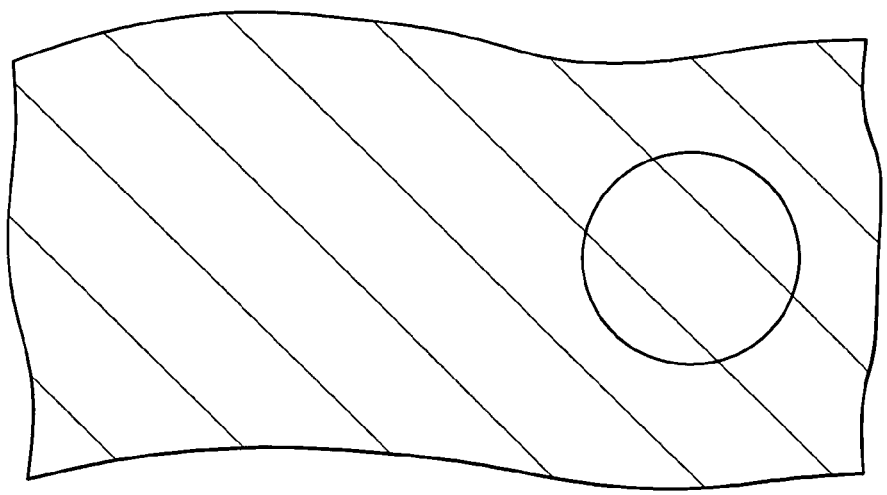
Figure 5C:
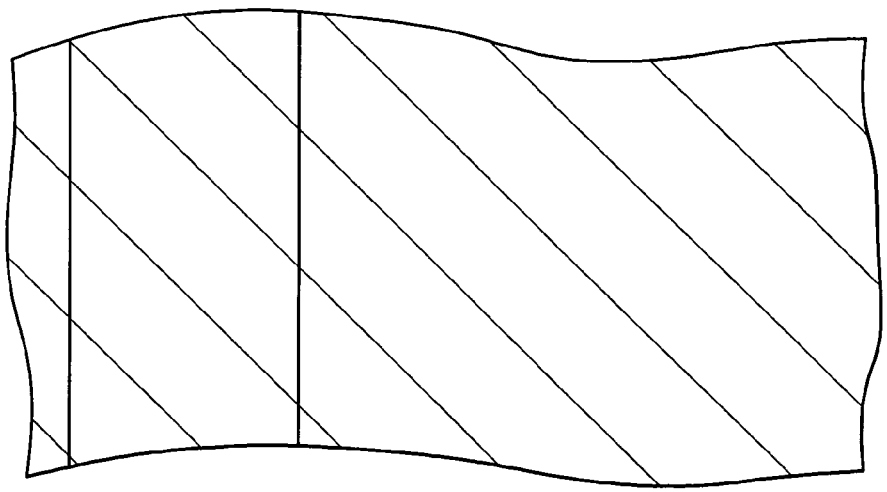

FIGS. 5A, 5B and 5C are cross-sectional, top and bottom views, respectively, of metal base 120 after photoresist layers 126 and 128 are stripped. Photoresist layers 126 and 128 are removed using a solvent, such as a mild alkaline solution with a pH of 9, that is highly selective of photoresist with respect to copper. Therefore, no appreciable amount of metal base 120 is removed.

Figure 6A:
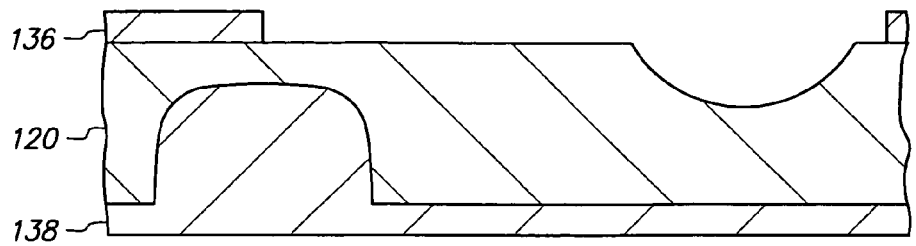
Figure 6B:
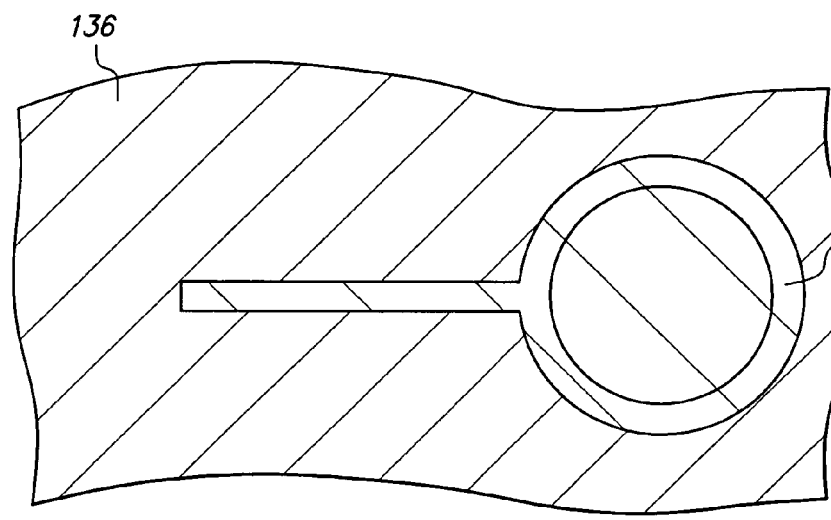
Figure 6C:
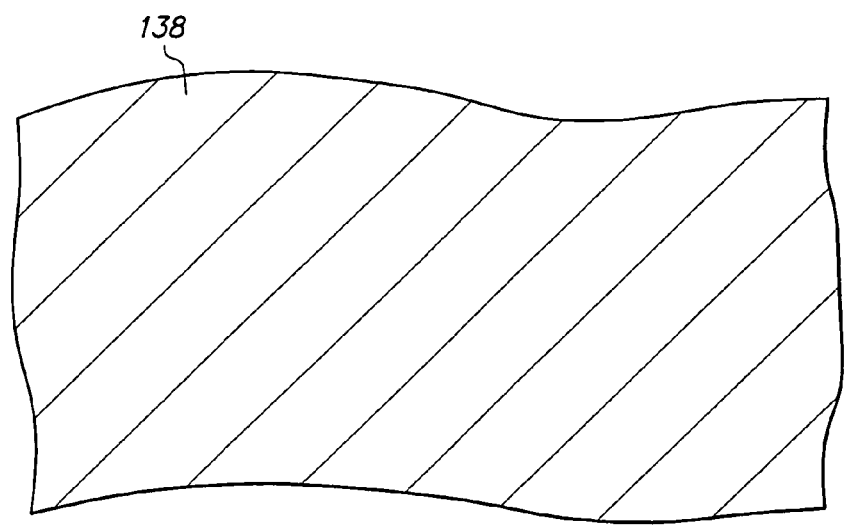

FIGS. 6A, 6B and 6C are cross-sectional, top and bottom views, respectively, of photoresist layers 136 and 138 formed on metal base 120. Photoresist layers 136 and 138 are deposited in liquid form using roller coating onto surfaces 122 and 124, respectively. A reticle (not shown) is positioned proximate to photoresist layer 136. Thereafter, photoresist layer 136 is patterned by selectively applying light through the reticle, applying a developer solution to remove the photoresist portion rendered soluble by the light, and then hard baking, as is conventional. As a result, photoresist layer 136 contains an opening that selectively exposes metal base 120, and photoresist layer 138 remains unpatterned. Photoresist layers 136 and 138 each have a thickness of 50 microns beyond surfaces 122 and 124, respectively.

Figure 7A:
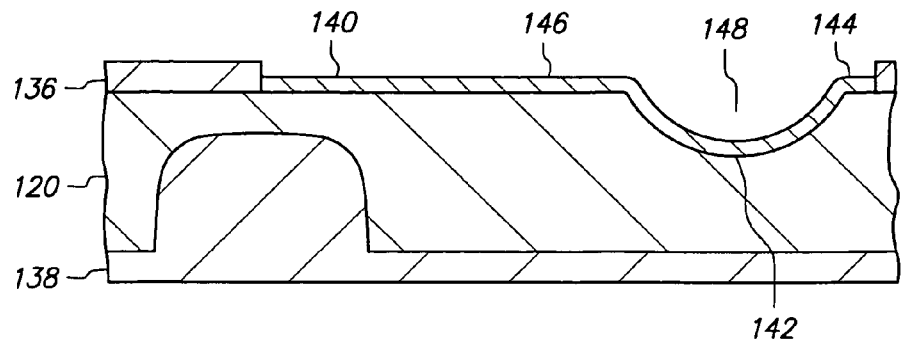
Figure 7B:
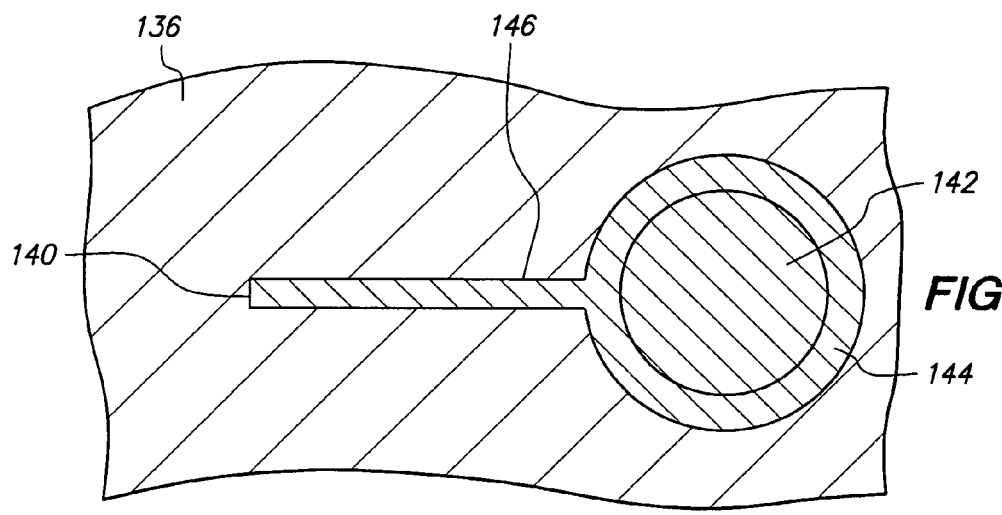
Figure 7C:
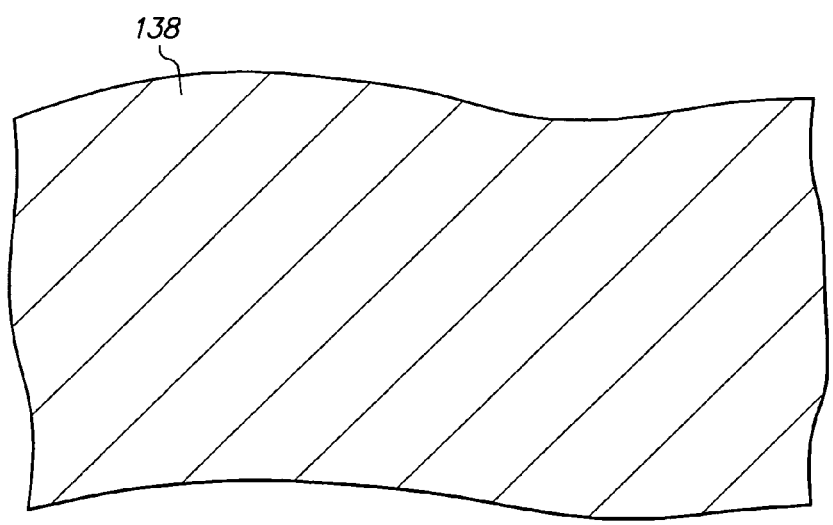

FIGS. 7A, 7B and 7C are cross-sectional, top and bottom views, respectively, of routing line 140 formed on metal base 120.

Routing line 140 includes bumped terminal 142, enlarged annular portion 144 and elongated routing portion 146. Bumped terminal 142 is formed in recess 130, enlarged annular portion 144 is formed outside recess 130 and is adjacent to and surrounds bumped terminal 142, and elongated routing portion 146 is formed outside recess 130, is adjacent to enlarged annular portion 144 and is spaced and separated from bumped terminal 142. Bumped terminal 142 extends below enlarged annular portion 144 and elongated routing portion 146, and enlarged annular portion 144 and elongated routing portion 146 are coplanar with one another. Bumped terminal 142 includes or defines cavity 148 that extends into and faces away from recess 130 and is exposed.

Routing line 140 is composed of a first nickel layer electroplated on metal base 120, a copper layer electroplated on the first nickel layer, a second nickel layer electroplated on the copper layer, and a gold layer electroplated on the second nickel layer. The first nickel layer contacts and is sandwiched between metal base 120 and the copper layer, the copper layer contacts and is sandwiched between the first and second nickel layers, the second nickel layer contacts and is sandwiched between the copper layer and the gold layer, and the gold layer contacts the second nickel layer. Thus, the copper layer, second nickel layer and gold layer are spaced and separated from metal base 120, the second nickel layer and gold layer are spaced and separated from the first nickel layer, the gold layer is exposed, and the copper layer and first and second nickel layers are buried beneath the gold layer. For convenience of illustration, the copper layer, gold layer and first and second nickel layers are shown as a single layer.

Routing line 140 is formed by an electroplating operation using photoresist layers 136 and 138 as plating masks. Thus, routing line 140 are formed additively. Initially, a plating bus (not shown) is connected to metal base 120, current is applied to the plating bus from an external power source, and metal base 120 is submerged in an electrolytic nickel plating solution such as Technic Techni Nickel "S" at room temperature. As a result, the first nickel layer electroplates (deposits or grows) on the exposed portion of surface 122. The first nickel electroplating operation continues until the first nickel layer has the desired thickness. Thereafter, the structure is removed from the electrolytic nickel plating solution and submerged in an electrolytic copper plating solution such as Sel-Rex CUBATH M™ at room temperature while current is applied to the plating bus to electroplate the copper layer on the first nickel layer. The copper electroplating operation continues until the copper layer has the desired thickness. Thereafter, the structure is removed from the electrolytic copper plating solution and submerged in an electrolytic nickel plating solution such as Technic Techni Nickel "S" at room temperature while current is applied to the plating bus to electroplate the second nickel layer on the copper layer. The second nickel electroplating operation continues until the second nickel layer has the desired thickness. Thereafter, the structure is removed from the electrolytic nickel plating solution and submerged in an electrolytic gold plating solution such as Technic Orotemp at room temperature while current is applied to the plating bus to electroplate the gold layer on the second nickel layer. The gold electroplating operation continues until the gold layer has the desired thickness. Thereafter, the structure is removed from the electrolytic gold plating solution and rinsed in distilled water to remove contaminants.

Routing line 140 has a thickness of 26.5 microns. In particular, the first and second nickel layers each have a thickness of 3 microns, the copper layer has a thickness of 20 microns, and the gold layer has a thickness of 0.5 microns. Bumped terminal 142 is a curved hollow dome with a downwardly extending height of 100 microns and a diameter of 300 microns, enlarged annular portion 144 is a ring with an inner diameter of 300 microns, an outer diameter of 500 microns and a width of 100 microns ((500−300)/2), and elongated routing portion 146 is a flat planar lead with a width (orthogonal to its elongated length) of 50 microns.

Figure 8A:
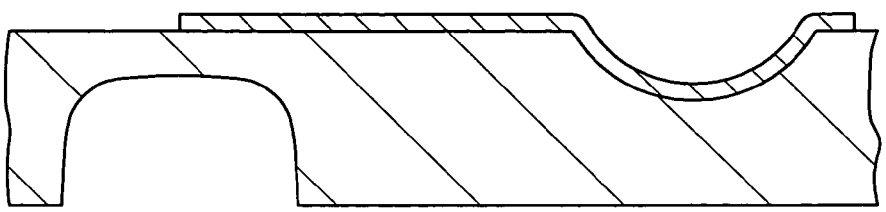
Figure 8B:
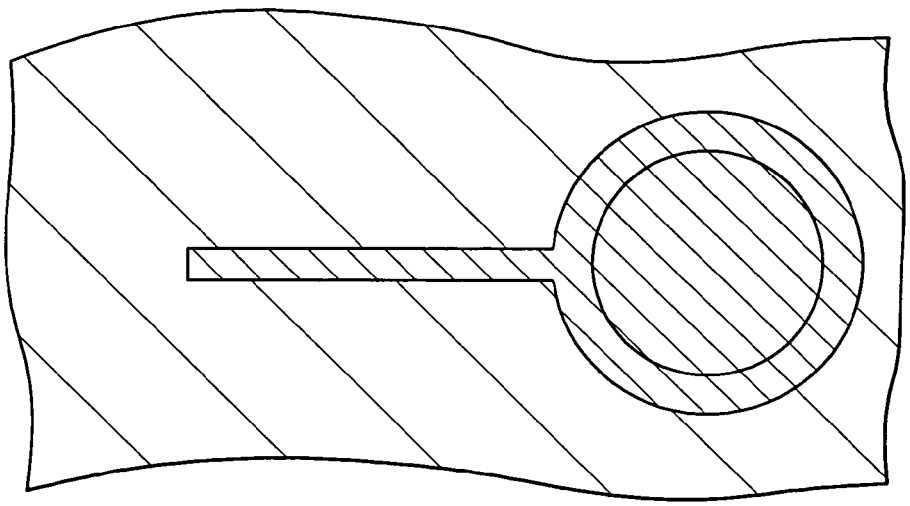
Figure 8C:
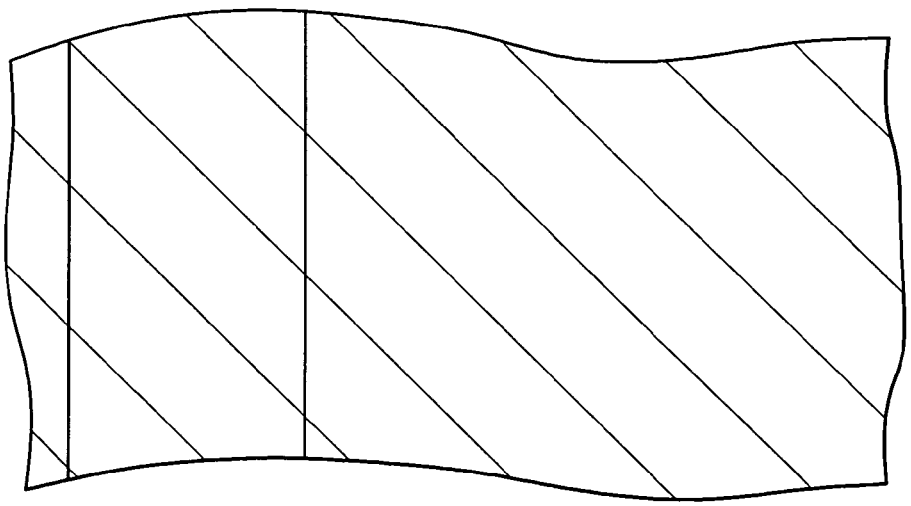

FIGS. 8A, 8B and 8C are cross-sectional, top and bottom views, respectively, of metal base 120 and routing line 140 after photoresist layers 136 and 138 are stripped. Photoresist layers 136 and 138 are removed using a solvent, such as a mild alkaline solution with a pH of 9, that is highly selective of photoresist with respect to copper, nickel and gold. Therefore, no appreciable amount of metal base 120 or routing line 140 is removed.

Figure 9A:
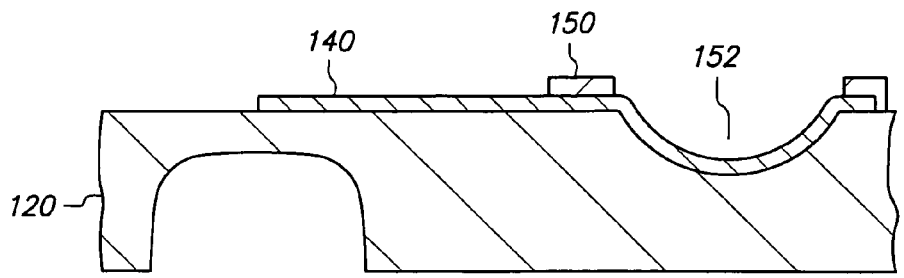
Figure 9B:
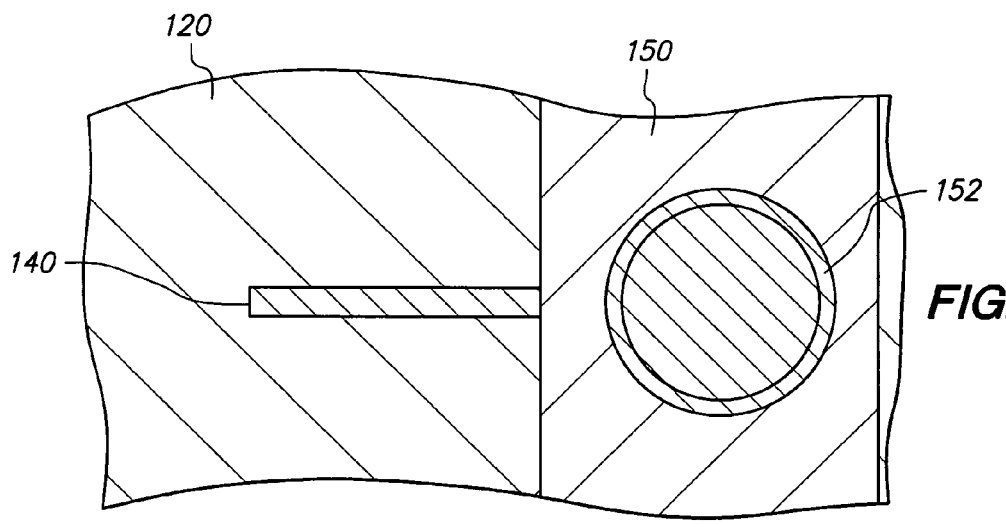
Figure 9C:
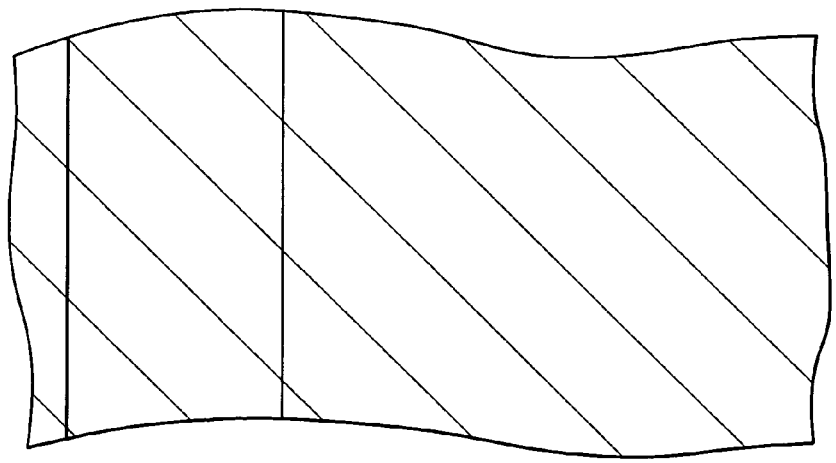

FIGS. 9A, 9B and 9C are cross-sectional, top and bottom views, respectively, of solder mask 150 formed on metal base 120 and routing line 140.

Solder mask 150 is initially a photoimageable liquid resin that is dispensed on metal base 120 and routing line 140. Thereafter, solder mask 150 is patterned by selectively applying light through a reticle (not shown), applying a developer solution to remove the solder mask portions rendered soluble by the light, and then hard baking, as is conventional. As a result, solder mask 150 contains opening 152 with a diameter of 400 microns that is vertically aligned with and exposes bumped terminal 142 and enlarged annular portion 144. Bumped terminal 142 and recess 148 are concentrically disposed within and exposed by opening 152, an inner annular region of enlarged annular portion 144 that extends between the middle and inner diameters of enlarged annular portion 144 and has a width of 50 microns ((400−300)/2) is exposed by opening 152, and an outer annular region of enlarged annular portion 144 that extends between the outer and middle diameters of enlarged annular portion 144 and has a width of 50 microns ((500−400)/2) is covered by solder mask 150. In addition, solder mask 150 extends 30 microns upwardly beyond routing line 140.

Figure 10A:
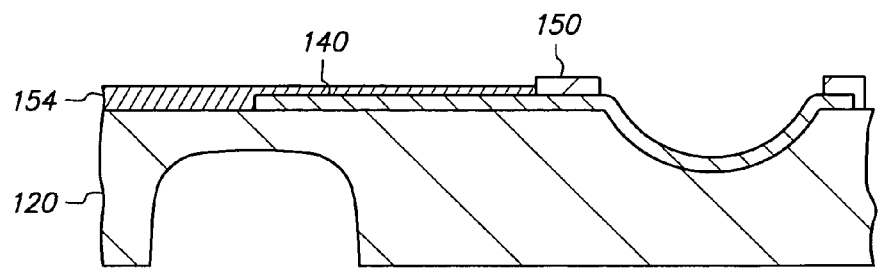
Figure 10B:
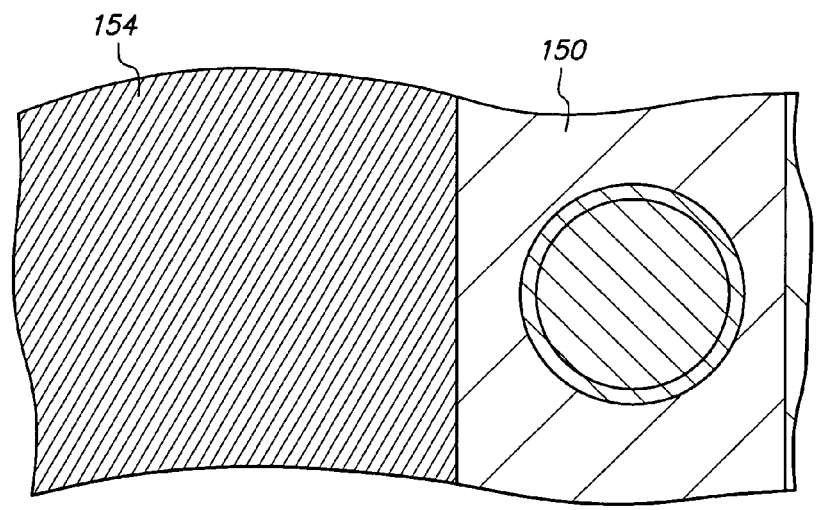
Figure 10C:
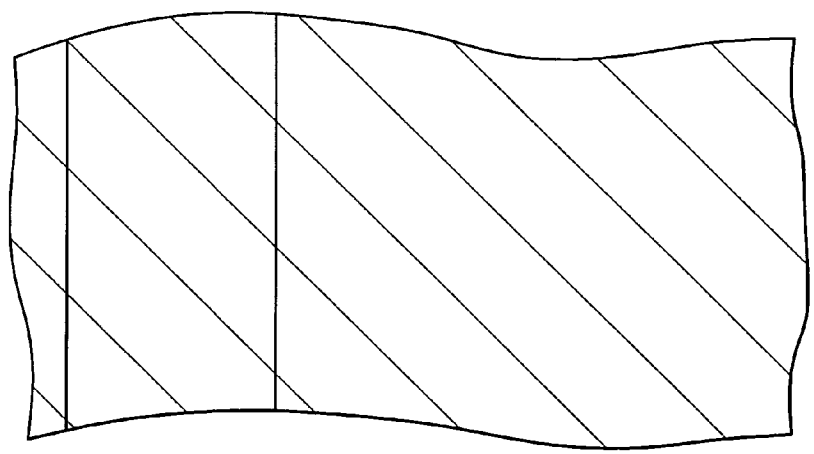

FIGS. 10A, 10B and 10C are cross-sectional, top and bottom views, respectively, of chip adhesive 154 formed on metal base 120 and routing line 140.

Chip adhesive 154 may include an organic surface protectant such as HK 2000 which is promptly applied to the structure after photoresist layer 136 is removed to reduce native oxide formation on the exposed copper surfaces. The use of organic surface protectant layers in chip adhesives for semiconductor chip assemblies is well-known in the art.

Thereafter, a liquid resin (A stage) such as polyamic acid is applied over metal base 120 and routing line 140 using stencil printing. During stencil printing, a stencil (not shown) is placed over metal base 120, routing line 140 and solder mask 150, a stencil opening is aligned with metal base 120 and routing line 140 and offset from solder mask 150, and then a squeegee (not shown) pushes the liquid resin along the surface of the stencil opposite metal base 120, routing line 140 and solder mask 150, through the stencil opening and onto metal base 120 and routing line 140 but not solder mask 150. The liquid resin is compliant enough at room temperature to conform to virtually any shape. Therefore, the liquid resin flows over and covers portions of metal base 120 and routing line 140 and flows laterally towards and contacts solder mask 150. However, solder mask 150 provides a dam that prevents the liquid resin from contacting bumped terminal 142 or entering cavity 148 or opening 152.

Figure 11A:
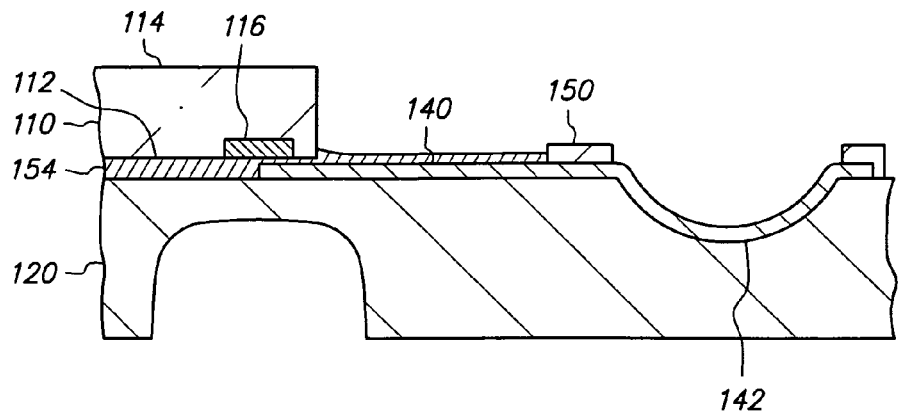
Figure 11B:
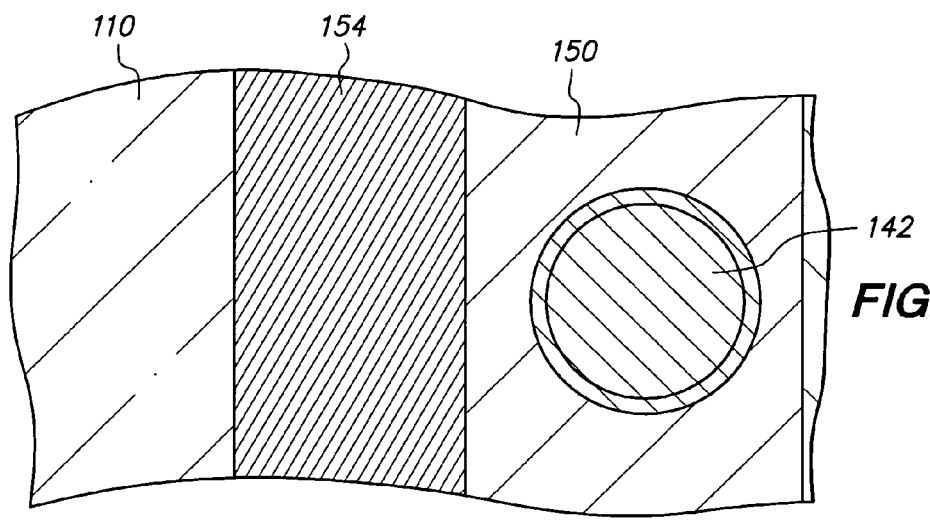
Figure 11C:
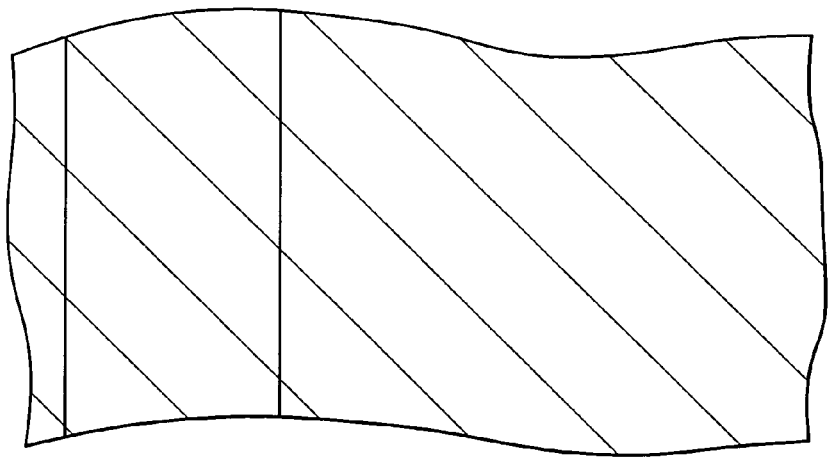

FIGS. 11A, 11B and 11C are cross-sectional, top and bottom views, respectively, of chip 110 mechanically attached to metal base 120 and routing line 140 by chip adhesive 154.

Chip adhesive 154 extends between and contacts chip 110 and metal base 120, and likewise, chip adhesive 154 extends between and contacts chip 110 and routing line 140. Surface 112 of chip 110 faces towards metal base 120 and routing line 140 and is covered by chip adhesive 154, and surface 114 of chip 110 faces away from metal base 120 and routing line 140 and is exposed. Chip 110 and metal base 120 do not contact one another, and chip 110 and routing line 140 do not contact one another.

Chip adhesive 154 is sandwiched between chip 110 and metal base 120 and between chip 110 and routing line 140 using relatively low pressure from a pick-up head that places chip 110 on chip adhesive 154, holds chip 110 against chip adhesive 154 for 5 seconds and then releases chip 110. The pick-up head is heated to a relatively low temperature such as 150° C., and chip adhesive 154 receives heat from the pick-up head transferred through chip 110. As a result, chip adhesive 154 proximate to chip 110 is partially polymerized (B stage) and forms a gel but is not fully cured, and chip adhesive 154 that is partially polymerized provides a loose mechanical bond between chip 110 and metal base 120 and between chip 110 and routing line 140.

Chip 110 and metal base 120 are positioned relative to one another so that chip 110 is disposed within the periphery of chip adhesive 154, pad 116 is disposed above and overlaps and is electrically isolated from routing line 140, and chip adhesive 154 contacts and is sandwiched between pad 116 and routing line 140. Chip 110 and metal base 120 can be aligned using an automated pattern recognition system.

Thereafter, the structure is placed in an oven and chip adhesive 154 is fully cured (C stage) at relatively low temperature in the range of 200 to 250° C. to form a solid adhesive insulative thermosetting polyimide layer that mechanically attaches chip 110 to metal base 120 and routing line 140. Chip adhesive 154 is 5 microns thick between pad 116 and routing line 140.

At this stage, routing line 140 extends within and outside the periphery of chip 110, extends downwardly beyond chip 110 and is unbent upwardly and downwardly, bumped terminal 142 is disposed outside the periphery of chip 110, chip adhesive 154 extends downwardly beyond chip 110, and metal base 120 covers and extends downwardly beyond chip 110, routing line 140, solder mask 150 and chip adhesive 154. In addition, surface 114 of chip 110 faces upwardly, and surface 112 of chip 110 faces downwardly.

Figure 11D:
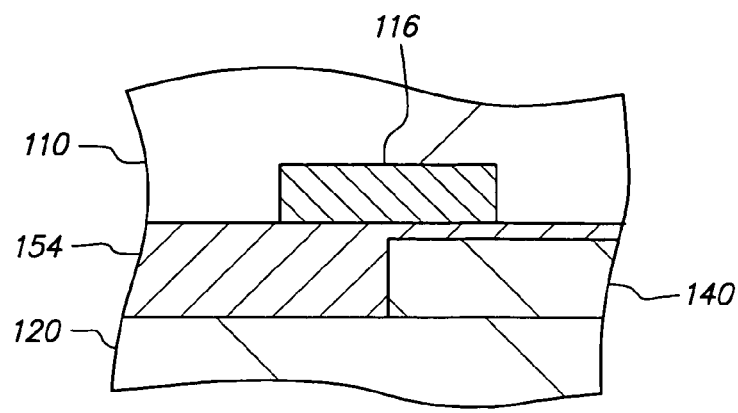
FIGS. 11D, 11E and 11F are enlarged cross-sectional, bottom and cross-sectional views, respectively, of the routing line and the pad in FIG. 11A.
Figure 11E:
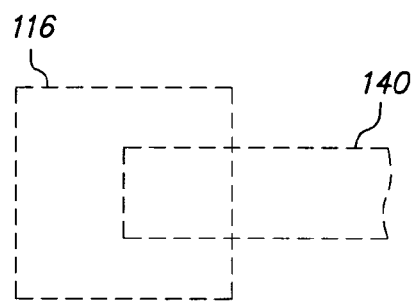
Figure 11F:
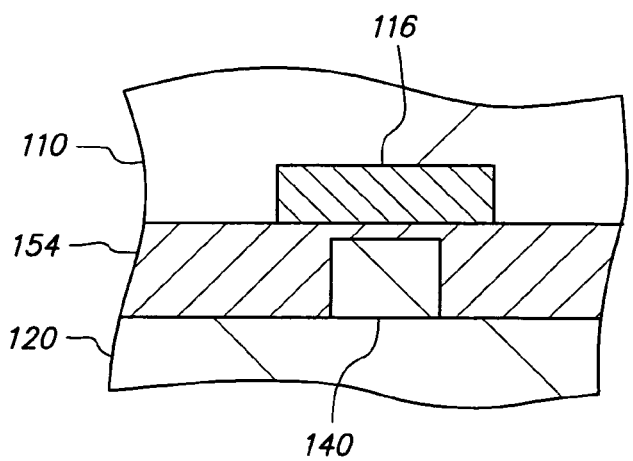

FIGS. 11D, 11E and 11F are enlarged cross-sectional, bottom and cross-sectional views, respectively, of pad 116 and routing line 140. FIG. 11F is oriented orthogonally with respect to FIG. 11D. As is seen, routing line 140 is proximate to pad 116 and a distal end of routing line 140 is within the periphery of pad 116. Routing line 140 extends across the center and one peripheral edge of pad 116 (but not the other three peripheral edges of pad 116), and peripheral sidewalls of routing line 140 extend within the periphery of pad 116. Since pad 116 and routing line 140 are not visible from the bottom view due to metal base 120, they are shown in phantom in FIG. 11E.

Figure 12A:
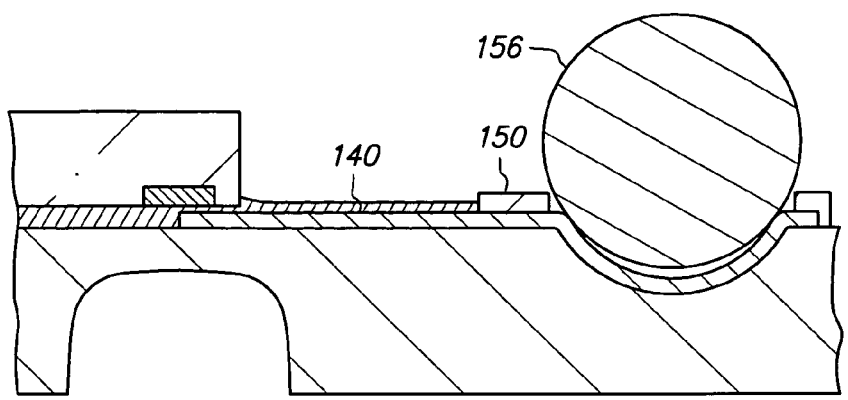
Figure 12B:
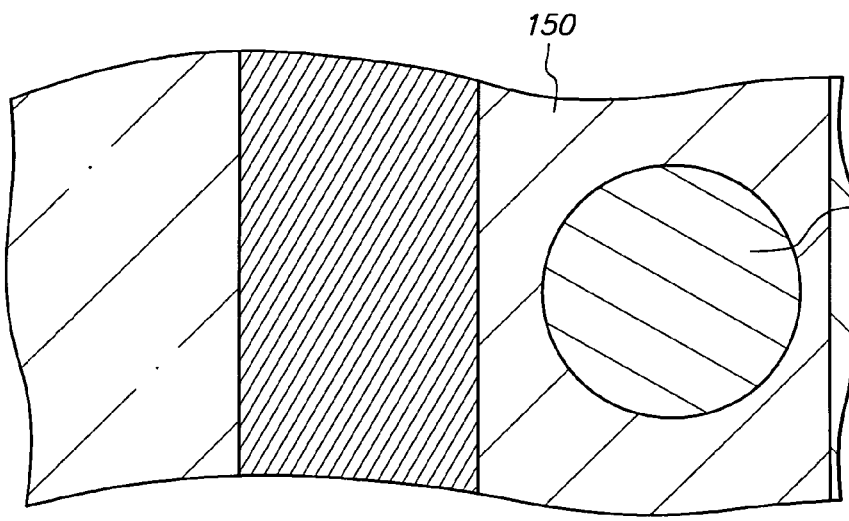
Figure 12C:
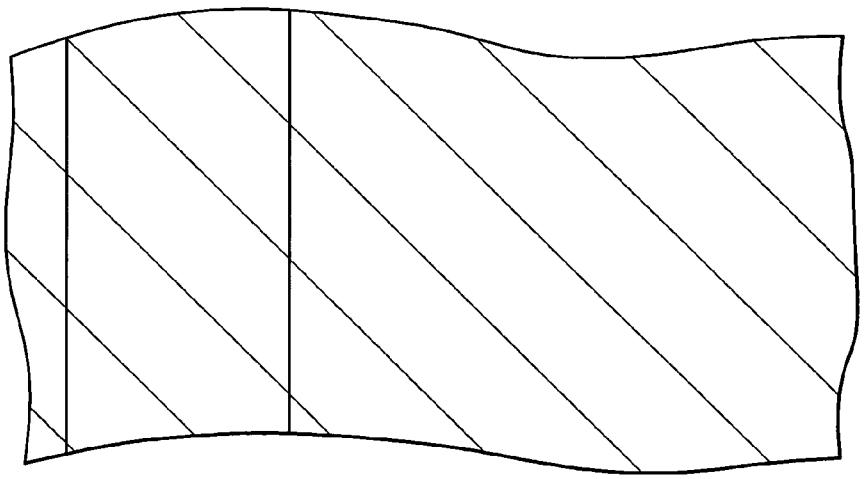

FIGS. 12A, 12B and 12C are cross-sectional, top and bottom views, respectively, of metal pillar 156 mechanically attached to routing line 140.

Metal pillar 156 is initially a tin (96.5%)—silver (3.0%)—copper (0.5%) solder ball with a spherical shape and a diameter of 500 microns. Metal pillar 156 is dipped in flux to provide metal pillar 156 with a thin flux surface coating (not shown). Thereafter, metal pillar 156 with the flux surface coating is removed from a ball boat and attached to a graphite fixture (not shown) by applying a vacuum through a drilled hole in the fixture that sucks metal pillar 156 onto the drilled hole, then the fixture is inverted and positioned over solder mask 150 using a pick-up head such that metal pillar 156 with the flux surface coating is disposed above and vertically aligned with opening 152, and then the vacuum is removed, thereby releasing metal pillar 156 with the flux surface coating from the fixture, and the fixture is retracted.

Metal pillar 156 with the flux surface coating is a metal particle deposited on bumped terminal 142 and extends into cavity 148 and opening 152. Metal pillar 156 weakly adheres to bumped terminal 142 in cavity 148 due to the flux surface coating.

Figure 13A:
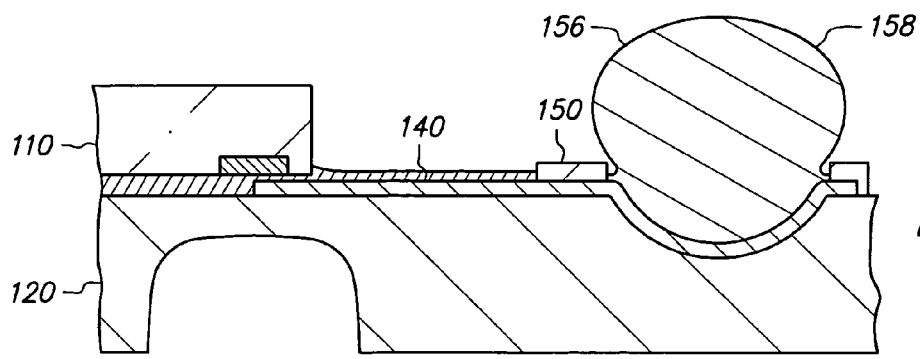
Figure 13B:
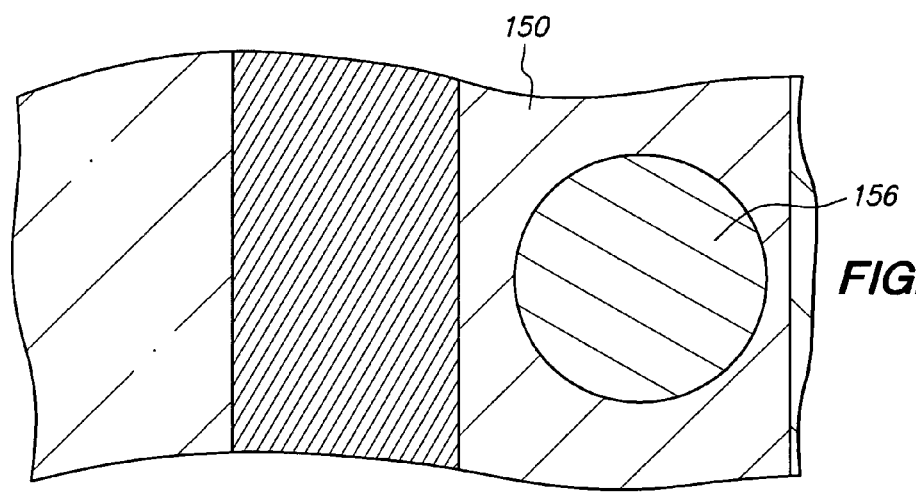
Figure 13C:
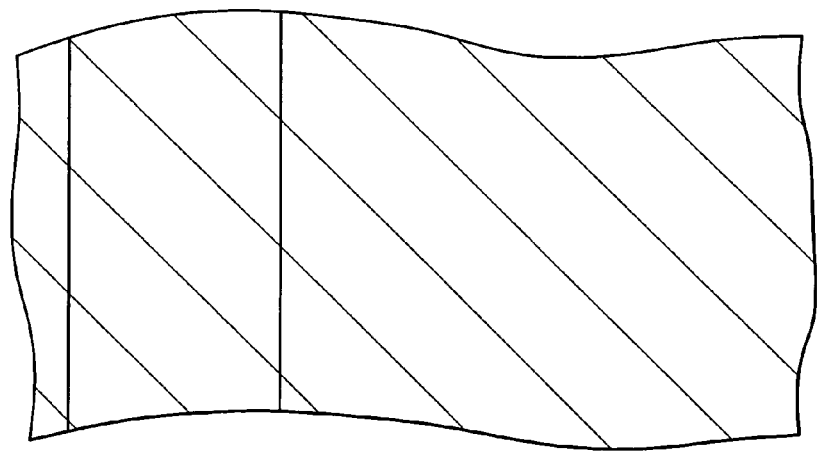

FIGS. 13A, 13B and 13C are cross-sectional, top and bottom views, respectively, of metal pillar 156 electrically connected to routing line 140.

Heat is applied to reflow metal pillar 156. Routing line 140 contains a gold surface layer that provides a wettable surface for solder reflow. As a result, metal pillar 156 (composed of solder) wets and flows over routing line 140 (including bumped terminal 142 and enlarged annular portion 144) within opening 152 and fills any remaining space in cavity 148. However, solder mask 150 prevents metal pillar 156 from wetting or flowing over routing line 140 (at enlarged annular portion 144 and elongated routing portion 146) outside opening 152. In addition, solder mask 150 prevents metal pillar 156 from contacting metal base 120. The heat is then removed and metal pillar 156 cools and solidifies into a hardened solder particle with a substantially spherical shape that contacts and is mechanically attached to and electrically connected to routing line 140. Metal pillar 156 extends upwardly beyond chip 110 by 250 microns.

Conductive trace 158 includes routing line 140 and metal pillar 156. Conductive trace 158 is adapted for providing horizontal and vertical routing between pad 116 and a next level assembly.

At this stage, routing line 140 extends laterally beyond metal pillar 156 towards chip 110 and extends downwardly beyond metal pillar 156, metal pillar 156 is disposed outside the periphery of chip 110, extends across the thickness of chip 110 (between surfaces 112 and 114), extends upwardly and downwardly beyond chip 110 and extends upwardly beyond and overlaps routing line 140, and metal base 120 extends downwardly beyond metal pillar 156.

Figure 14A:
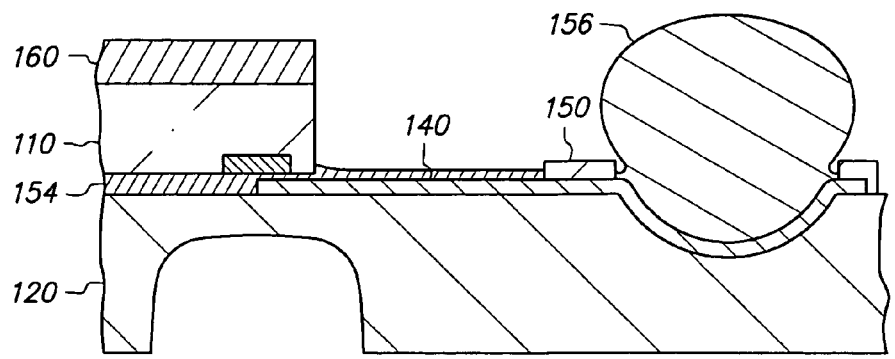
Figure 14B:
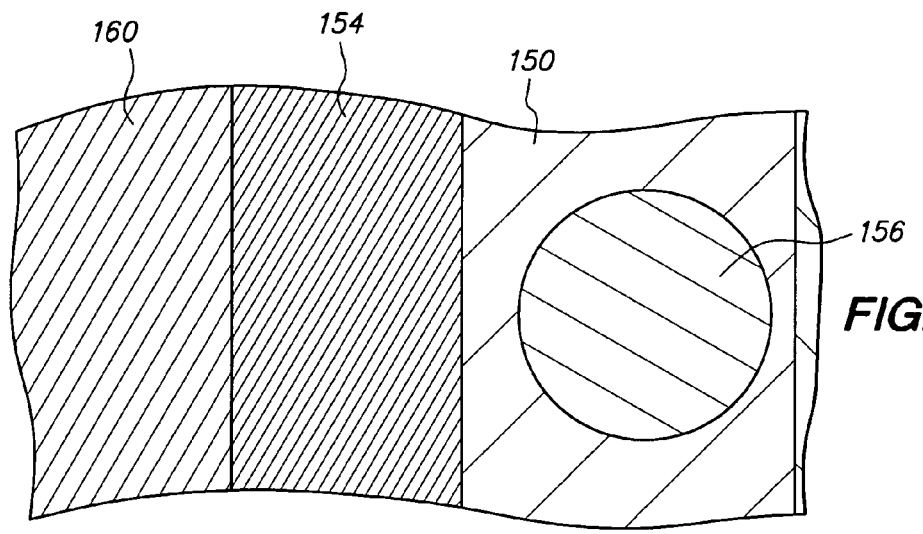
Figure 14C:
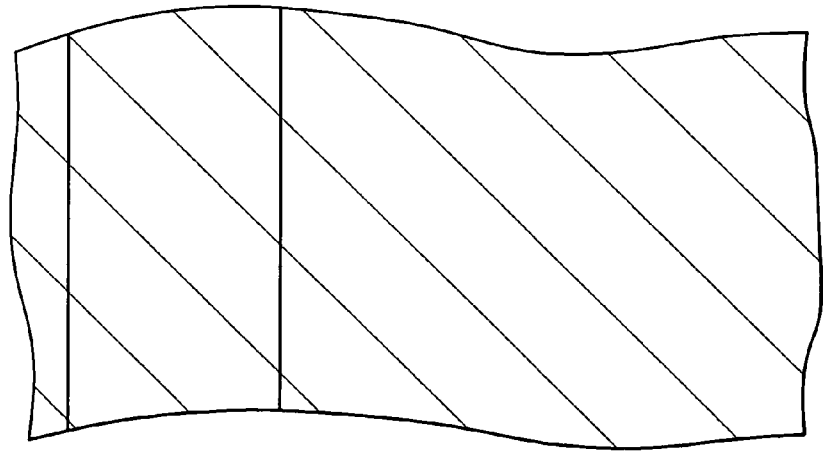

FIGS. 14A, 14B and 14C are cross-sectional, top and bottom views, respectively, of thermal adhesive 160 formed on chip 110.

Thermal adhesive 160 is initially an epoxy in paste form that includes an epoxy resin, a curing agent, an accelerator and a filler. The filler is a thermally conductive material such as silver that improves thermal conductivity, thermal shock resistance, and thermal coefficient of expansion matching. The epoxy paste is dispensed on surface 114 of chip 110, and then the epoxy paste is cured or hardened at a relatively low temperature in the range of 100 to 250° C. to form a solid adherent high thermal conductivity adhesive that provides a thermal conductor for chip 110.

Thermal adhesive 160 contacts and covers chip 110, extends upwardly beyond chip 110, metal base 120, routing line 140, solder mask 150 and chip adhesive 154 and has a thickness of 100 microns.

Figure 15A:
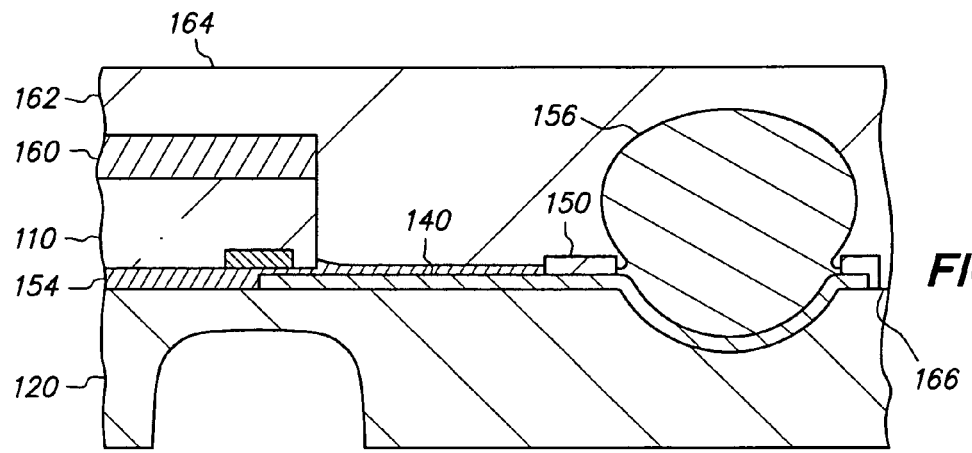
Figure 15B:
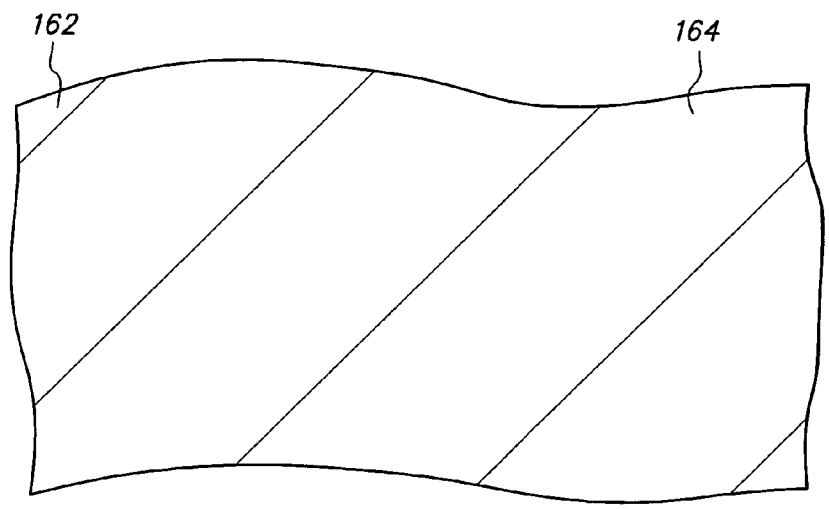
Figure 15C:
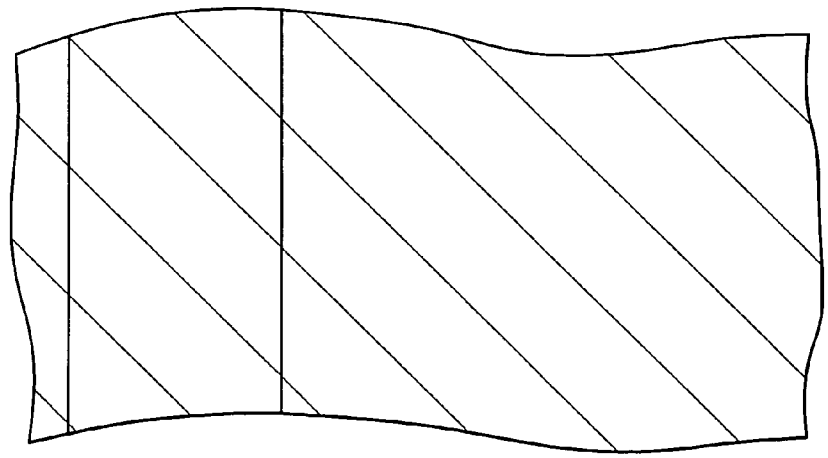

FIGS. 15A, 15B and 15C are cross-sectional, top and bottom views, respectively, of encapsulant 162 formed on chip 110, metal base 120, solder mask 150, chip adhesive 154, metal pillar 156 and thermal adhesive 160.

Encapsulant 162 is deposited by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

The preferred transfer molding system includes a preheater, a mold, a press and a cure oven. The mold includes an upper mold section and a lower mold section, also called "platens" or "halves" which define the mold cavities. The mold also includes the transfer pot, runners, gates and vents. The transfer pot holds the molding compound. The runners and gates provide channels from the transfer pot to the cavities. The gates are placed near the entrances of the cavities and are constricted to control the flow and injection velocity of the molding compound into the cavities and to facilitate removal of the solidified molding compound after molding occurs. The vents allow trapped air to escape but are small enough to permit only a negligible amount of the molding compound to pass through them.

The molding compound is initially in tablet form. The preheater applies high-frequency energy to preheat the molding compound to a temperature in the range of 50 to 100° C. The preheated temperature is below the transfer temperature and therefore the preheated molding compound is not in a fluid state. In addition, the structure is placed in one of the mold cavities, and the press operates hydraulically to close the mold and seal the mold cavities by clamping together the upper and lower mold sections. Guide pins ensure proper mating of the upper and lower mold sections at the parting line. In addition, the mold is heated to a transfer temperature in the range of 150 to 250° C. by inserting electric heating cartridges in the upper and lower mold sections.

After closing the mold, the preheated molding compound in tablet form is placed in the transfer pot. Thereafter, a transfer plunger applies pressure to the molding compound in the transfer pot. The pressure is in the range of 10 to 100 kgf/cm$^2$ and preferably is set as high as possible without introducing reliability problems. The combination of heat from the mold and pressure from the transfer plunger converts the molding compound in the transfer pot into a fluid state. Furthermore, the pressure from the transfer plunger forces the fluid molding compound through the runners and the gates into the mold cavities. The pressure is maintained for a certain optimum time to ensure that the molding compound fills the cavities.

The lower mold section contacts and makes sealing engagement with and is generally flush with metal base 120. However, the upper mold section is spaced from metal pillar 156 by 100 microns and from thermal adhesive 160 by 250 microns. As a result, the molding compound contacts the exposed portions of the chip 110, metal base 120, solder mask 150, chip adhesive 154, metal pillar 156 and thermal adhesive 160 in the cavity. After 1 to 3 minutes at the transfer temperature, the molding compound polymerizes and is partially cured in the mold.

Once the partially cured molding compound is resilient and hard enough to withstand ejection forces without significant permanent deformation, the press opens the mold, ejector pins remove the molded structure from the mold, and excess molding compound attached to the molded structure that solidified in the runners and the gates is trimmed and removed. The molded structure is then loaded into a magazine and postcured in the curing oven for 4 to 16 hours at a temperature somewhat lower than the transfer temperature but well above room temperature to completely cure the molding compound.

The molding compound is a multi-component mixture of an encapsulating resin with various additives. The principal additives include curing agents (or hardeners), accelerators, inert fillers, coupling agents, flame retardants, stress-relief agents, coloring agents and mold-release agents. The encapsulating resin provides a binder, the curing agent provides linear/cross-polymerization, the accelerator enhances the polymerization rate, the inert filler increases thermal conductivity and thermal shock resistance and reduces the thermal coefficient of expansion, resin bleed, shrinkage and residual stress, the coupling agent enhances adhesion to the structure, the flame retardant reduces flammability, the stress-relief agent reduces crack propagation, the coloring agent reduces photonic activity and device visibility, and the mold-release agent facilitates removal from the mold.

Encapsulant 162 contacts chip 110, metal base 120, solder mask 150, chip adhesive 154, metal pillar 156 and thermal adhesive 160 and covers chip 110, metal base 120, routing line 140, solder mask 150, chip adhesive 154, metal pillar 156 and thermal adhesive 160. More particularly, encapsulant 162 contacts the outer edges of chip 110, the exposed surfaces of metal pillar 156 and thermal adhesive 160, and the exposed upwardly facing surface portions of metal base 120, solder mask 150 and chip adhesive 154. However, encapsulant 162 is spaced from surface 112 of chip 110 (due to chip adhesive 154) and surface 114 of chip 112 (due to thermal adhesive 160) and routing line 140 (due to solder mask 150, chip adhesive 154 and metal pillar 156).

Encapsulant 162 is a solid adherent compressible protective layer that provides environmental protection such as moisture resistance and particle protection for chip 110 as well as mechanical support for conductive trace 158 outside the periphery of chip 110. Chip 110, metal pillar 156 and thermal adhesive 160 are embedded in encapsulant 162, and thermal adhesive 160 has much higher thermal conductivity than encapsulant 162.

Encapsulant 162 includes opposing surfaces 164 and 166. Surface 164 faces upwardly, and surface 166 faces downwardly. Encapsulant 162 extends upwardly beyond chip 110, metal base 120, routing line 140, solder mask 150, chip adhesive 154, metal pillar 156 and thermal adhesive 160, has a thickness of 500 microns and extends 100 microns upwardly beyond metal pillar 156 and 250 microns upwardly beyond thermal adhesive 160.

Figure 16A:
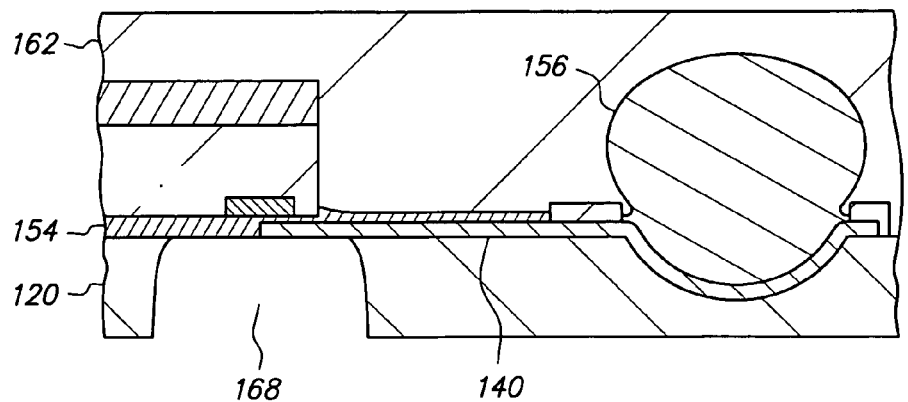
Figure 16B:
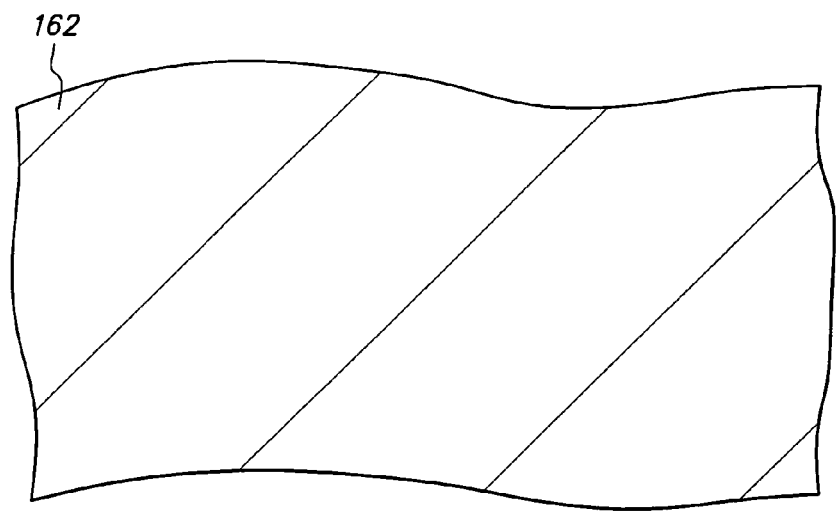
Figure 16C:
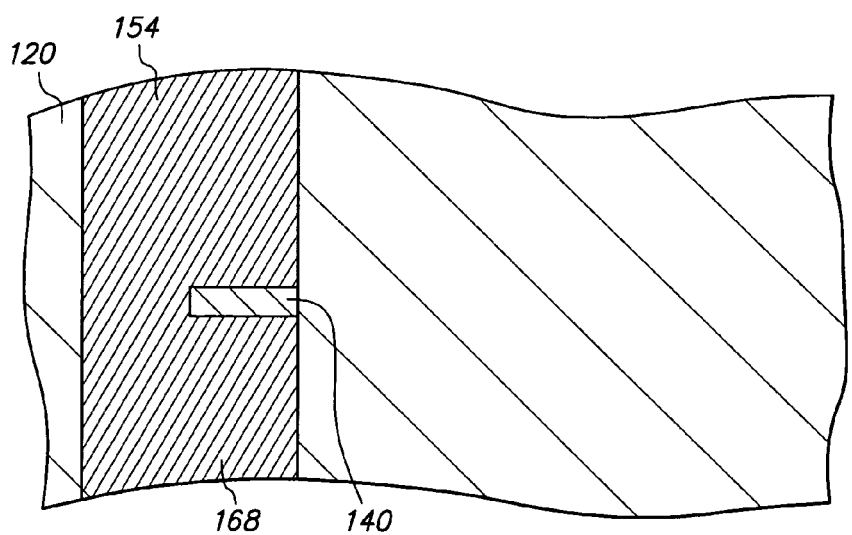

FIGS. 16A, 16B and 16C are cross-sectional, top and bottom views, respectively, of opening 168 that extends through metal base 120 and exposes routing line 140 and chip adhesive 154.

Opening 168 is formed by applying a blanket wet chemical etch to metal base 120. For instance, the bottom spray nozzle can spray another wet chemical etch on metal base 120 while the top spray nozzle is deactivated, or the structure can be dipped in the wet chemical etch since encapsulant 162 covers metal pillar 156. The wet chemical etch is highly selective of copper with respect to nickel and polyimide, and therefore, highly selective of metal base 120 with respect to the first nickel layer of routing line 140 and chip adhesive 154. Furthermore, the first nickel layer of routing line 140 and chip adhesive 154 protect the copper layer of routing line 140 from the wet chemical etch. Therefore, no appreciable amount of routing line 140 or chip adhesive 154 is removed.

The wet chemical etch etches 50 microns into metal base 120, thereby reducing the thickness of metal base 120 to 150 microns (200-50) and effecting a pattern transfer of slot 130 to form opening 168. That is, since slot 130 has a depth of 150 microns and is separated from routing line 140 and chip adhesive 154 by a 50 micron thick portion of metal base 120 before the wet chemical etch is applied, the wet chemical etch removes this 50 micron thick portion of metal base 120, thereby extending slot 130 through the remaining 50 microns of metal base 120 and converting slot 130 into opening 168 that extends through metal base 120 (between surfaces 122 and 124).

The wet chemical etch removes a portion of metal base 120 within the periphery of pad 116 that contacts routing line 140 without removing another portion of metal base 120 outside the periphery of chip 110 that contacts routing line 140, thereby reducing but not eliminating contact area between metal base 120 and routing line 140. However, the wet chemical etch does not expose routing line 140 outside opening 168. For instance, metal base 120 continues to contact and cover bumped terminal 142.

A suitable wet chemical etch can be provided by the same solution used for etching metal base 120 to form slot 130 and recess 132. The optimal etch time for exposing metal base 120 to the wet chemical etch in order to form opening 168 with the desired dimensions can be established through trial and error.

Figure 17A:
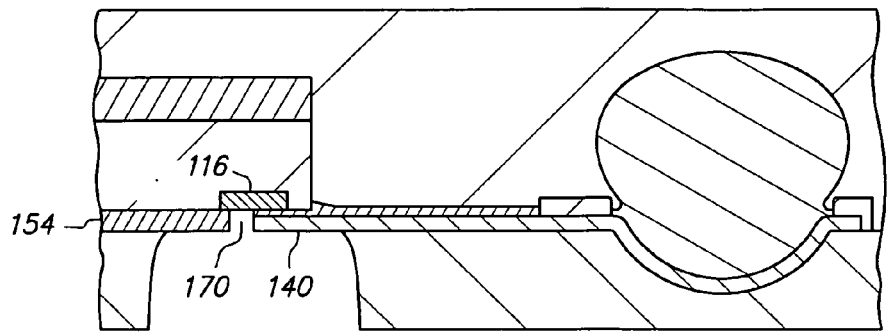
Figure 17B:
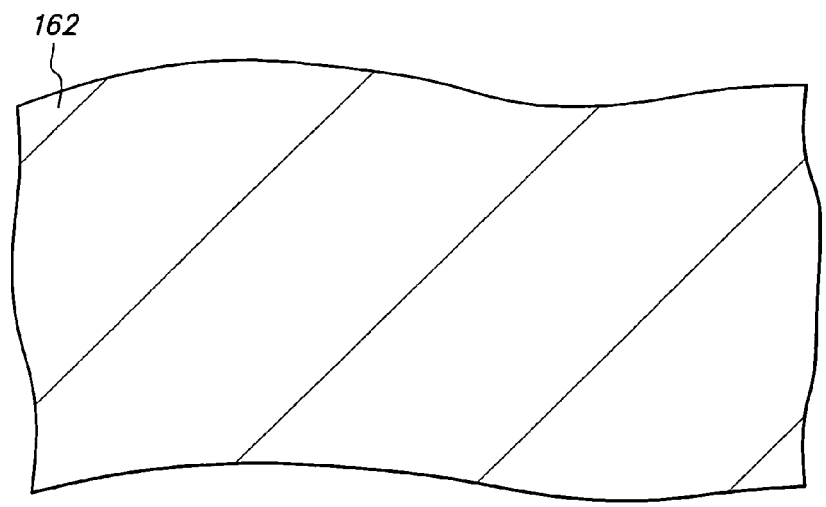
Figure 17C:
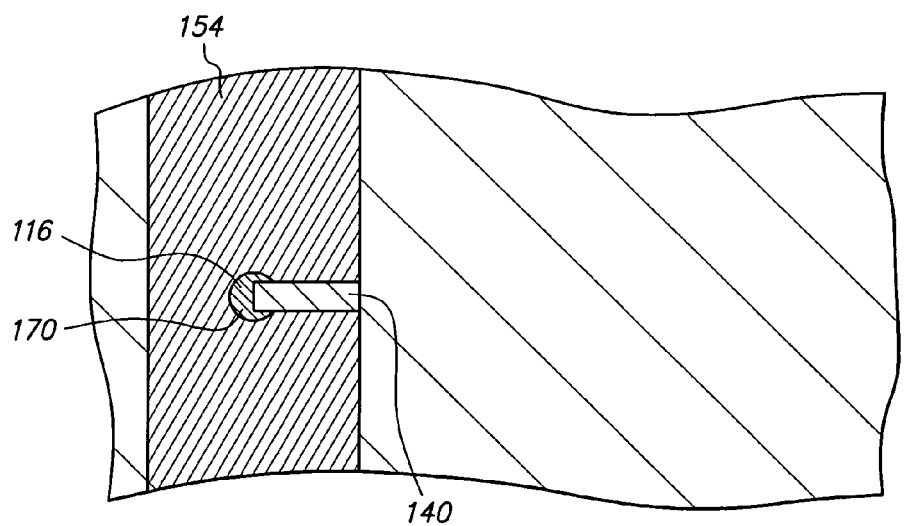

FIGS. 17A, 17B and 17C are cross-sectional, top and bottom views, respectively, of through-hole 170 that extends through chip adhesive 154 and exposes pad 116 and routing line 140.

Through-hole 170 is formed through chip adhesive 154 by applying a suitable etch that is highly selective of chip adhesive 154 with respect to pad 116 and routing line 140. In this instance, a selective TEA $CO_2$ laser etch is applied. The laser is directed at and vertically aligned with and centered relative to pad 116. The laser has a spot size of 70 microns, and pad 116 has a length and width of 100 microns. As a result, the laser strikes pad 116 and portions of routing line 140 and chip adhesive 154 that extend within the periphery of pad 116, and ablates chip adhesive 154.

The laser drills through and removes a portion of chip adhesive 154. However, portions of chip adhesive 154 that extend across the peripheral edges of pad 116 are outside the scope of the laser and remain intact. Likewise, routing line 140 shields a portion of chip adhesive 154 from the laser etch, and a portion of chip adhesive 154 sandwiched between pad 116 and routing line 140 remains intact. The laser etch is anisotropic, and therefore little or none of chip adhesive 154 sandwiched between pad 116 and routing line 140 is undercut or removed.

Thereafter, a brief cleaning step can be applied to remove oxides and debris that may be present on the exposed portions of pad 116 and routing line 140. For instance, a brief oxygen plasma cleaning step can be applied to the structure. Alternatively, a brief wet chemical cleaning step using a solution containing potassium permanganate can be applied to the structure. In either case, the cleaning step cleans the exposed portions of pad 116 and routing line 140 without damaging the structure.

Through-hole 170 is formed in and extends vertically through chip adhesive 154, is disposed within the peripheries of chip 110 and opening 168, is vertically aligned with and exposes pad 116, exposes elongated routing portion 146 of routing line 140, is spaced from bumped terminal 142 and metal pillar 156 and has a diameter of 70 microns. Through-hole 170 is formed without damaging pad 116, passivation layer 118 or routing line 140 and does not extend into chip 110.

Through-hole 170 may slightly undercut chip adhesive 154 between pad 116 and routing line 140 and have a diameter that is slightly larger than 70 microns due to the beam angle of the laser, the thermal effects of the laser, and/or the isotropic nature of an oxygen plasma or wet chemical cleaning step. For convenience of explanation, this slight undercut and enlargement is ignored.

Figure 17D:
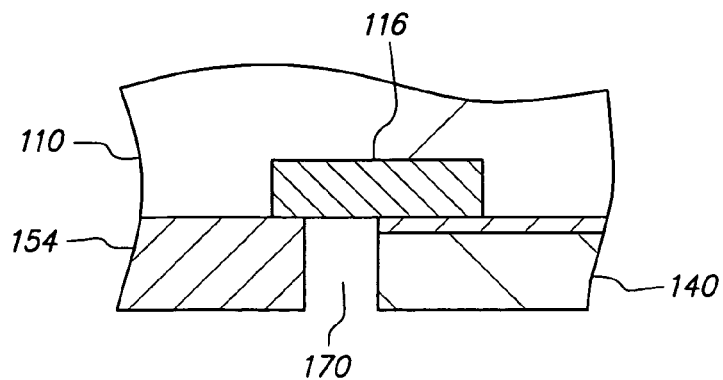
FIGS. 17D, 17E and 17F are enlarged cross-sectional, bottom and cross-sectional views, respectively, of the through-hole in FIG. 17A.
Figure 17E:
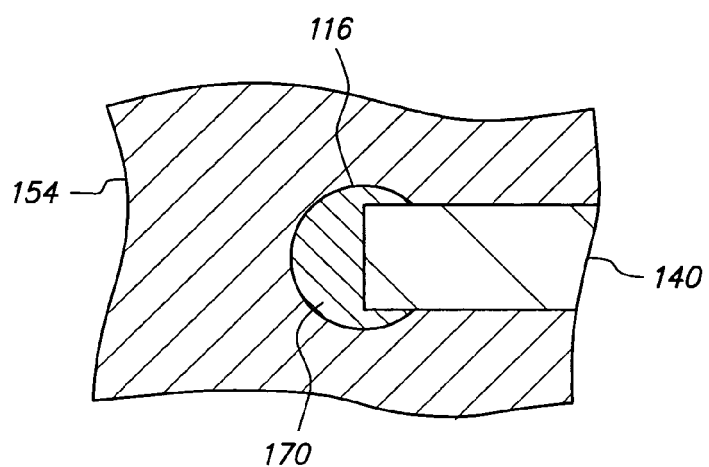
Figure 17F:
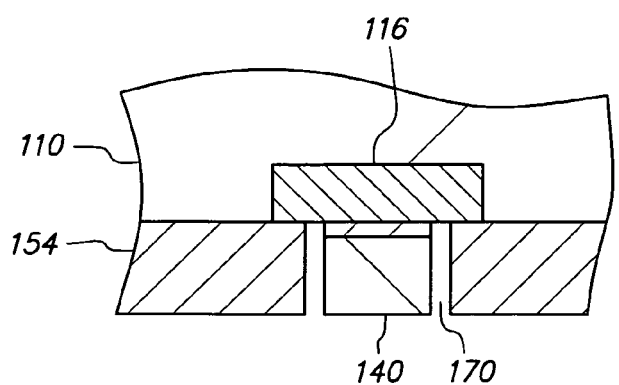

FIGS. 17D, 17E and 17F are enlarged cross-sectional, bottom and cross-sectional views, respectively, of through-hole 170. FIG. 17F is oriented orthogonally with respect to FIG. 17D. As is seen, through-hole 170 extends through chip adhesive 154 to pad 116 and exposes the downwardly facing surface and elongated peripheral sidewalls of routing line 140, and chip adhesive 154 remains in contact with and sandwiched between pad 116 and routing line 140.

Figure 18A:
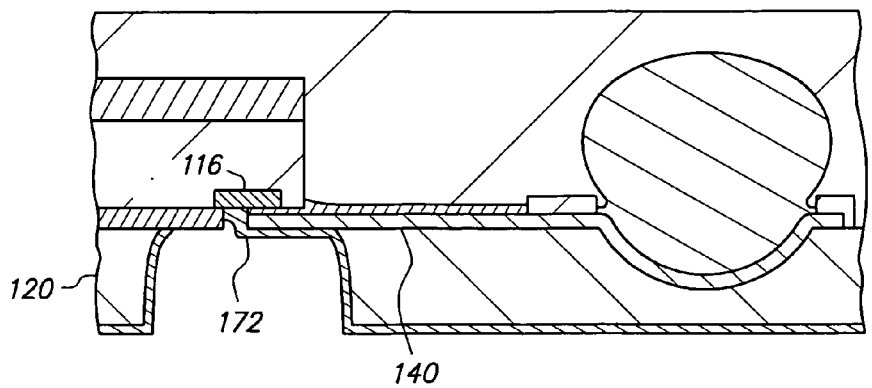
Figure 18B:
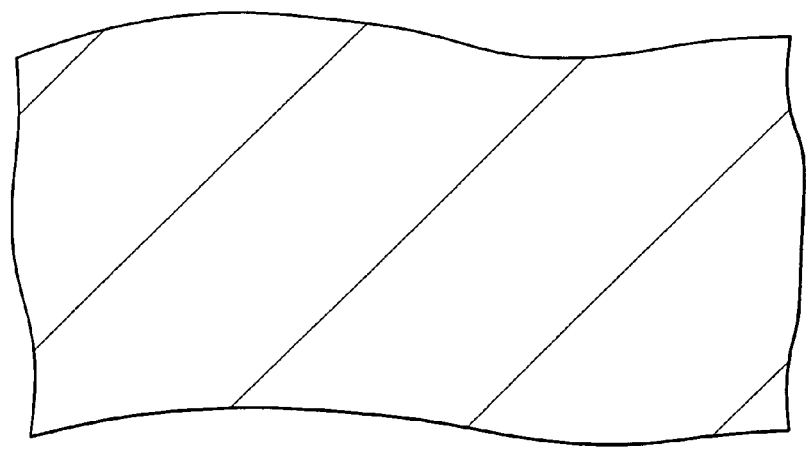
Figure 18C:
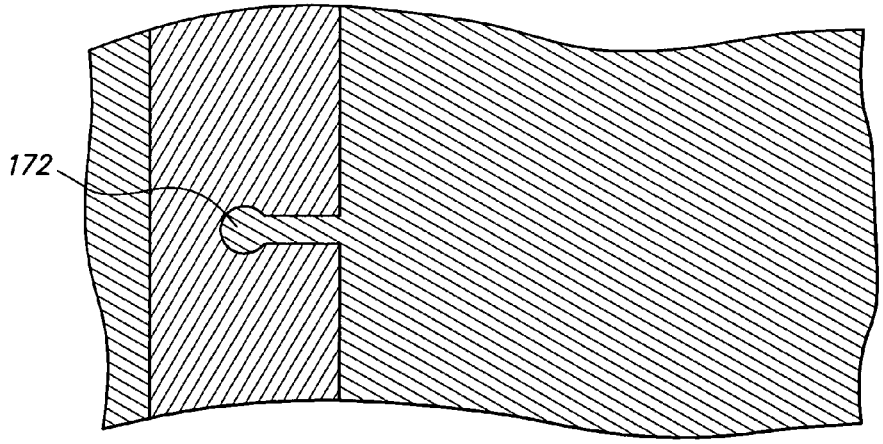

FIGS. 18A, 18B and 18C are cross-sectional, top and bottom views, respectively, of connection joint 172 formed on pad 116, metal base 120 and routing line 140.

Connection joint 172 is formed by an electroplating operation. Initially, metal base 120 is connected to a plating bus (not shown), current is applied to the plating bus from an external power source, and the structure is submerged in an electrolytic copper plating solution such as Sel-Rex CUBATH M™ at room temperature. As a result, connection joint 172 electroplates on the exposed portions of metal base 120. In addition, since the plating bus provides the current to metal base 120, which in turn provides the current to routing line 140, connection joint 172 electroplates on the exposed portions of routing line 140 in opening 168 and in through-hole 170. At the initial stage, since chip adhesive 154 is an electrical insulator and pad 116 is not connected to the plating bus, connection joint 172 does not electroplate on pad 116 and is spaced from pad 116. However, as the copper electroplating continues, connection joint 172 continues to plate on routing line 140, extends through chip adhesive 154 and contacts pad 116. As a result, pad 116 is connected to the plating bus by metal base 120, routing line 140 and connection joint 172, and therefore connection joint 172 begins to electroplate on pad 116 as well. The copper electroplating continues until connection joint 172 has the desired thickness. Thereafter, the structure is removed from the electrolytic copper plating solution and rinsed in distilled water to remove contaminants.

Connection joint 172 contacts and electrically connects pad 116 and routing line 140 in through-hole 170 and extends downwardly beyond chip 110 and routing line 140. Connection joint 172 contacts and covers portions of pad 116 and routing line 140 that were previously exposed by through-hole 170. Thus, connection joint 172 provides a robust, permanent electrical connection between pad 116 and routing line 140. Connection joint 172 is composed of copper. Connection joint 172 is the only electrical conductor external to chip 110 that contacts pad 116, chip adhesive 154 and connection joint 172 are the only materials external to chip 110 that contact pad 116, and chip adhesive 154 and connection joint 172 are the only materials that contact both pad 116 and routing line 140.

At this stage, conductive trace 158 includes routing line 140 and metal pillar 156 and is electrically connected to pad 116 by connection joint 172.

Figure 18D:
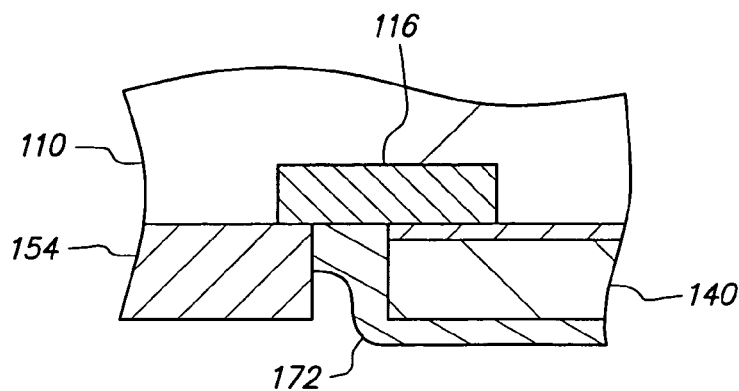
FIGS. 18D, 18E and 18F are enlarged cross-sectional, bottom and cross-sectional views, respectively, of the connection joint in FIG. 18A.
Figure 18E:
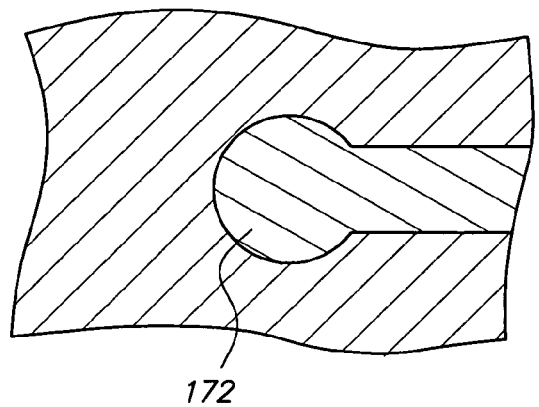
Figure 18F:
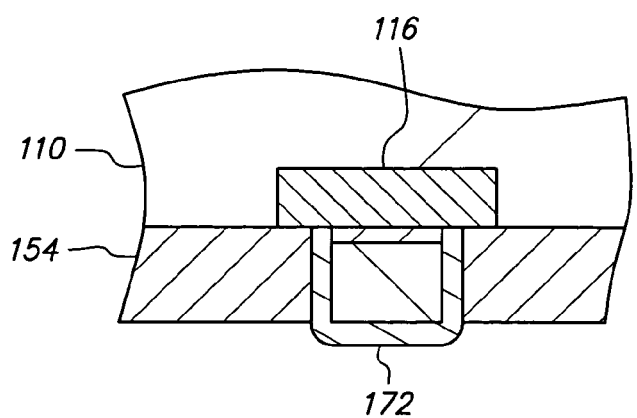

FIGS. 18D, 18E and 18F are enlarged cross-sectional, bottom and cross-sectional views, respectively, of connection joint 172. FIG. 18F is oriented orthogonally with respect to FIG. 18D. As is seen, connection joint 172 extends into through-hole 170 and contacts and electrically connects pad 116 and routing line 140. Furthermore, connection joint 172 contacts the downwardly facing surface and elongated peripheral sidewalls of routing line 140, and chip adhesive 154 remains in contact with and sandwiched between pad 116 and routing line 140.

Figure 19A:
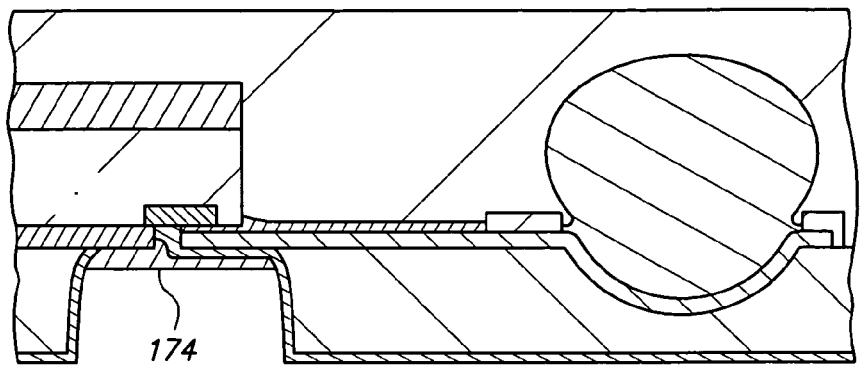
Figure 19B:
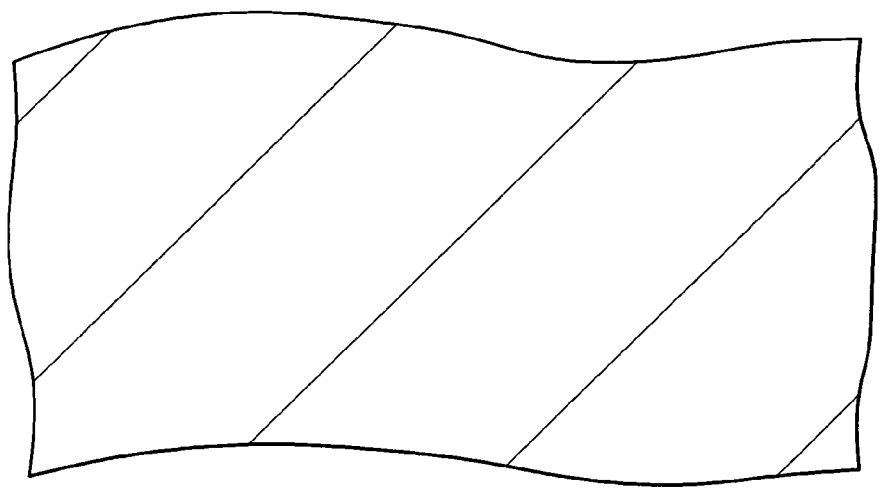
Figure 19C:
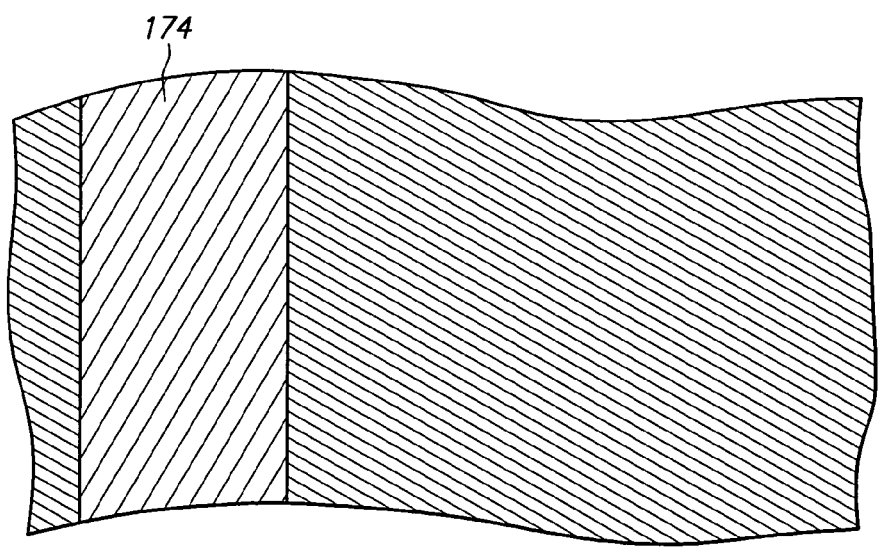

FIGS. 19A, 19B and 19C are cross-sectional, top and bottom views, respectively, of insulative plug 174 formed on chip adhesive 154 and connection joint 172 in opening 168.

Preferably, insulative plug 174 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is selectively deposited into opening 168 using stencil printing, and then the epoxy paste is cured or hardened at a relatively low temperature in the range of 100 to 250° C. to form a solid adherent insulator that provides a protective seal for connection joint 172 in through-hole 170.

Insulative plug 174 contacts and covers chip adhesive 154 and connection joint 172 proximate to pad 116 in opening 168, is disposed within opening 168 and has a thickness of 30 microns.

For convenience of illustration, insulative plug 174 is shown below chip 110 to retain a single orientation throughout the figures for ease of comparison between the figures, although in this step the structure would be inverted so that gravitational force would assist the epoxy paste deposition.

Figure 20A:
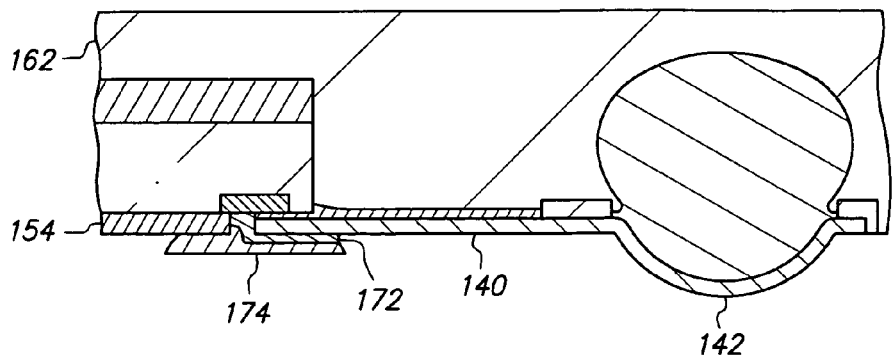
Figure 20B:
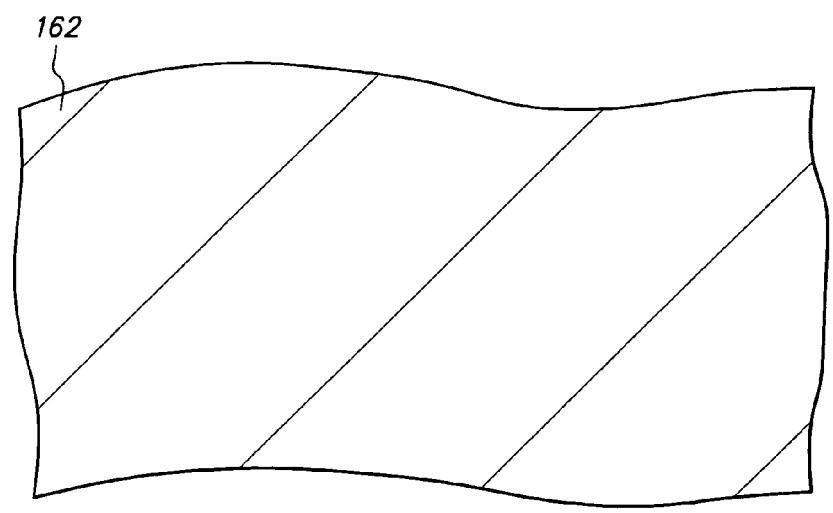
Figure 20C:
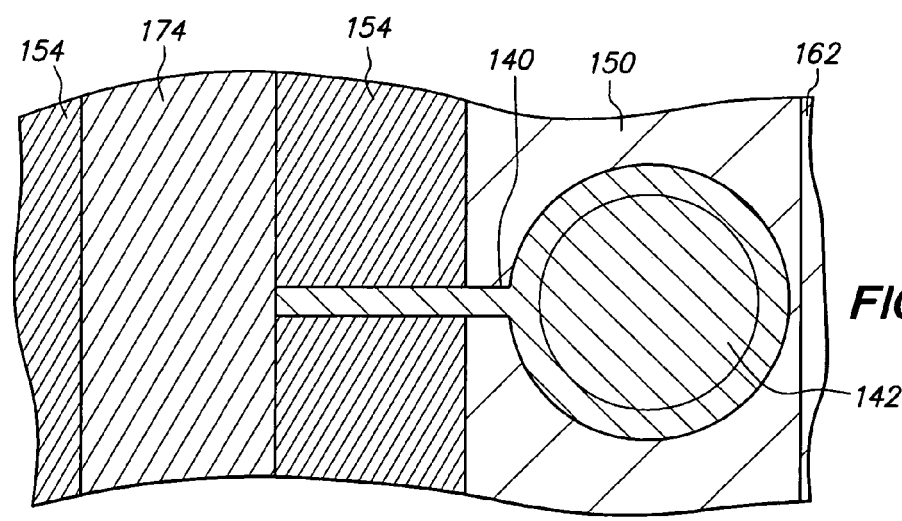

FIGS. 20A, 20B and 20C are cross-sectional, top and bottom views, respectively, of the structure after metal base 120 and a portion of connection joint 172 are removed.

Metal base 120 and a portion of connection joint 172 are removed by applying a blanket wet chemical etch. For instance, the bottom spray nozzle can spray another wet chemical etch on metal base 120 and a portion of connection joint 172 while the top spray nozzle is deactivated, or the structure can be dipped in the wet chemical etch since encapsulant 162 covers metal pillar 156. The wet chemical etch is highly selective of copper with respect to nickel, polyimide, epoxy, the solder mask material and the molding compound, and therefore, highly selective of metal base 120 and connection joint 172 with respect to the first nickel layer of routing line 140, solder mask 150, chip adhesive 154, encapsulant 162 and insulative plug 174. Furthermore, the first nickel layer of routing line 140, solder mask 150 and chip adhesive 154 protect the copper layer of routing line 140 from the wet chemical etch, and insulative plug 174 protects connection joint 172 in through-hole 170 from the wet chemical etch. Therefore, no appreciable amount of routing line 140, solder mask 150, chip adhesive 154 or encapsulant 162 is removed. Likewise, the portion of connection joint 172 that contacts and electrically connects pad 116 and routing line 140 in through-hole 170 remains intact.

The wet chemical etch initially removes the exposed portion of connection joint 172, thereby exposing metal base 120. Thereafter, the wet chemical etch removes metal base 120. Thus, the wet chemical etch eliminates contact area between metal base 120 and routing line 140. Furthermore, the wet chemical etch exposes bumped terminal 142.

A suitable wet chemical etch can be provided by the same solution used for etching metal base 120 to form slot 130 and recess 132. The optimal etch time for exposing metal base 120 to the wet chemical etch in order to remove metal base 120 without excessively exposing routing line 140 to the wet chemical etch can be established through trial and error.

Advantageously, since metal base 120 and connection joint 172 are composed of copper, metal base 120 can be removed by a single wet chemical etch step using a copper etching solution. Another advantage is that encapsulant 162 provides mechanical support for the structure, and therefore reduces the mechanical strain on solder mask 150 and chip adhesive 154. The enhanced mechanical strength is particularly useful after metal base 120 is removed. Still another advantage is that insulative plug 174 protects connection joint 172 in through-hole 170 from the wet chemical etch, thereby permitting connection joint 172 to be copper.

At this stage, conductive trace 178 remains electrically connected to pad 116 by connection joint 172. Furthermore, an electrically conductive path between pad 116 and metal pillar 156 not only includes but also requires routing line 140.

Figure 21A:
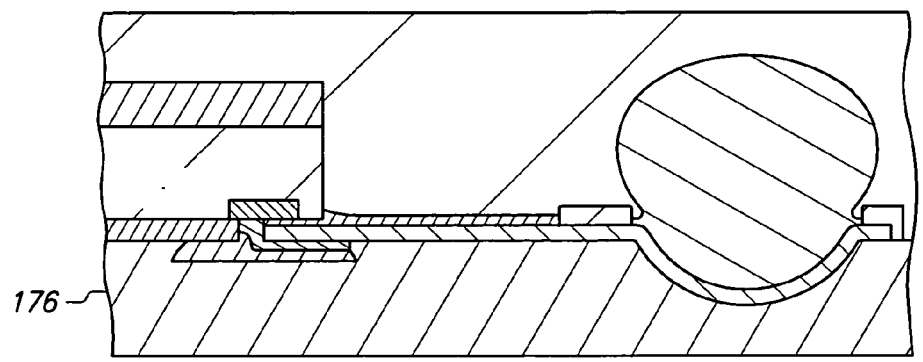
Figure 21B:
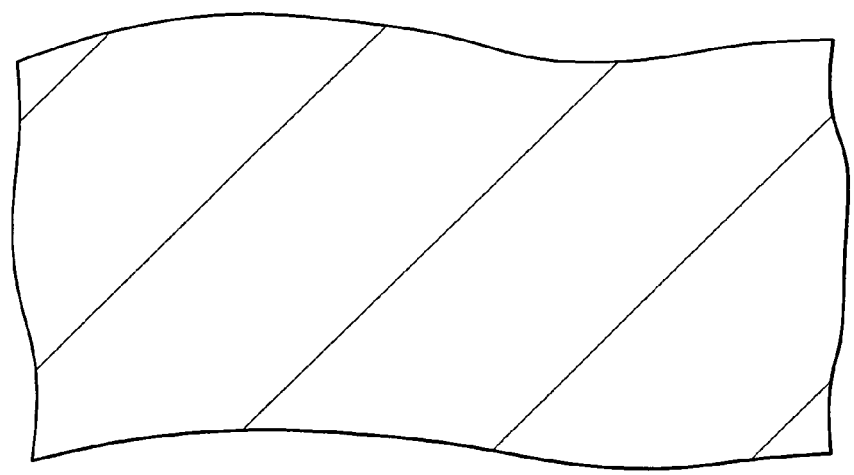
Figure 21C:
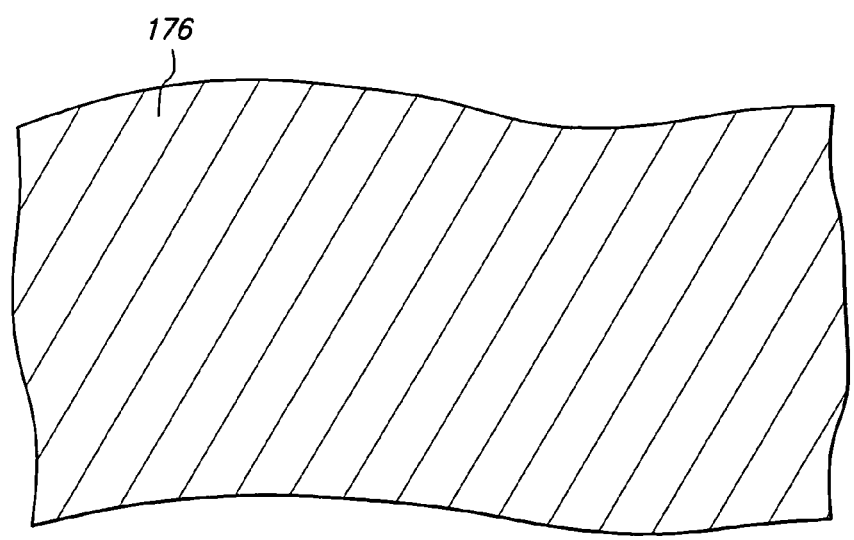

FIGS. 21A, 21B and 21C are cross-sectional, top and bottom views, respectively, of insulative base 176 formed on routing line 140, solder mask 150, chip adhesive 154, encapsulant 162 and insulative plug 174.

Preferably, insulative base 176 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is blanketly deposited on routing line 140, solder mask 150, chip adhesive 154, encapsulant 162 and insulative plug 174, and then the epoxy paste is cured or hardened at a relatively low temperature in the range of 100 to 250° C. to form a solid adherent insulator that provides a protective seal for routing line 140.

Insulative base 176 contacts and covers and extends downwardly beyond routing line 140, solder mask 150, chip adhesive 154, encapsulant 162 and insulative plug 174, covers and extends downwardly beyond and is spaced from chip 110, metal pillar 156 and thermal adhesive 160, has a thickness of 150 microns and extends downwardly beyond bumped terminal 142 by 50 microns.

For convenience of illustration, insulative base 176 is shown below chip 110 to retain a single orientation throughout the figures for ease of comparison between the figures, although in this step the structure would be inverted so that gravitational force would assist the epoxy paste deposition.

Figure 22A:
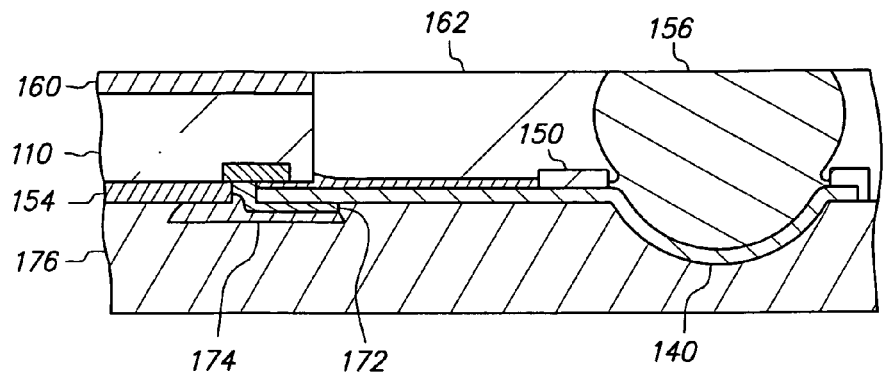
Figure 22B:
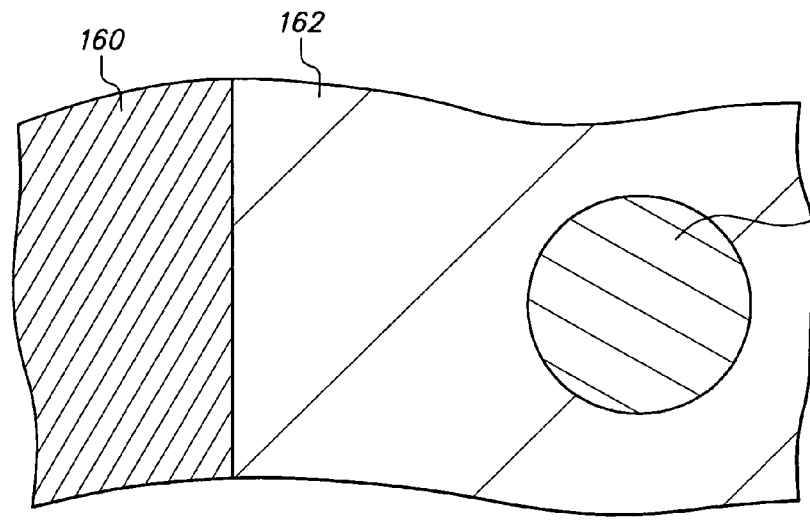
Figure 22C:
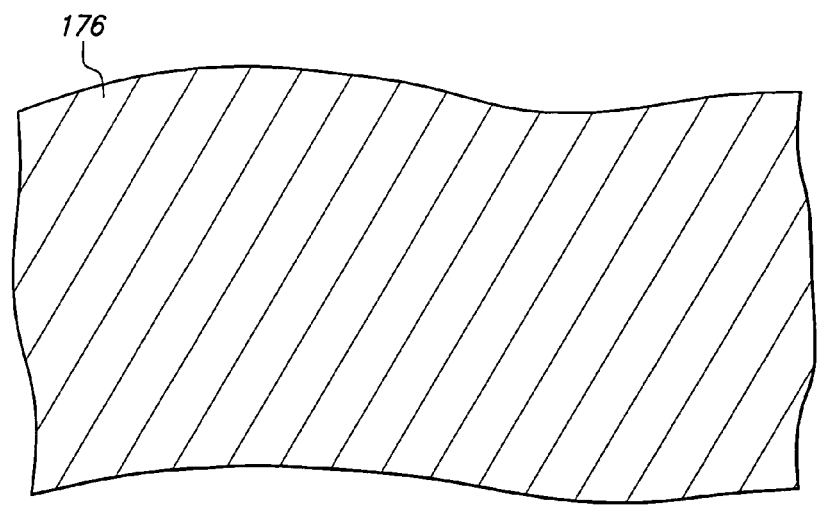

FIGS. 22A, 22B and 22C are cross-sectional, top and bottom views, respectively, of the structure after upper portions of metal pillar 156, thermal adhesive 160 and encapsulant 162 are removed.

The upper portions of metal pillar 156, thermal adhesive 160 and encapsulant 162 are removed by grinding. In particular, a rotating diamond sand wheel and distilled water are applied to surface 164 of encapsulant 162. Initially, the diamond sand wheel grinds only encapsulant 162. As the grinding continues, encapsulant 162 becomes thinner as its grinded surface migrates downwardly. Eventually the diamond sand wheel contacts metal pillar 156, and as a result, begins to grind metal pillar 156 as well. As the grinding continues, metal pillar 156 and encapsulant 162 become thinner as their grinded surfaces migrate downwardly. Eventually the diamond sand wheel contacts thermal adhesive 160, and as a result, begins to grind thermal adhesive 160 as well. As the grinding continues, metal pillar 156, thermal adhesive 160 and encapsulant 162 become thinner as their grinded surfaces migrate downwardly. The grinding continues until metal pillar 156, thermal adhesive 160 and encapsulant 162 have the desired thickness, and then halts before it reaches chip 110, routing line 140, solder mask 150 or chip adhesive 154. Thereafter, the structure is rinsed in distilled water to remove contaminants.

The grinding removes a 200 micron thick upper portion of metal pillar 156, a 50 micron thick upper portion of thermal adhesive 160 and a 300 micron thick upper portion of encapsulant 162. Thus, the grinding does not reach, damage or expose chip 110.

At this stage, metal pillar 156 and thermal adhesive 160 remain embedded in encapsulant 162 and are exposed. Chip 110, metal pillar 156, thermal adhesive 160 and encapsulant 162 continue to extend upwardly beyond routing line 140, solder mask 150, chip adhesive 154 and insulative base 176. Metal pillar 156, thermal adhesive 160 and encapsulant 162 are laterally aligned with one another and exposed. Thus, an exposed planarized horizontal surface that faces upwardly includes metal pillar 156, thermal adhesive 160 and encapsulant 162. Encapsulant 162 surrounds and is adjacent to metal pillar 156 at the exposed lateral surface, encapsulant 162 surrounds and is adjacent to thermal adhesive 160 at the exposed lateral surface, and metal pillar 156 and thermal adhesive 160 are spaced from one another at the exposed lateral surface.

Furthermore, metal pillar 156 and thermal adhesive 160 extend through surface 164 of encapsulant 162, and encapsulant 162 no longer covers chip 110, metal pillar 156 or thermal adhesive 160. Thus, metal pillar 156 and thermal adhesive 160 are not covered in the upward direction by another material of the assembly. Stated differently, metal pillar 156 and thermal adhesive 160 are exposed in the upward direction, and neither encapsulant 162 nor any other insulative material of the assembly covers metal pillar 156 or thermal adhesive 160 in the upward direction. Likewise, conductive trace 158 is exposed within the periphery of metal pillar 156 in the upward direction, and neither encapsulant 162 nor any other insulative material of the assembly covers conductive trace 158 within the periphery of metal pillar 156 in the upward direction.

Figure 23A:
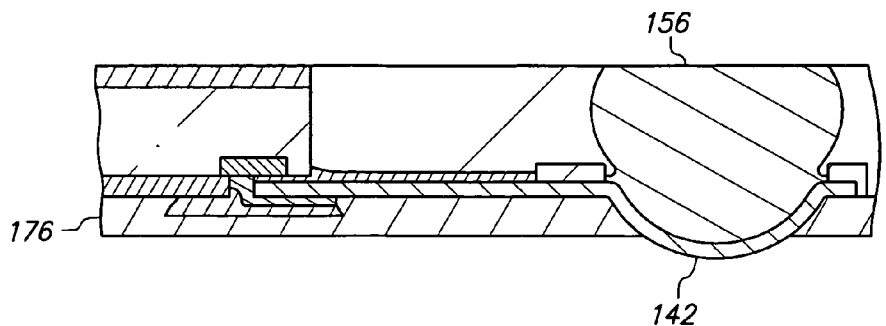
Figure 23B:
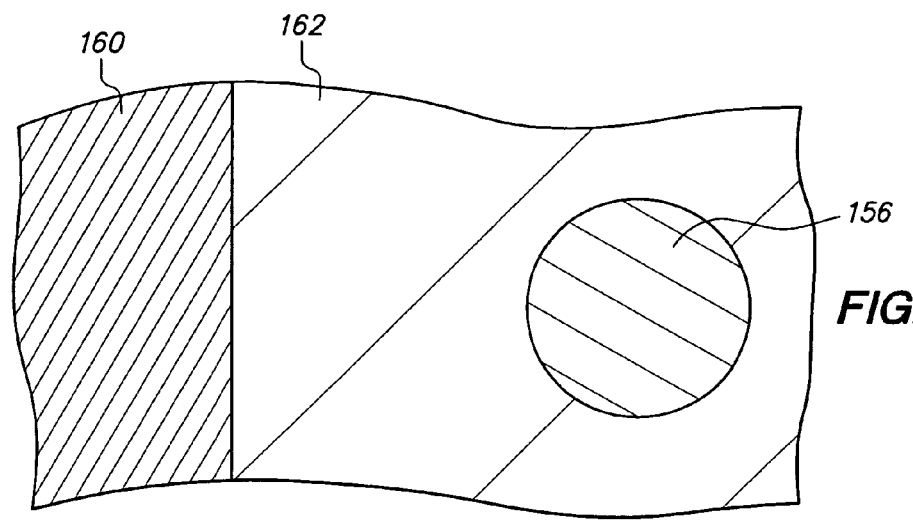
Figure 23C:
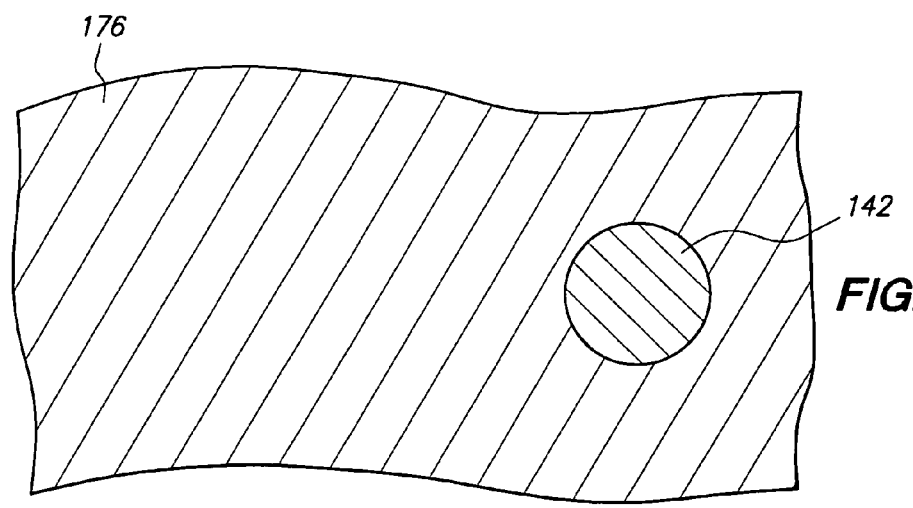

FIGS. 23A, 23B and 23C are cross-sectional, top and bottom views, respectively, of the structure after a lower portion of insulative base 176 is removed.

The lower portion of insulative base 176 is removed by applying a blanket plasma etch. The plasma etch continues until bumped terminal 142 is exposed, and then halts before it reaches enlarged annular portion 144, elongated routing portion 146, solder mask 150, chip adhesive 154, encapsulant 162 or insulative plug 174.

Bumped terminal 142 extends downwardly beyond insulative base 176 by 50 microns after the plasma etch. Thus, the plasma etch removes a 100 micron thick lower portion of insulative base 176, thereby reducing the thickness of insulative base 176 to 50 microns (150−100).

Figure 24A:
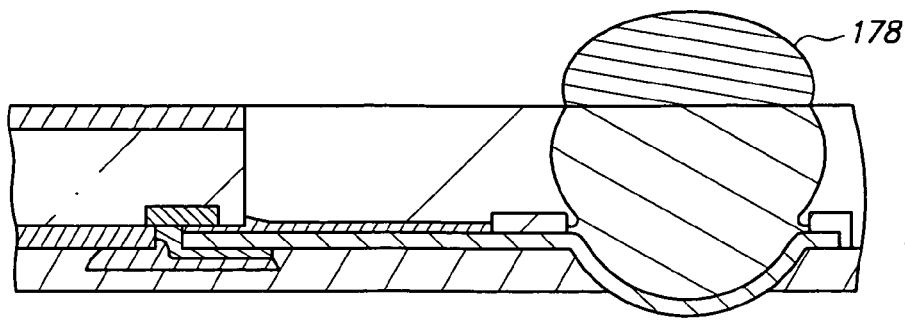
Figure 24B:
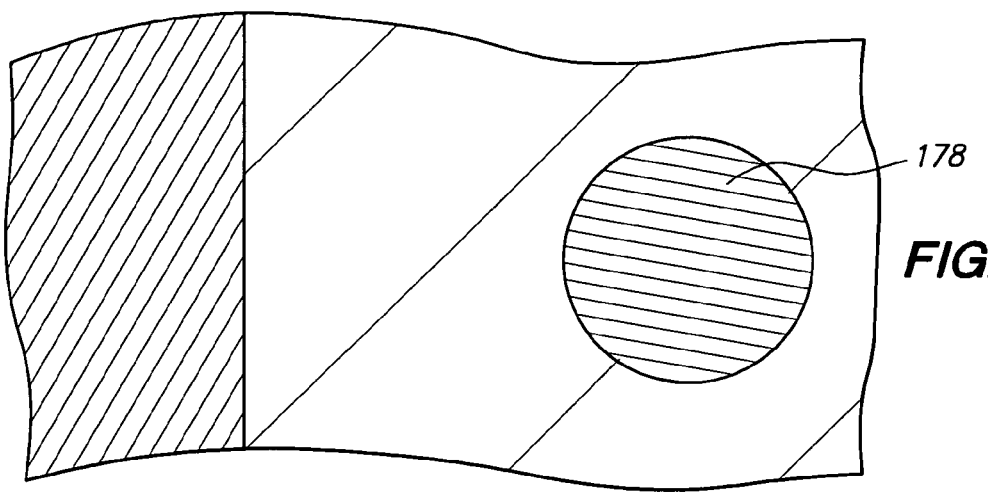
Figure 24C:
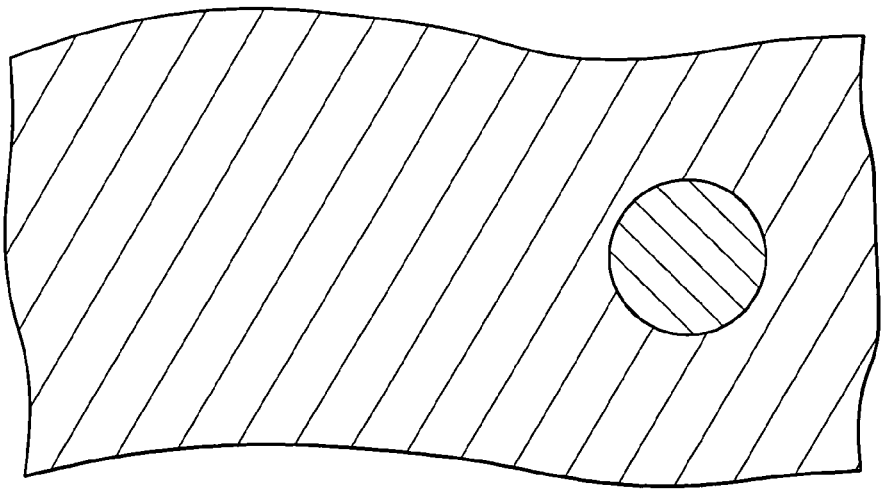

FIGS. 24A, 24B and 24C are cross-sectional, top and bottom views, respectively, of solder terminal 178 formed on metal pillar 156.

Solder terminal 178 is initially a tin-lead solder ball with a spherical shape and a diameter of 300 microns. Solder terminal 178 is dipped in flux to provide solder terminal 178 with a thin flux surface coating (not shown). Thereafter, solder terminal 178 with the flux surface coating is deposited on metal pillar 156 using a graphite fixture and a pick-up head, in a similar manner that metal pillar 156 was deposited on bumped terminal 142, then heat is applied to reflow solder terminal 178, and then the heat is removed and solder terminal 178 cools and solidifies.

Solder terminal 178 contacts and is electrically connected to metal pillar 156, spaced and separated from routing line 140 and connection joint 172, and extends upwardly beyond encapsulant 162. Thus, solder ball 178 provides a reflowable electrical connection to metal pillar 156 that protrudes upwardly from metal pillar 156 and is exposed. Solder terminal 178 has a substantially hemispherical shape with a diameter of 350 microns.

At this stage, conductive trace 158 includes routing line 140, metal pillar 156 and solder terminal 178.

Figure 25A:
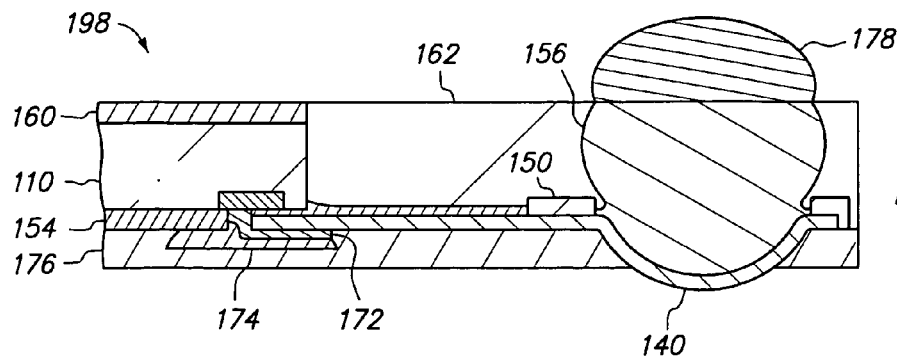
Figure 25B:
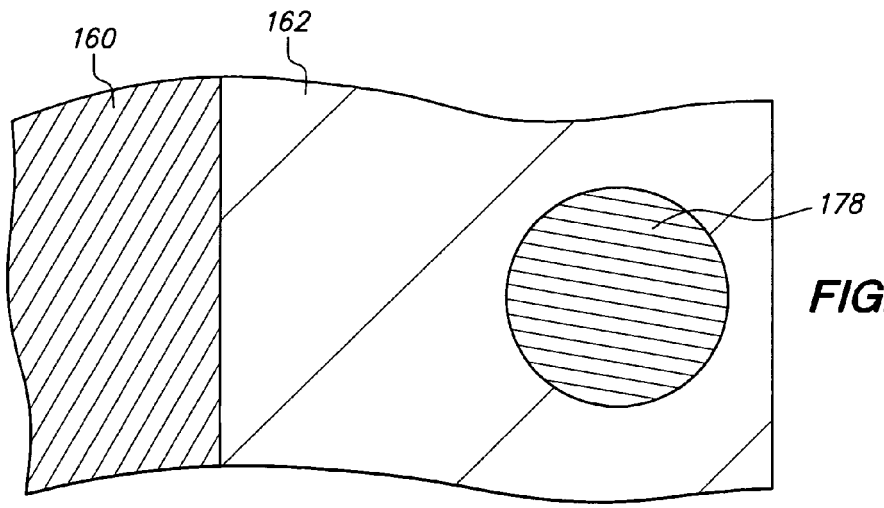
Figure 25C:
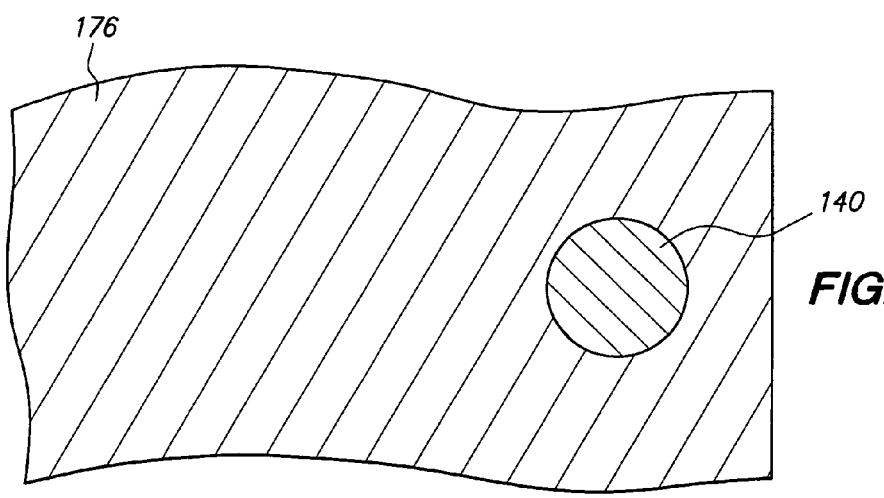

FIGS. 25A, 25B and 25C are cross-sectional, top and bottom views, respectively, of the structure after cutting encapsulant 162 and insulative base 176 with an excise blade to singulate the assembly from other assemblies.

At this stage, the manufacture of semiconductor chip assembly 198 that includes chip 110, routing line 140, solder mask 150, chip adhesive 154, metal pillar 156, thermal adhesive 160, encapsulant 162, connection joint 172, insulative plug 174, insulative base 176 and solder terminal 178 can be considered complete.

Routing line 140 is mechanically coupled to chip 110 by chip adhesive 154, and is electrically coupled to chip 110 by connection joint 172. Routing line 140 extends beyond an outer edge of chip 110 and provides horizontal fan-out routing between pad 116 and external circuitry, and metal pillar 156 extends across the thickness of chip 110 and provides vertical routing between pad 116 and external circuitry. Thermal adhesive 160 contacts only chip 110 and encapsulant 162 and is exposed, thereby providing a thermal path for chip 110 that is unconstrained by encapsulant 162 and enhancing thermal dissipation from chip 110. Encapsulant 162 and insulative base 176 provide mechanical support and environmental protection for the assembly. Encapsulant 162 has surface 164 exposed in the upward direction and surface 166 covered in the downward direction by insulative base 176 and unexposed in the downward direction.

The semiconductor chip assembly is a single-chip first-level package that is devoid of wire bonds and TAB leads.

The semiconductor chip assembly includes other conductive traces embedded in encapsulant 162, and only a single conductive trace 158 is shown for convenience of illustration. The conductive traces are spaced and separated and electrically isolated from one another. The conductive traces each include a respective routing line, metal pillar and solder terminal. The conductive traces are each electrically connected to a respective pad on chip 110 by a respective connection joint. The conductive traces each extend beyond an outer edge of chip 110 and extend across the thickness of chip 110 to provide horizontal fan-out routing and vertical routing for their respective pads. Furthermore, the conductive traces each include an upwardly protruding solder terminal and a downwardly protruding bumped terminal to facilitate a three-dimensional stacked arrangement.

Chip 110 is designed with the pads electrically isolated from one another. However, the corresponding routing lines are initially electroplated on metal base 120 and electrically connected to one another by metal base 120. Furthermore, the connection joint (or joints) are initially electroplated on the routing lines and the corresponding pads in the corresponding through-holes, thereby electrically connecting the pads with one another. Thereafter, once metal base 120 is etched and removed, the routing lines are electrically isolated from one another, and therefore, the pads return to being electrically isolated from one another.

Advantageously, there is no plating bus or related circuitry that need be disconnected or severed from the conductive traces after the metal base is removed.

Figure 26A:
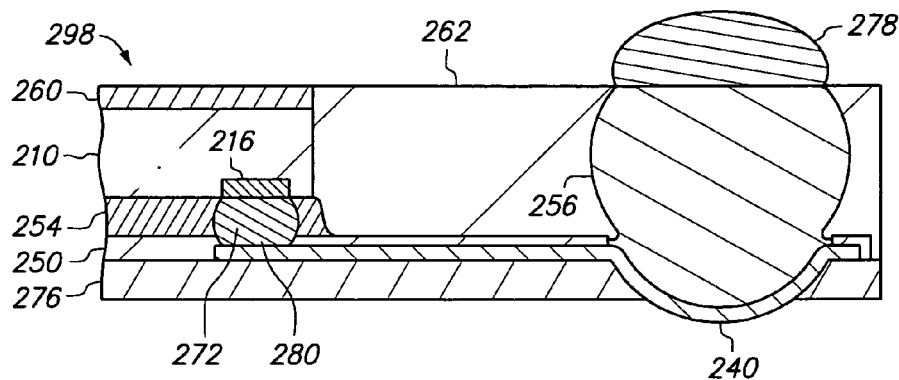
FIGS. 26A, 26B and 26C are cross-sectional, top and bottom views, respectively, of a semiconductor chip assembly in accordance with a second embodiment of the present invention.
Figure 26B:
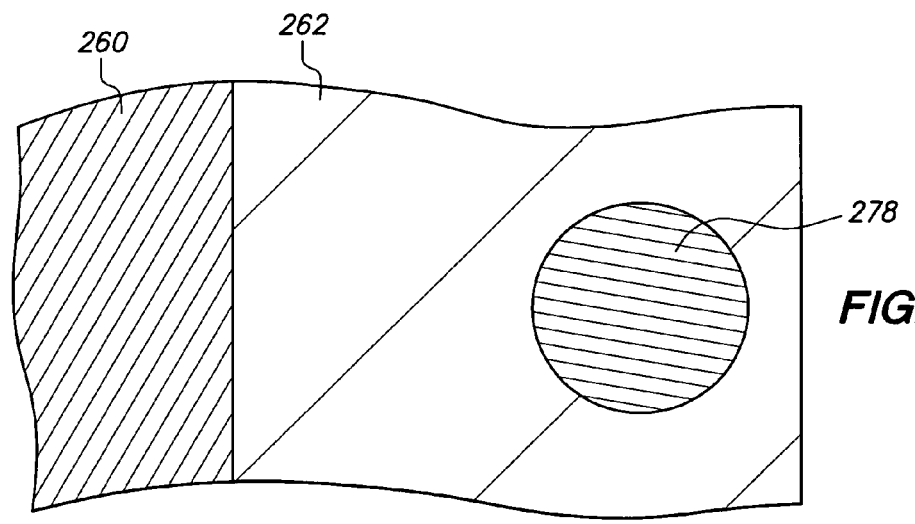
Figure 26C:
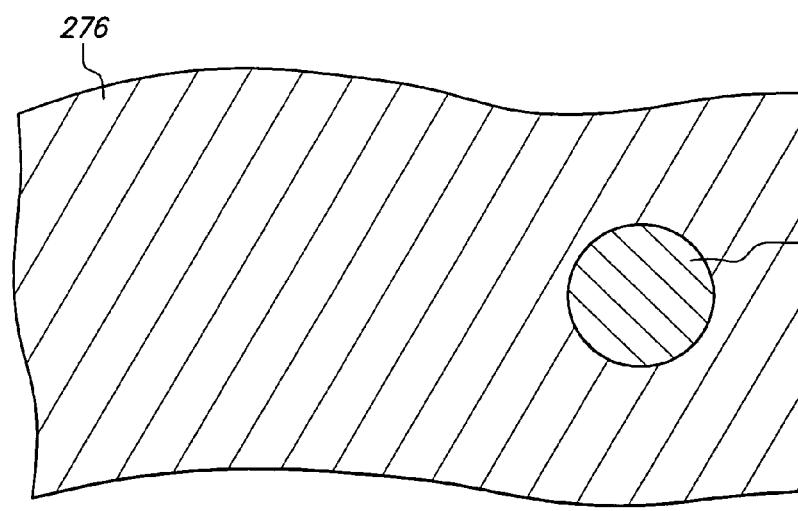

FIGS. 26A, 26B and 26C are cross-sectional, top and bottom views, respectively, of a semiconductor chip assembly in accordance with a second embodiment of the present invention. In the second embodiment, the chip is flip-chip bonded. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, routing line 240 corresponds to routing line 140, etc.

Connection joint 272 is initially a solder bump deposited on pad 216. The solder bump has a hemispherical shape and a diameter of 100 microns. Routing line 240 extends laterally beyond metal pillar 256 a slightly larger distance than routing line 140 extends laterally beyond metal pillar 156. Solder mask 250 extends laterally beyond routing line 240 in the direction away from metal pillar 256, extends 2 microns (rather than 30 microns) upwardly beyond routing line 240, and includes opening 280 that selectively exposes a portion of routing line 240 near the distal end of routing line 240 opposite metal pillar 256.

Chip 210 is positioned such that routing line 240 extends laterally across pad 216 and connection joint 272 is aligned with and extends into opening 280 and contacts and is sandwiched between pad 216 and routing line 240. Thereafter, heat is applied to reflow connection joint 272, and then the heat is removed and connection joint 272 cools and solidifies into a hardened solder joint that mechanically attaches and electrically connects pad 216 and routing line 240. Furthermore, connection joint 272 exhibits localized wetting and does not collapse, and chip 210 remains spaced and separated from routing line 240 and solder mask 250.

Thereafter, chip adhesive 254 is dispensed into and underfills the open gap between chip 210 and solder mask 250, and then chip adhesive 254 is cured. As a result, chip adhesive 254 contacts and is sandwiched between chip 210 and solder mask 250, contacts connection joint 272 and is spaced and separated from pad 216. Thus, chip adhesive 254 is significantly thicker than and has a significantly smaller surface area than chip adhesive 154 but a slightly larger surface area than chip 210. A suitable underfill adhesive is Namics U8443.

Thereafter, metal pillar 256, thermal adhesive 260 and encapsulant 262 are formed. Thus, chip adhesive 254, metal pillar 256, thermal adhesive 260 and encapsulant 262 are formed after connection joint 272.

The slot (corresponding to slot 132), opening (corresponding to opening 168) and insulative plug (corresponding to insulative plug 174) are omitted. Likewise, the metal base (corresponding to metal base 120) is etched once (rather than twice) and removed after encapsulant 262 is formed.

Semiconductor chip assembly 298 includes chip 210, routing line 240, solder mask 250, chip adhesive 254, metal pillar 256, thermal adhesive 260, encapsulant 262, connection joint 272, insulative base 276 and solder terminal 278.

Figure 27A:
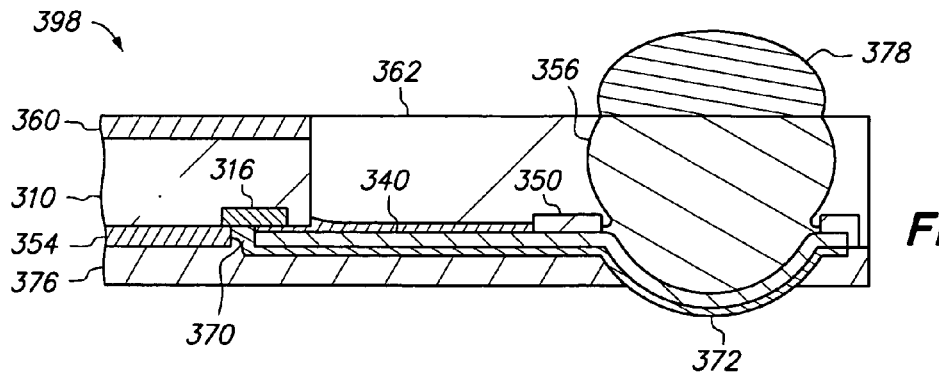
FIGS. 27A, 27B and 27C are cross-sectional, top and bottom views, respectively, of a semiconductor chip assembly in accordance with a third embodiment of the present invention.
Figure 27B:
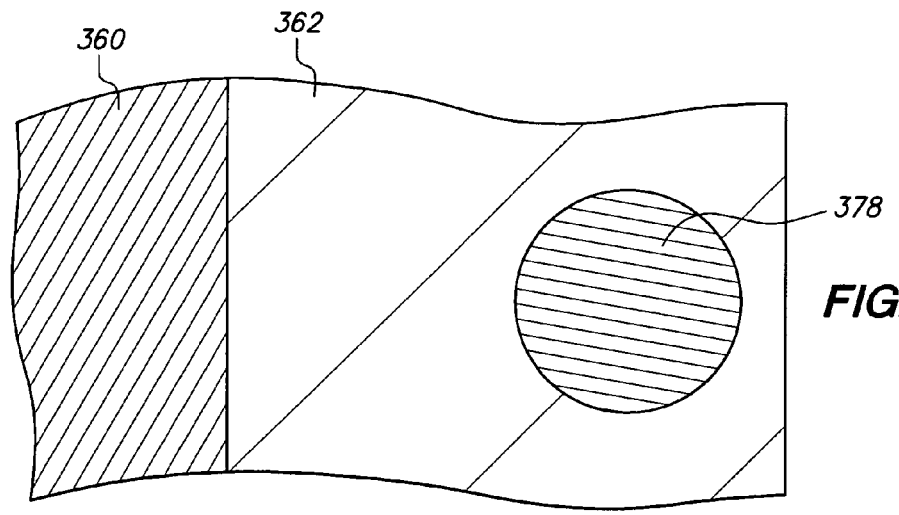
Figure 27C:
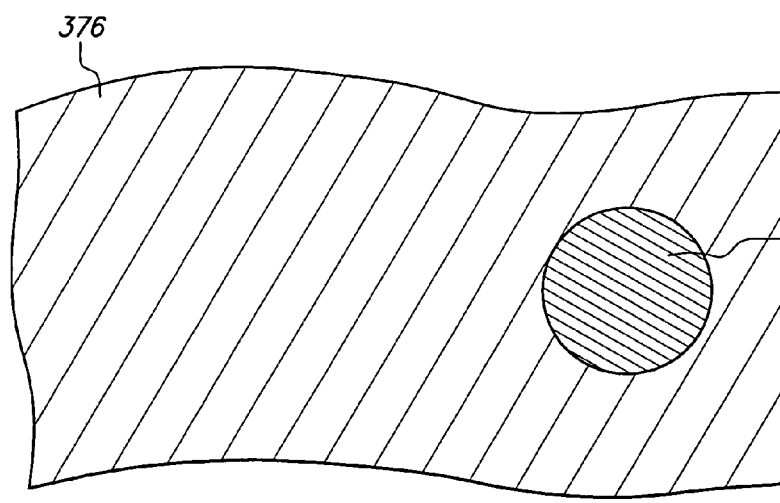

FIGS. 27A, 27B and 27C are cross-sectional, top and bottom views, respectively, of a semiconductor chip assembly in accordance with a third embodiment of the present invention. In the third embodiment, the connection joint is formed by electroless plating. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, routing line 340 corresponds to routing line 140, etc.

The slot (corresponding to slot 132), opening (corresponding to opening 168) and insulative plug (corresponding to insulative plug 174) are omitted. Likewise, the metal base (corresponding to metal base 120) is etched once (rather than twice) and removed after encapsulant 362 is formed.

Thereafter, connection joint 372 is formed. Connection joint 372 is composed of a nickel layer electrolessly plated on pad 316 and routing line 340 and a gold layer electrolessly plated on the nickel layer. In connection joint 372, the nickel layer contacts and is sandwiched between pad 316 and the gold layer and between routing line 340 and the gold layer, and the gold layer is spaced and separated from pad 316 and routing line 340 and exposed. For convenience of illustration, the nickel and gold layers are shown as a single layer.

During the electroless plating operation, the structure is submerged in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

Pad 316 and routing line 340 each include an exposed nickel surface layer and therefore are catalytic to electroless nickel. Furthermore, solder mask 350, chip adhesive 354 and encapsulant 362 are not catalytic to electroless nickel and therefore a plating mask is not necessary. As a result, connection joint 372 begins to plate on pad 316 and routing line 340. Connection joint 372 initially includes a first portion that begins to plate on pad 316 and a second portion that begins to plate on routing line 340, although the first and second connection joint portions do not contact one another and pad 316 remains electrically isolated from routing line 340. As the nickel electroless plating operation continues, and the connection joint portions continue to plate on pad 316 and routing line 340 and expand vertically in through-hole 370 towards one another, the connection joint portions eventually contact one another inside through-hole 370 and metallurgically merge into a single connection joint 372 that contacts and electrically connects pad 316 and routing line 340.

Thereafter, the assembly is removed from the electroless nickel plating solution and briefly submerged in an electroless gold plating solution such as is MacDermid PLANAR™ at 70° C. Connection joint 372 includes an exposed nickel surface layer and therefore is catalytic to electroless gold. Furthermore, solder mask 350, chip adhesive 354 and encapsulant 362 are not catalytic to electroless gold and therefore a plating mask is not necessary. As a result, the gold deposits on the nickel surface layer. The gold electroless plating operation continues until the gold surface layer has the desired thickness. Thereafter, the structure is removed from the electroless gold plating solution and rinsed in distilled water.

Thereafter, insulative base 376 is formed, then metal pillar 356, thermal adhesive 360 and encapsulant 362 are grinded, then the lower portion of insulative base 376 is removed, thereby exposing connection joint 372 (rather than routing line 340), and then solder terminal 378 is formed.

Semiconductor chip assembly 398 includes chip 310, routing line 340, solder mask 350, chip adhesive 354, metal pillar 356, thermal adhesive 360, encapsulant 362, connection joint 372, insulative base 376 and solder terminal 378.

Figure 28A:
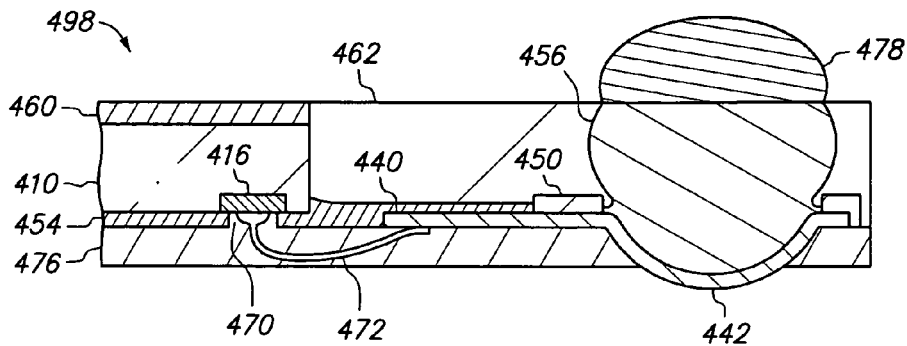
FIGS. 28A, 28B and 28C are cross-sectional, top and bottom views, respectively, of a semiconductor chip assembly in accordance with a fourth embodiment of the present invention.
Figure 28B:
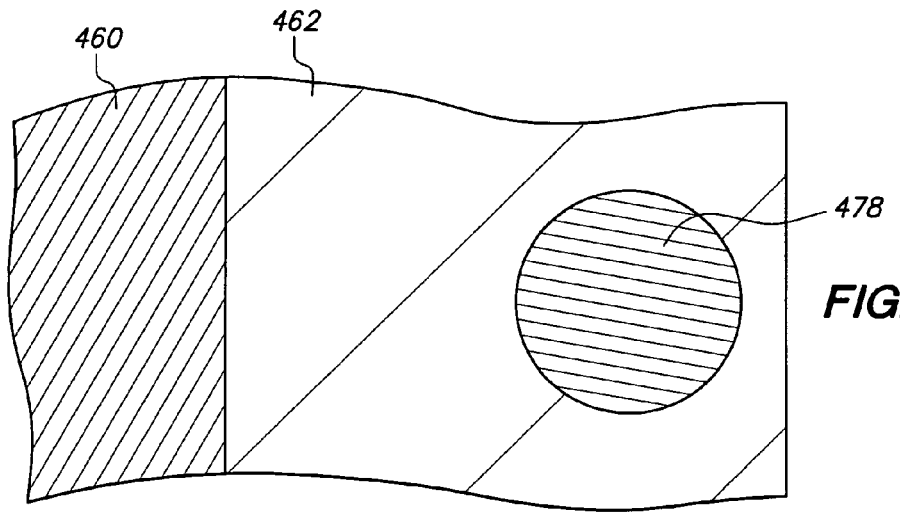
Figure 28C:
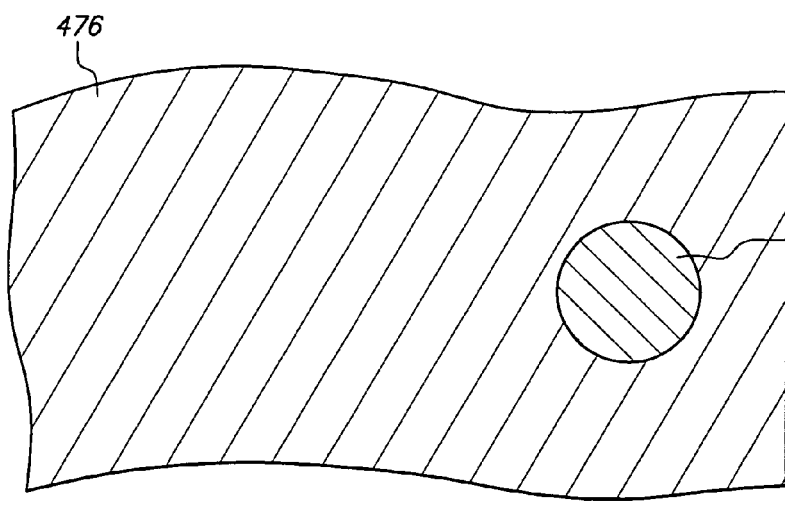

FIGS. 28A, 28B and 28C are cross-sectional, top and bottom views, respectively, of a semiconductor chip assembly in accordance with a fourth embodiment of the present invention. In the fourth embodiment, the connection joint is a wire bond. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, chip 410 corresponds to chip 110, routing line 440 corresponds to routing line 140, etc.

Routing line 440 extends laterally beyond metal pillar 456 a significantly smaller distance than routing line 140 extends laterally beyond metal pillar 156. Furthermore, routing line 440 includes an elongated routing portion (corresponding to elongated routing portion 146) that is 100 microns wide and thus 50 microns wider than elongated routing portion 146. Routing line 440 includes an additional gold layer electroplated on the metal base (corresponding to metal base 120) before the first nickel layer is electroplated. Thus, routing line 440 is composed of gold-nickel-copper-nickel-gold (rather than nickel-copper-nickel-gold).

The metal base (corresponding to metal base 120) has a thickness of 300 microns and thus is 100 microns thicker than metal base 120, bumped terminal 442 has a thickness of 200 microns and thus is 100 microns thicker than bumped terminal 142, metal pillar 456 has an initial diameter of 550 microns and thus is 50 microns wider than metal pillar 156, and insulative base 476 has a thickness of 150 microns and thus is 100 microns thicker than insulative base 176.

Chip 410 is positioned such that routing line 440 is disposed outside the periphery of chip 410.

The slot (corresponding to slot 132), opening (corresponding to opening 168) and insulative plug (corresponding to insulative plug 174) are omitted. Likewise, the metal base (corresponding to metal base 120) is etched once (rather than twice) and removed after encapsulant 462 is formed.

Connection joint 472 is a wire bond composed of gold that is ball bonded to pad 416 and then wedge bonded to routing line 440 near the distal end of routing line 440 opposite metal pillar 456. Thus, connection joint 472 is electrically connected to pad 416 in through-hole 470 and to routing line 440 outside through-hole 470. Connection joint 472 extends downwardly beyond chip 410 by 100 microns.

Semiconductor chip assembly 498 includes chip 410, routing line 440, solder mask 450, chip adhesive 454, metal pillar 456, thermal adhesive 460, encapsulant 462, connection joint 472, insulative base 476 and solder terminal 478.

Figure 29A:
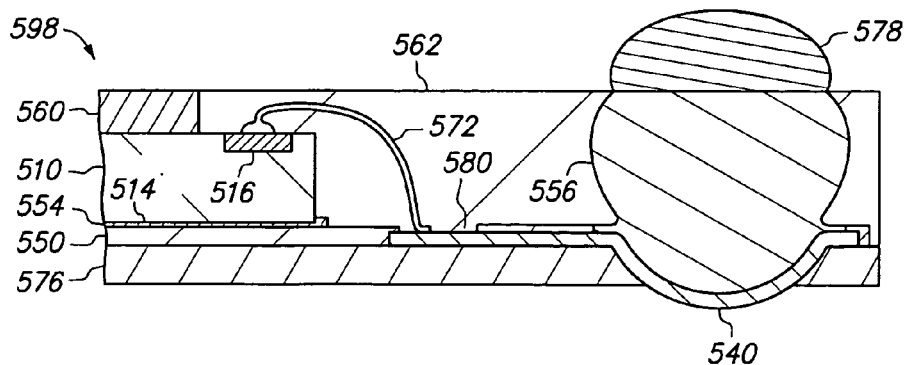
FIGS. 29A, 29B and 29C are cross-sectional, top and bottom views, respectively, of a semiconductor chip assembly in accordance with a fifth embodiment of the present invention.
Figure 29B:
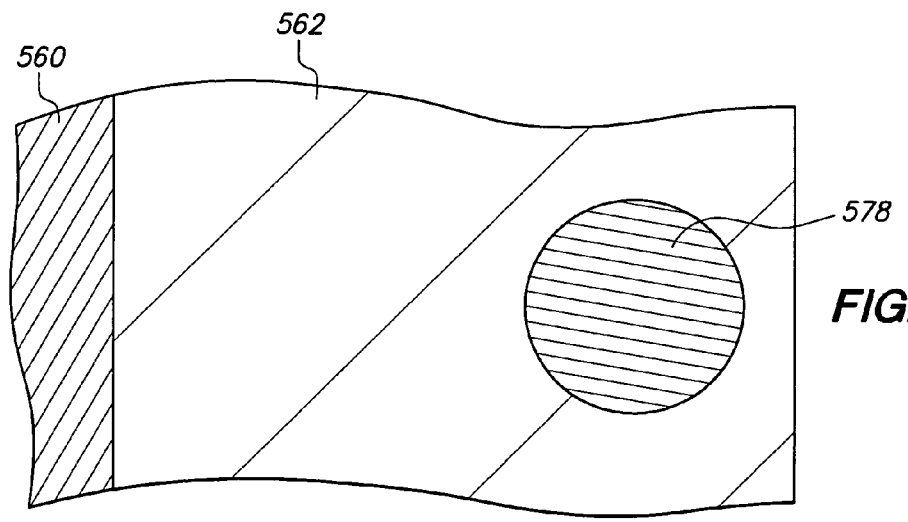
Figure 29C:
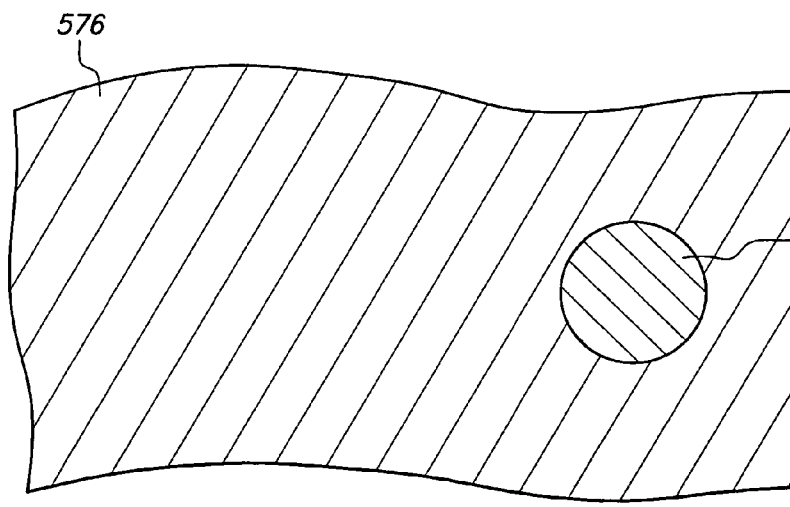

FIGS. 29A, 29B and 29C are cross-sectional, top and bottom views, respectively, of a semiconductor chip assembly in accordance with a fifth embodiment of the present invention. In the fifth embodiment, the chip is non-inverted. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, chip 510 corresponds to chip 110, routing line 540 corresponds to routing line 140, etc., Routing line 540 extends laterally beyond metal pillar 556 a significantly smaller distance than routing line 140 extends laterally beyond metal pillar 156. Furthermore, routing line 540 includes an elongated routing portion (corresponding to elongated routing portion 146) that is 100 microns wide and thus 50 microns wider than elongated routing portion 146.

Solder mask 550 extends laterally beyond routing line 540 in the direction away from metal pillar 556, extends 2 microns (rather than 30 microns) upwardly beyond routing line 540, and includes opening 580 that selectively exposes a portion of routing line 540 near the distal end of routing line 540 opposite metal pillar 556.

Chip adhesive 554 is deposited on solder mask 550 and does not contact or overlap routing line 540. Thus, chip adhesive 554 has a significantly smaller surface area than chip adhesive 154 but a slightly larger surface area than chip 510.

Chip 510 is positioned such that surface 512 faces upwardly, surface 514 faces downwardly and routing line 540 is disposed outside the periphery of chip 510.

Connection joint 572 is a wire bond composed of gold that is ball bonded to pad 516 and then wedge bonded to routing line 540 near the distal end of routing line 540 opposite metal pillar 556. Thus, connection joint 572 is electrically connected to pad 516 outside opening 580 and to routing line 540 in opening 580. Connection joint 572 extends upwardly beyond chip 510 by 100 microns.

Thereafter, metal pillar 556, thermal adhesive 560 and encapsulant 562 are formed. Thus, metal pillar 556, thermal adhesive 560 and encapsulant 562 are formed after connection joint 572. Thermal adhesive 560 is formed with a thickness of 200 microns (rather than 100 microns), overlaps but does not cover chip 510 and is spaced from connection joint 572, and encapsulant 562 contacts and extends upwardly beyond connection joint 572. Furthermore, the grinding removes a 100 micron thick upper portion of metal pillar 556, a 50 micron thick upper portion of thermal adhesive 560 and a 200 micron thick upper portion of encapsulant 562. Thus, the grinding does not reach, damage or expose connection joint 572.

The slot (corresponding to slot 132), opening (corresponding to opening 168), through-hole (corresponding to through-hole 170) and insulative plug (corresponding to insulative plug 174) are omitted. Likewise, the metal base (corresponding to metal base 120) is etched once (rather than twice) and removed after encapsulant 562 is formed.

Semiconductor chip assembly 598 includes chip 510, routing line 540, solder mask 550, chip adhesive 554, metal pillar 556, thermal adhesive 560, encapsulant 562, connection joint 572, insulative base 576 and solder terminal 578.

Figure 30A:
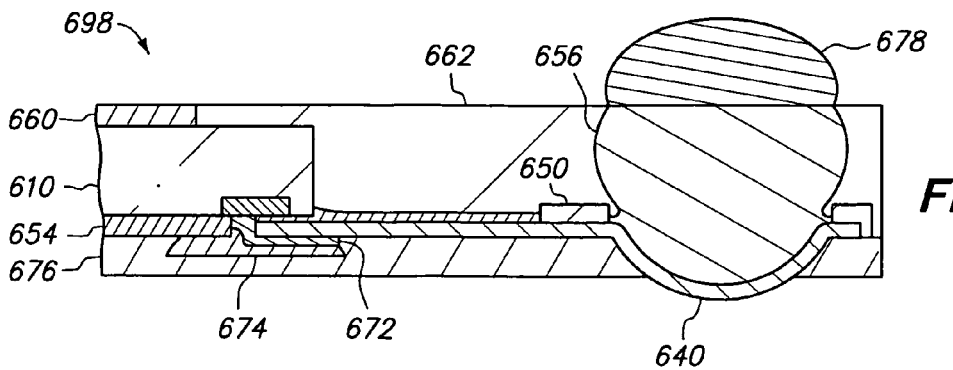
FIGS. 30A, 30B and 30C are cross-sectional, top and bottom views, respectively, of a semiconductor chip assembly in accordance with a sixth embodiment of the present invention.
Figure 30B:
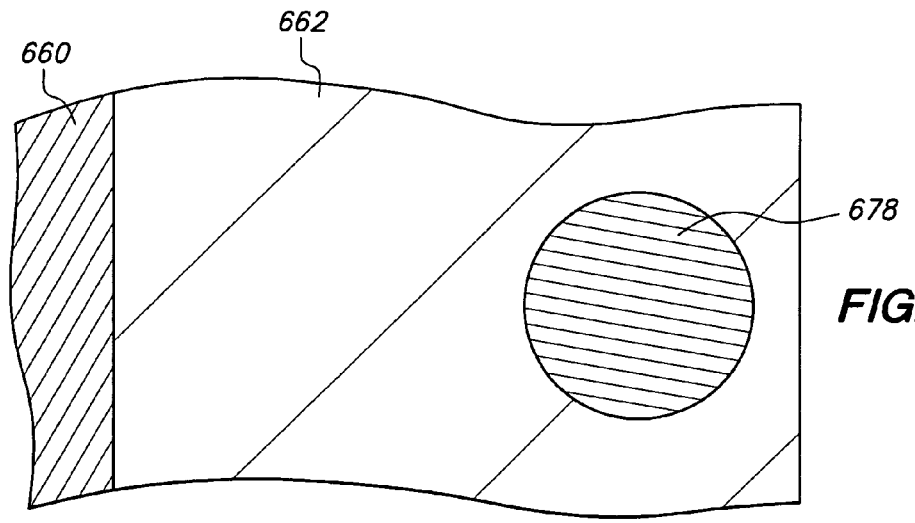
Figure 30C:
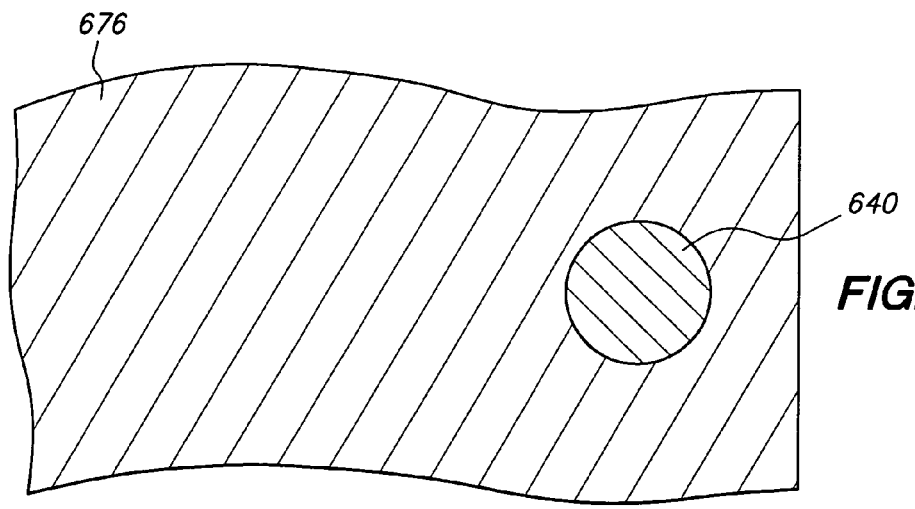

FIGS. 30A, 30B and 30C are cross-sectional, top and bottom views, respectively, of a semiconductor chip assembly in accordance with a sixth embodiment of the present invention. In the sixth embodiment, the thermal adhesive does not cover the chip. For purposes of brevity, any description in the first embodiment is incorporated herein insofar as the same is applicable, and the same description need not be repeated. Likewise, elements of the sixth embodiment similar to those in the first embodiment have corresponding reference numerals indexed at six-hundred rather than one-hundred. For instance, chip 610 corresponds to chip 110, routing line 640 corresponds to routing line 140, etc.

Thermal adhesive 660 overlaps chip 610 in the upward direction but is disposed within the periphery of chip 610 and does not extend to the outer edges of chip 610 or cover chip 610 in the upward direction.

Semiconductor chip assembly 698 includes chip 610, routing line 640, solder mask 650, chip adhesive 654, metal pillar 656, thermal adhesive 660, encapsulant 662, connection joint 672, insulative plug 674, insulative base 676 and solder terminal 678.

Figure 31A:
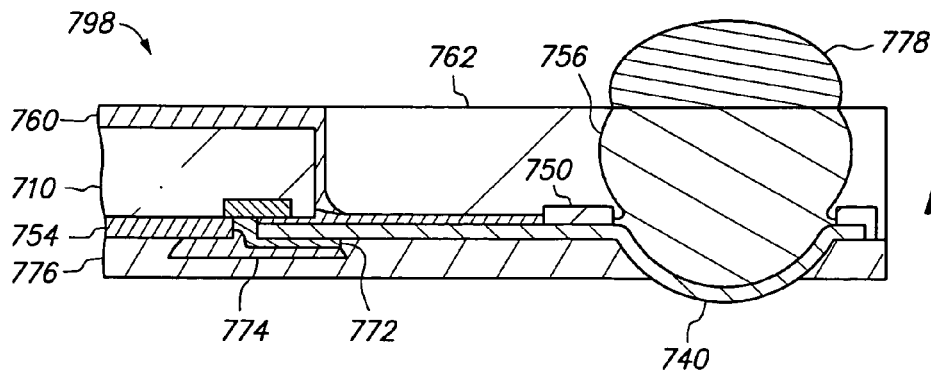
FIGS. 31A, 31B and 31C are cross-sectional, top and bottom views, respectively, of a semiconductor chip assembly in accordance with a seventh embodiment of the present invention.
Figure 31B:
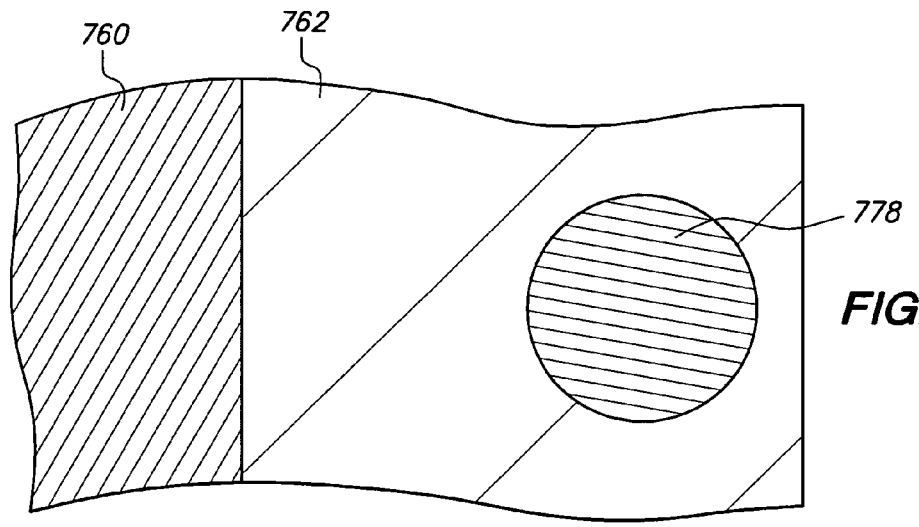
Figure 31C:
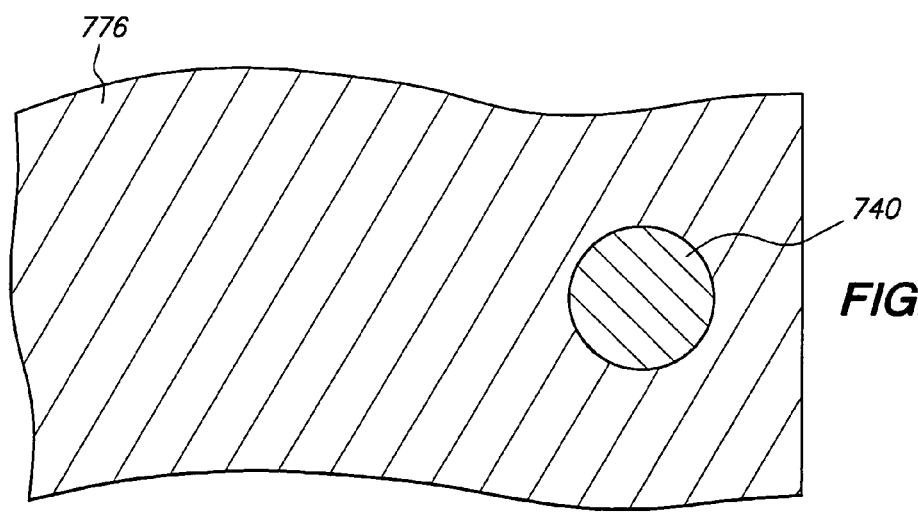

FIGS. 31A, 31B and 31C are cross-sectional, top and bottom views, respectively, of a semiconductor chip assembly in accordance with a seventh embodiment of the present invention. In the seventh embodiment, the thermal adhesive provides a glob-top coating for the chip. For purposes of brevity, any description in the first embodiment is incorporated herein insofar as the same is applicable, and the same description need not be repeated. Likewise, elements of the seventh embodiment similar to those in the first embodiment have corresponding reference numerals indexed at seven-hundred rather than one-hundred. For instance, chip 710 corresponds to chip 110, routing line 740 corresponds to routing line 140, etc.

Thermal adhesive 760 contacts the outer edges of chip 710 and contacts chip adhesive 754 but is spaced from solder mask 750 and metal pillar 756. Thus, chip adhesive 754 and thermal adhesive 760 cover the outer edges of chip 710, and encapsulant 762 is spaced from chip 710.

Semiconductor chip assembly 798 includes chip 710, routing line 740, solder mask 750, chip adhesive 754, metal pillar 756, thermal adhesive 760, encapsulant 762, connection joint 772, insulative plug 774, insulative base 776 and solder terminal 778.

Figure 32A:
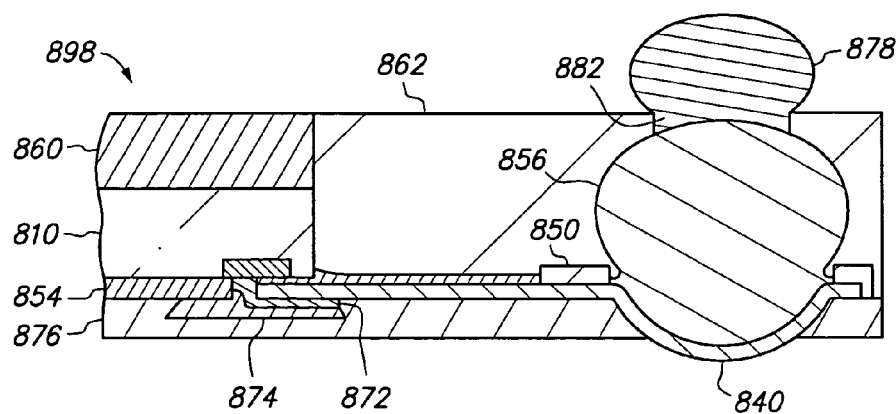
FIGS. 32A, 32B and 32C are cross-sectional, top and bottom views, respectively, of a semiconductor chip assembly in accordance with an eighth embodiment of the present invention.
Figure 32B:
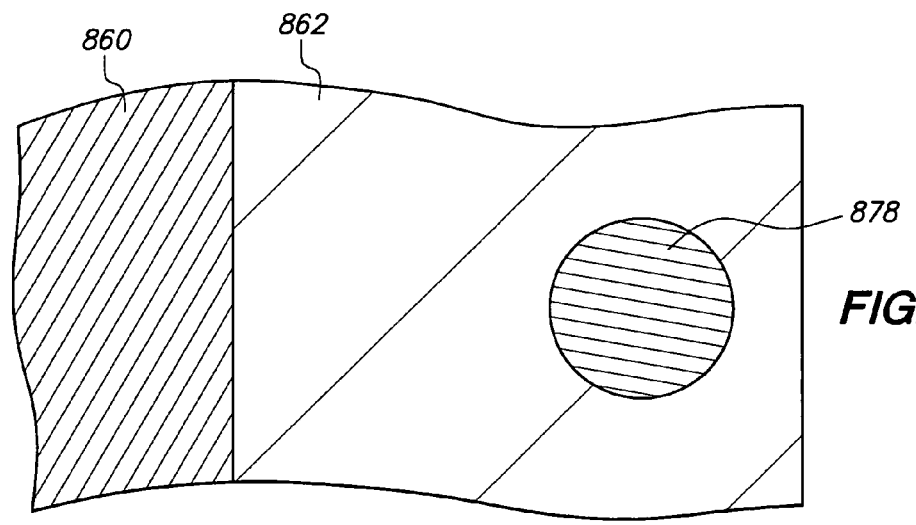
Figure 32C:
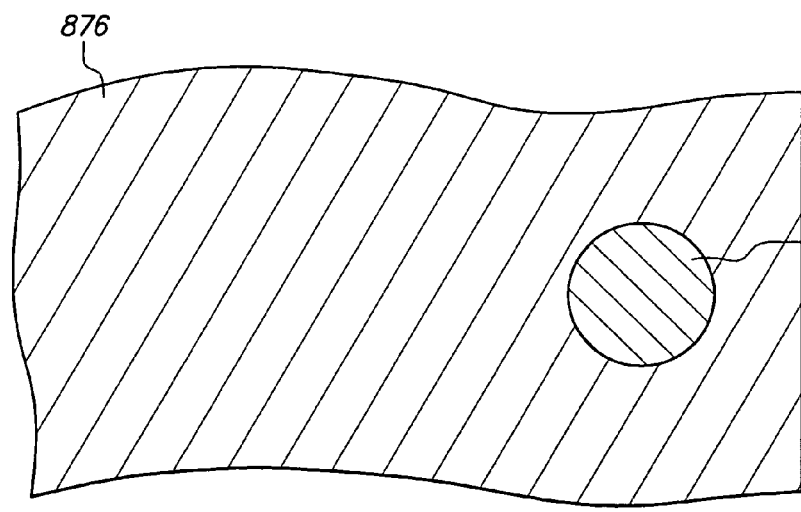

FIGS. 32A, 32B and 32C are cross-sectional, top and bottom views, respectively, of a semiconductor chip assembly in accordance with an eighth embodiment of the present invention. In the eighth embodiment, the encapsulant is selectively etched to expose the metal pillar. For purposes of brevity, any description in the first embodiment is incorporated herein insofar as the same is applicable, and the same description need not be repeated. Likewise, elements of the eighth embodiment similar to those in the first embodiment have corresponding reference numerals indexed at eight-hundred rather than one-hundred. For instance, chip 810 corresponds to chip 110, routing line 840 corresponds to routing line 140, etc.

Thermal adhesive 860 is formed with a thickness of 300 microns (rather than 100 microns) and extends upwardly beyond metal pillar 856 by 50 microns.

Encapsulant 862 is initially an epoxy in paste form that includes an epoxy resin, a curing agent and an accelerator. The epoxy paste is deposited over the structure using stencil printing, and then the epoxy paste is cured or hardened at a relatively low temperature in the range of 100 to 250° C. to form a solid adherent insulator. Encapsulant 862 is more susceptible to laser ablation than encapsulant 162 since encapsulant 862 is composed of epoxy without a filler whereas encapsulant 162 is composed of molding compound with a filler.

The grinding removes a 20 micron thick upper portion of thermal adhesive 860 and a 70 micron thick upper portion of encapsulant 862. Thus, the grinding does not reach, damage or expose metal pillar 856.

Thereafter, a portion of encapsulant 862 is selectively removed to form opening 882 that exposes metal pillar 856.

Opening 882 is formed by applying a suitable etch that is highly selective of encapsulant 862 with respect to metal pillar 856. In this instance, a selective TEA $CO_2$ laser etch is applied using multiple laser direct writes. The laser is directed at metal pillar 856. The laser has a spot size of 150 microns. Furthermore, the laser direct writes are offset relative to one another yet overlap so that the laser scans a central portion of metal pillar 856 with a diameter of 200 microns. In this manner, the laser direct writes in combination are vertically aligned with and centered relative to metal pillar 856. As a result, the laser strikes metal pillar 856, a portion of encapsulant 862 that covers metal pillar 856, and ablates encapsulant 862.

The laser drills through and removes a portion of encapsulant 862. However, a portion of encapsulant 862 that extends across the periphery of metal pillar 856 is outside the scope of the laser and remains intact. Thus, encapsulant 862 continues to contact but no longer covers metal pillar 856.

Thereafter, a brief cleaning step can be applied to remove oxides and debris that may be present on the exposed portion of metal pillar 856. For instance, a brief oxygen plasma cleaning step can be applied to the structure. Alternatively, a brief wet chemical cleaning step using a solution containing potassium permanganate can be applied to the structure. In either case, the cleaning step cleans the exposed portion of metal pillar 856 without damaging the structure.

Opening 882 is formed in and extends vertically into but not through encapsulant 862, is disposed outside the periphery of chip 810, is vertically aligned with and exposes metal pillar 856, is spaced from routing line 840, solder mask 850, chip adhesive 854 and thermal adhesive 860 and has a diameter of 200 microns. Opening 882 is formed without damaging or extending into metal pillar 856.

Opening 882 may have a diameter that is slightly larger than 200 microns due to the beam angle of the laser, the thermal effects of the laser, and/or the isotropic nature of an oxygen plasma or wet chemical cleaning step. For convenience of explanation, this slight enlargement is ignored.

Thereafter, solder terminal 878 is formed on metal pillar 856. Solder terminal 878 extends within and outside opening 882 and extends upwardly beyond metal pillar 856 and encapsulant 862.

Semiconductor chip assembly 898 includes chip 810, routing line 840, solder mask 850, chip adhesive 854, metal pillar 856, thermal adhesive 860, encapsulant 862, connection joint 872, insulative plug 874, insulative base 876 and solder terminal 878.

Figure 33A:
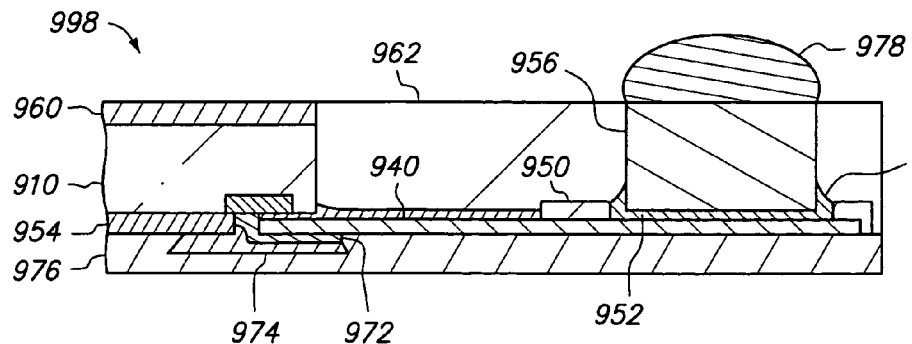
FIGS. 33A, 33B and 33C are cross-sectional, top and bottom views, respectively, of a semiconductor chip assembly in accordance with a ninth embodiment of the present invention.
Figure 33B:
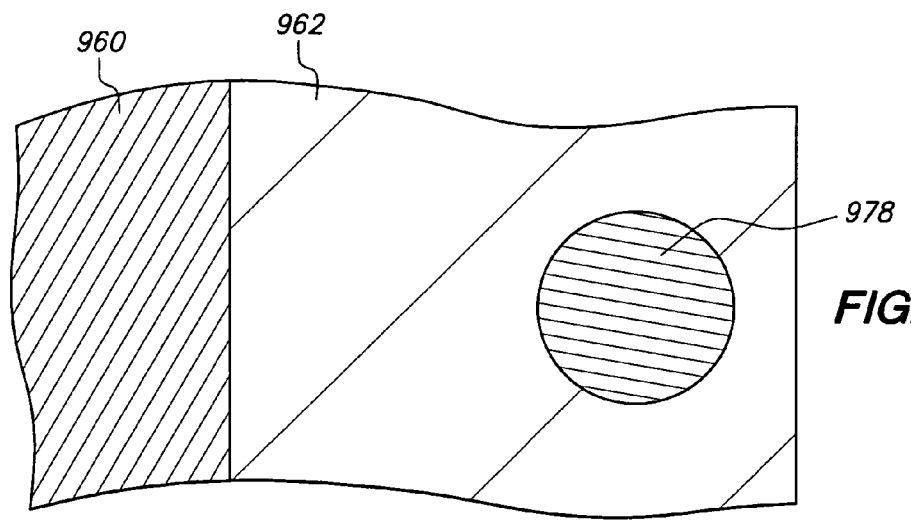
Figure 33C:
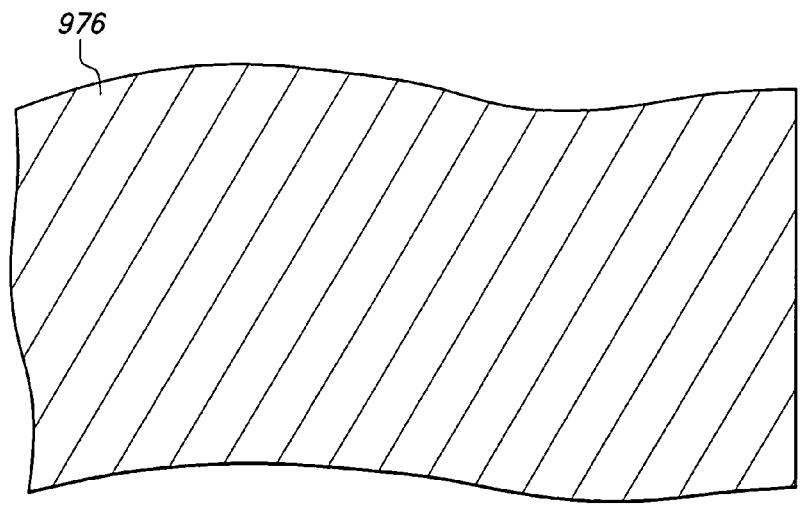

FIGS. 33A, 33B and 33C are cross-sectional, top and bottom views, respectively, of a semiconductor chip assembly in accordance with a ninth embodiment of the present invention. In the ninth embodiment, the metal pillar is a wire segment. For purposes of brevity, any description in the first embodiment is incorporated herein insofar as the same is applicable, and the same description need not be repeated. Likewise, elements of the ninth embodiment similar to those in the first embodiment have corresponding reference numerals indexed at nine-hundred rather than one-hundred. For instance, chip 910 corresponds to chip 110, routing line 940 corresponds to routing line 140, etc.

Routing line 940 is formed without a bumped terminal (corresponding to bumped terminal 142). Instead, routing line 940 includes an enlarged circular portion (similar to enlarged annular portion 144 except that it is circular rather than annular) with a diameter of 600 microns (rather than 500 microns). Routing line 940 is manufactured without a bumped terminal by a slight adjustment to the manufacturing process. The photoresist layer (corresponding to photoresist layer 126) is patterned to cover rather than selectively expose the top surface (corresponding to surface 122) of the metal base (corresponding to metal base 120). As a result, the recess (corresponding to recess 130) is omitted, and therefore routing line 940 does not extend into the metal base (corresponding to metal base 120) and includes an enlarged circular portion that is flat and planar rather than a bumped terminal (corresponding to bumped terminal 142). Likewise, since routing line 940 excludes a bumped terminal, routing line 940 does not include a cavity (corresponding to cavity 148).

Solder mask 950 contains opening 952 with a diameter of 550 microns (rather than 400 microns) that is vertically aligned with and exposes the enlarged circular portion of routing line 940.

Metal pillar 956 is initially a copper wire segment that is sliced from a spool of copper wire. Metal pillar 956 initially has a cylindrical shape with a height of 800 microns and a diameter of 500 microns.

Conductive bond 984 is initially solder paste that is deposited on routing line 940 and into opening 952.

Thereafter, a stencil (not shown) that is 100 microns thick and includes a drilled hole with a diameter of 550 microns is positioned over solder mask 950 such that the drilled hole is vertically aligned with opening 952, then metal pillar 956 is placed on the side of the stencil that faces away from solder mask 950, then the stencil is vibrated so that metal pillar 956 (without a flux surface coating) falls into and extends through the drilled hole, extends into opening 952 and is deposited on conductive bond 984 (still solder paste). Metal pillar 956 weakly adheres to routing line 940 due to the solder paste.

Thereafter, heat is applied to reflow conductive bond 984, and then the heat is removed and conductive bond 984 cools and solidifies into a hardened solder bond that contacts and mechanically attaches and electrically connects routing line 940 and metal pillar 956. Metal pillar 956 is deposited on routing line 940 in essentially the same manner that metal pillar 156 is deposited on routing line 140. However, since routing line 940 lacks a cavity, routing line 940 is disposed downwardly beyond metal pillar 956.

Thereafter, encapsulant 962 is formed with a thickness of 1000 microns (rather than 500 microns) so that encapsulant 962 covers metal pillar 956 (with a height of 800 microns).

Thereafter, insulative base 976 is formed with a thickness of 50 microns (rather than 150 microns), and the lower portion of insulative base 976 is not removed. Therefore, routing line 940 does not extend through or downwardly beyond insulative base 976 and is not exposed in the downward direction. Instead, insulative base 976 extends downwardly beyond and covers routing line 940.

Thereafter, metal pillar 956, thermal adhesive 960 and encapsulant 962 are grinded, and then solder terminal 978 is formed.

Semiconductor chip assembly 998 includes chip 910, routing line 940, solder mask 950, chip adhesive 954, metal pillar 956, thermal adhesive 960, encapsulant 962, connection joint 972, insulative plug 974, insulative base 976, solder terminal 978 and conductive bond 984.

Figure 34A:
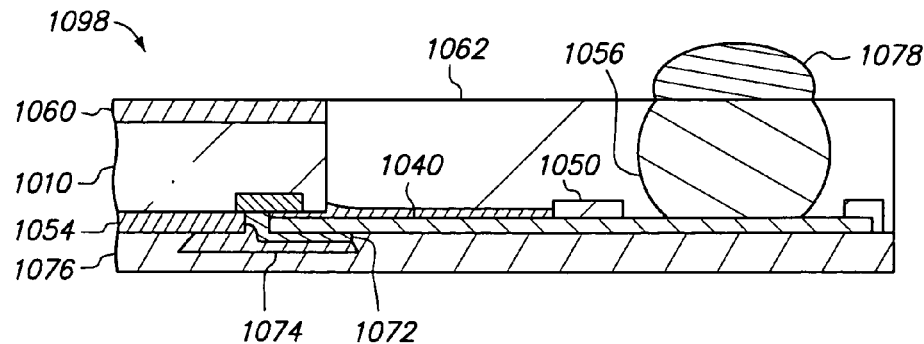
FIGS. 34A, 34B and 34C are cross-sectional, top and bottom views, respectively, of a semiconductor chip assembly in accordance with a tenth embodiment of the present invention.
Figure 34B:
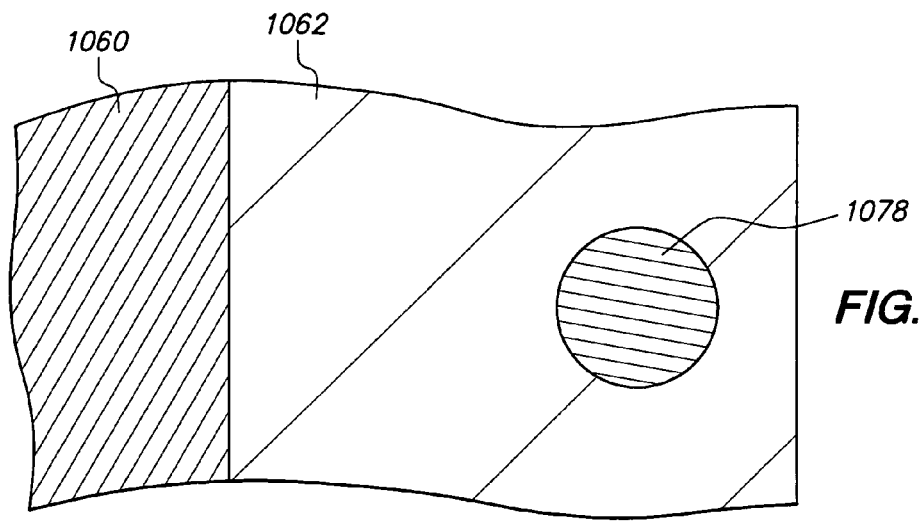
Figure 34C:
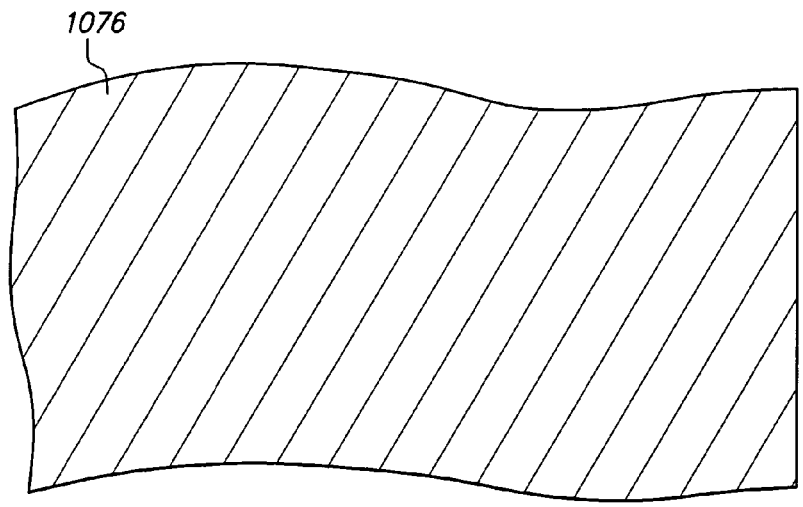

FIGS. 34A, 34B and 34C are cross-sectional, top and bottom views, respectively, of a semiconductor chip assembly in accordance with a tenth embodiment of the present invention. In the tenth embodiment, the metal pillar is a ball bond. For purposes of brevity, any description in the first embodiment is incorporated herein insofar as the same is applicable, and the same description need not be repeated. Likewise, elements of the tenth embodiment similar to those in the first embodiment have corresponding reference numerals indexed at one-thousand rather than one-hundred. For instance, chip 1010 corresponds to chip 110, routing line 1040 corresponds to routing line 140, etc.

Routing line 1040 is formed without a bumped terminal in the same manner as routing line 940, except that routing line 1040 includes an enlarged circular portion with a diameter of 500 microns (rather than 600 microns).

Metal pillar 1056 is initially a gold stud bump that is metallurgically welded to routing line 1040 by thermosonic bonding. A wire ball is formed at the end of a gold wire fed from a spool by applying thermal energy, such as electronic flame-off or a hydrogen gas flame jet. The wire ball protrudes from a capillary and is positioned above and spaced from the enlarged circular portion of routing line 1040. The capillary moves downward and the wire ball contacts routing line 1040 without contacting solder mask 1050. In addition, the capillary is heated to about 150 to 200° C. and provides horizontal ultrasonic oscillatory motions with a frequency of about 60 to 120 kHz. The combination of heat from the capillary and the recent flaming operation place the wire ball in a soft state which is easy to deform. The capillary moves further downward towards routing line 1040 and exerts a downward force of about 25 to 45 grams while continuing to oscillate ultrasonically, and the wire ball deforms into a ball bond that is welded to routing line 1040. The capillary then moves upward and away from routing line 1040 without exerting upward pressure on the ball bond, which begins to cool and solidify. The capillary then moves upward to fracture the wire just over and proximate to the ball bond, thereby detaching the wire from the ball bond such that metal pillar 1056 is a stud bump composed of the ball bond and an extremely short, inconsequential stump that extends upwardly from the ball bond.

Thereafter insulative base 1076 is formed in the same manner as insulative base 976, and the lower portion of insulative base 1076 is not removed.

Thereafter, metal pillar 1056, thermal adhesive 1060 and encapsulant 1062 are grinded, thereby removing the stump such that metal pillar 1056 is just the ball bond, and then solder terminal 1078 is formed.

Semiconductor chip assembly 1098 includes chip 1010, routing line 1040, solder mask 1050, chip adhesive 1054, metal pillar 1056, thermal adhesive 1060, encapsulant 1062, connection joint 1072, insulative plug 1074, insulative base 1076 and solder terminal 1078.

Figure 35A:
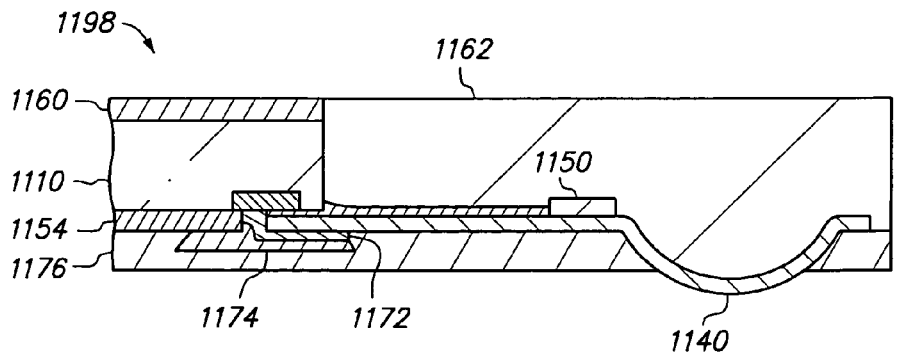
FIGS. 35A, 35B and 35C are cross-sectional, top and bottom views, respectively, of a semiconductor chip assembly in accordance with an eleventh embodiment of the present invention.
Figure 35B:
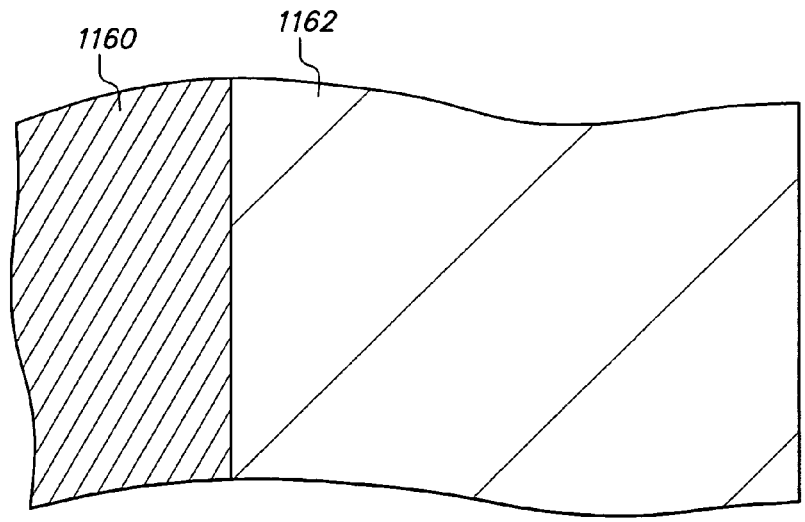
Figure 35C:
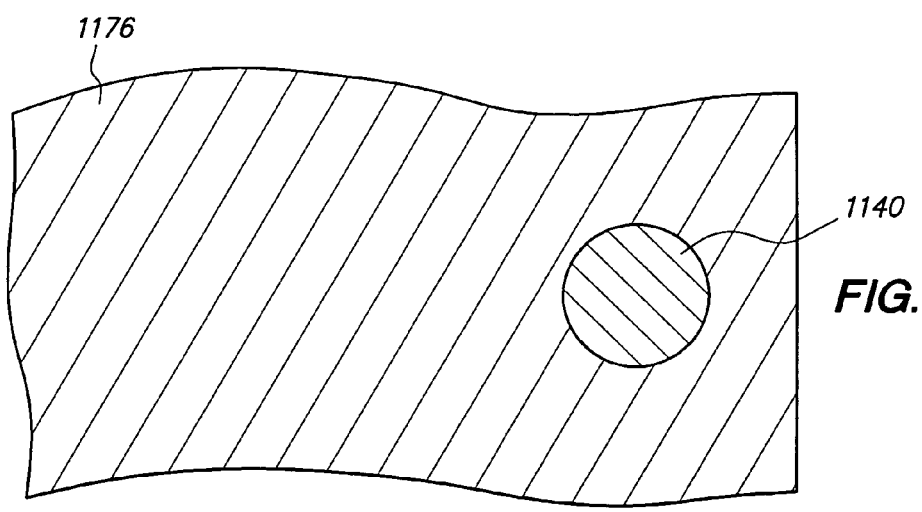

FIGS. 35A, 35B and 35C are cross-sectional, top and bottom views, respectively, of a semiconductor chip assembly in accordance with an eleventh embodiment of the present invention. In the eleventh embodiment, the metal pillar and the solder terminal are omitted. For purposes of brevity, any description in the first embodiment is incorporated herein insofar as the same is applicable, and the same description need not be repeated. Likewise, elements of the eleventh embodiment similar to those in the first embodiment have corresponding reference numerals indexed at eleven-hundred rather than one-hundred. For instance, chip 1110 corresponds to chip 110, routing line 1140 corresponds to routing line 140, etc.

The opening in solder mask 1150 (corresponding to opening 152), metal pillar (corresponding to metal pillar 156) and solder terminal (corresponding to solder terminal 178) are omitted.

Semiconductor chip assembly 1198 includes chip 1110, routing line 1140, solder mask 1150, chip adhesive 1154, thermal adhesive 1160, encapsulant 1162, connection joint 1172, insulative plug 1174 and insulative base 1176.

Figure 36A:
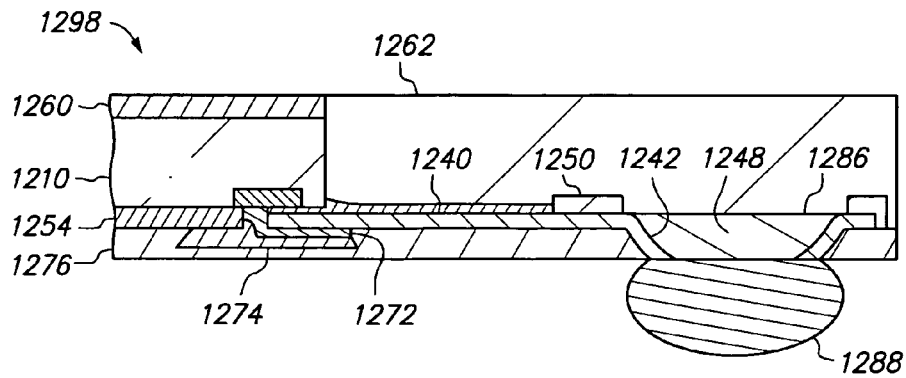
FIGS. 36A, 36B and 36C are cross-sectional, top and bottom views, respectively, of a semiconductor chip assembly in accordance with a twelfth embodiment of the present invention.
Figure 36B:
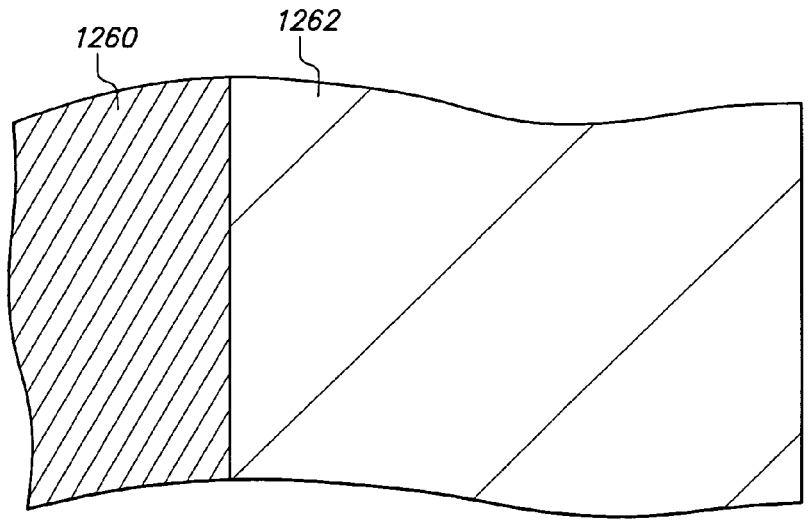
Figure 36C:
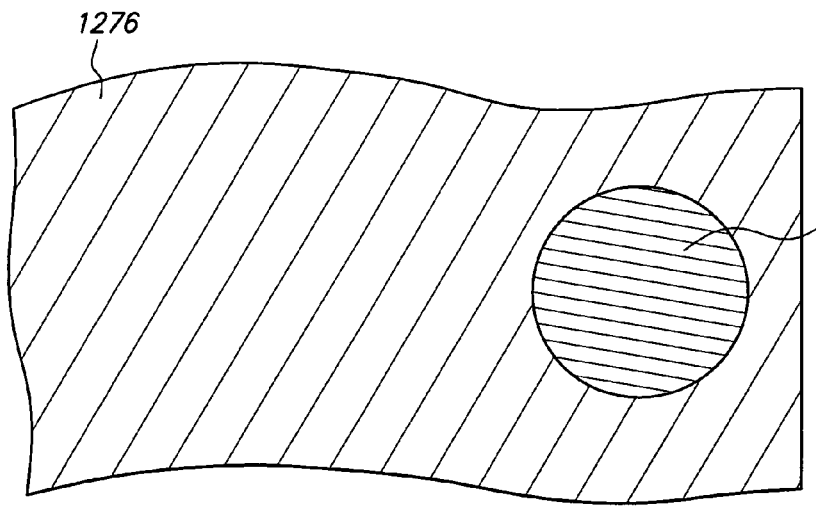

FIGS. 36A, 36B and 36C are cross-sectional, top and bottom views, respectively, of a semiconductor chip assembly in accordance with a twelfth embodiment of the present invention. In the twelfth embodiment, the conductive trace includes a metal filler instead of the metal pillar. For purposes of brevity, any description in the first embodiment is incorporated herein insofar as the same is applicable, and the same description need not be repeated. Likewise, elements of the twelfth embodiment similar to those in the first embodiment have corresponding reference numerals indexed at twelve-hundred rather than one-hundred. For instance, chip 1210 corresponds to chip 110, routing line 1240 corresponds to routing line 140, etc.

Metal filler 1286 is formed in the same manner as metal pillar 156, except that metal filler 1286 is initially a solder ball with a diameter of 200 microns (rather than 500 microns) with a thin flux surface coating. Metal filler 1286 is deposited on bumped terminal 1242 and extends into cavity 1248, then heat is applied to reflow metal filler 1286, and then the heat is removed and metal filler 1286 cools and solidifies into a hardened solder particle with a substantially hemispherical shape that contacts and is mechanically attached to and electrically connected to routing line 1240. Metal filler 1286 fills recess 1248 but is disposed within recess 1248 and does not extend upwardly beyond routing line 1240.

Thereafter, instead of removing the lower portion of insulative base 1276 by plasma etching, the lower portion of insulative base 1276 is removed by grinding. In particular, a rotating diamond sand wheel and distilled water are applied to insulative base 1276. Initially, the diamond sand wheel grinds only insulative base 1276. As the grinding continues, insulative base 1276 becomes thinner as its grinded surface migrates upwardly. Eventually the diamond sand wheel contacts bumped terminal 1242, and as a result, begins to grind bumped terminal 1242 as well. As the grinding continues, bumped terminal 1242 and insulative base 1276 become thinner as their grinded surfaces migrate upwardly. Eventually the diamond sand wheel contacts metal filler 1286, and as a result, begins to grind metal filler 1286 as well. As the grinding continues, bumped terminal 1242, insulative base 1276 and metal filler 1286 become thinner as their grinded surfaces migrate upwardly. The grinding continues until bumped terminal 1242, insulative base 1276 and metal filler 1286 have the desired thickness, and then halts before it reaches chip 1210, solder mask 1250, chip adhesive 1254, thermal adhesive 1260, encapsulant 1262, connection joint 1272 or insulative plug 1274. Thereafter, the structure is rinsed in distilled water to remove contaminants.

The grinding removes a 100 micron thick lower portion of insulative base 1276, a 50 micron thick lower portion of bumped terminal 1242 and a 25 micron thick lower portion of metal filler 1286. Bumped terminal 1242, insulative base 1276 and metal filler 1286 are laterally aligned with one another and exposed. Thus, an exposed planarized horizontal surface that faces downwardly includes bumped terminal 1242, insulative base 1276 and metal filler 1286.

Thereafter, solder terminal 1288 is formed on bumped terminal 1242 and metal filler 1286 in the same manner that solder terminal 178 is formed on metal pillar 156.

The metal pillar (corresponding to metal pillar 156) and solder terminal (corresponding to solder terminal 178) are omitted.

Semiconductor chip assembly 1298 includes chip 1210, routing line 1240, solder mask 1250, chip adhesive 1254, thermal adhesive 1260, encapsulant 1262, connection joint 1272, insulative plug 1274, insulative base 1276, metal filler 1286 and solder terminal 1288.

Figure 37A:
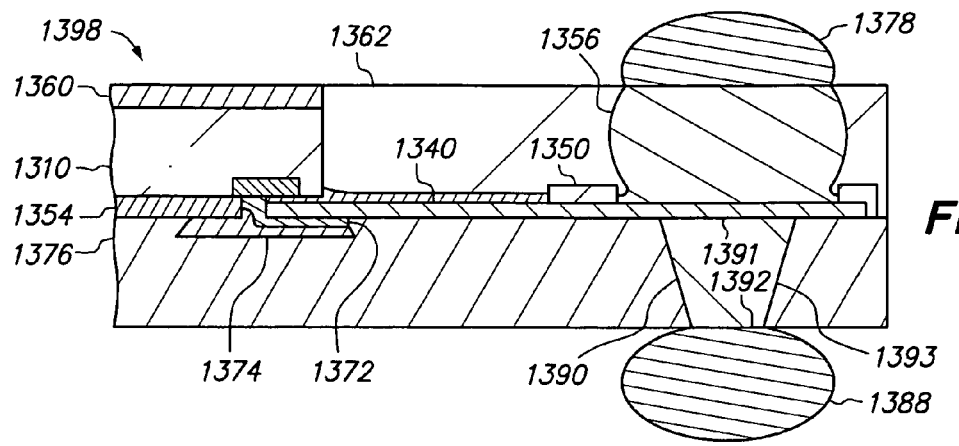
FIGS. 37A, 37B and 37C are cross-sectional, top and bottom views, respectively, of a semiconductor chip assembly in accordance with a thirteenth embodiment of the present invention.
Figure 37B:
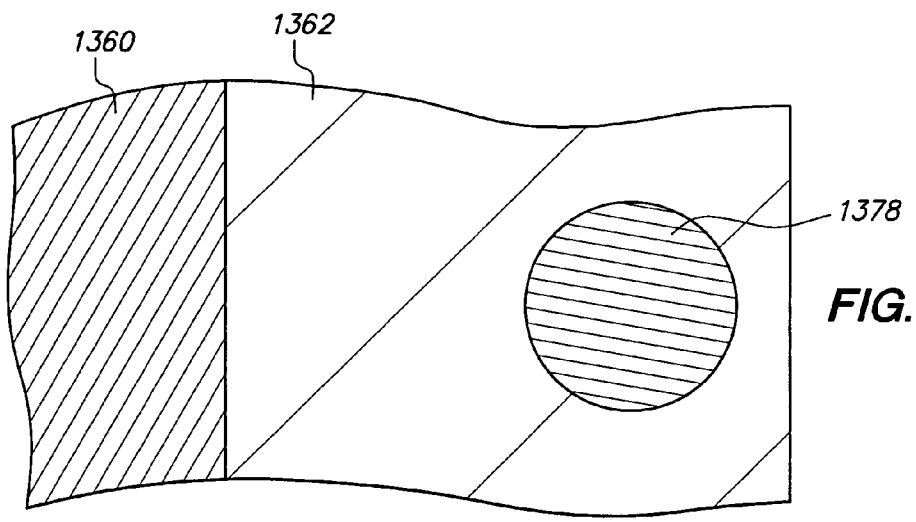
Figure 37C:
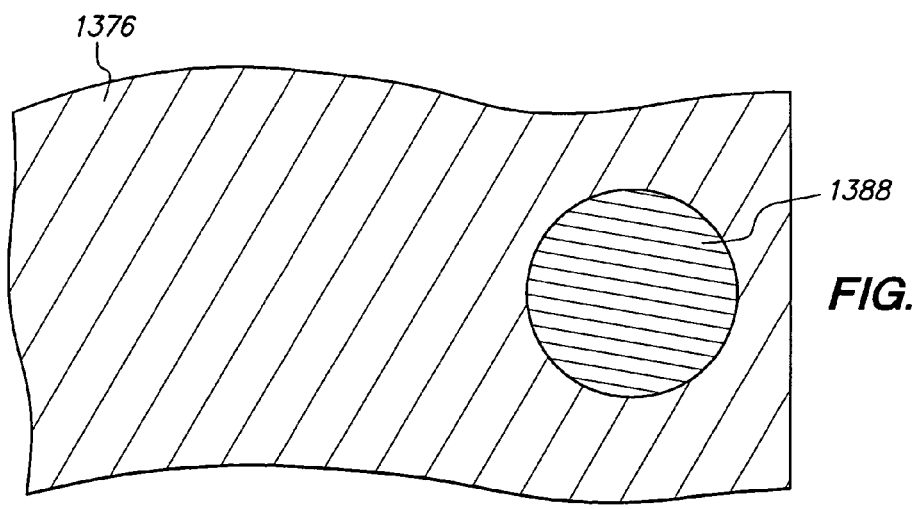

FIGS. 37A, 37B and 37C are cross-sectional, top and bottom views, respectively, of a semiconductor chip assembly in accordance with a thirteenth embodiment of the present invention. In the thirteenth embodiment, the conductive trace includes a tapered pillar. For purposes of brevity, any description in the first embodiment is incorporated herein insofar as the same is applicable, and the same description need not be repeated. Likewise, elements of the thirteenth embodiment similar to those in the first embodiment have corresponding reference numerals indexed at thirteen-hundred rather than one-hundred. For instance, chip 1310 corresponds to chip 110, routing line 1340 corresponds to routing line 140, etc.

Routing line 1340 is formed without a bumped terminal (corresponding to bumped terminal 142) on the top surface (corresponding to surface 122) of the metal base (corresponding to metal base 120) and an etch mask (not shown) is formed on the bottom surface (corresponding to surface 124) of the metal base (corresponding to metal base 120) during an electroplating operation. As a result, routing line 1340 includes an enlarged circular portion (similar to enlarged annular portion 144 except that it is circular rather than annular), and the etch mask is vertically aligned with and centered relative to the enlarged circular portion and has a diameter of 300 microns.

Routing line 1340 and the etch mask are manufactured by a slight adjustment to the manufacturing process. The photoresist layers (corresponding to photoresist layers 126 and 128) and related metal base etch steps are omitted. As a result, the recess (corresponding to recess 130) and slot (corresponding to slot 132) are omitted. In addition, the photoresist layer (corresponding to photoresist layer 138) is patterned to selectively expose rather than cover the bottom surface (corresponding to surface 124) of the metal base (corresponding to metal base 120), and the electroplating operation simultaneously forms routing line 1340 on the top surface (corresponding to surface 122) of the metal base (corresponding to metal base 120) and the etch mask on the bottom surface (corresponding to surface 124) of the metal base (corresponding to metal base 120).

Tapered pillar 1390 is formed by applying a wet chemical etch to the metal base using the etch mask to selectively protect the metal base after insulative plug 1374 is formed. Thus, tapered pillar 1390 is an unetched portion of the metal base defined by the etch mask that is formed subtractively and contacts routing line 1340.

For instance, the bottom spray nozzle can spray another wet chemical etch on the metal base while the top spray nozzle is deactivated, or the structure can be dipped in the wet chemical etch since encapsulant 1362 covers metal pillar 1356. The wet chemical etch is highly selective of copper with respect to nickel, the solder mask material and the molding compound, and therefore, highly selective of the metal base with respect to the first nickel layer of routing line 1340, the first nickel layer of the etch mask, solder mask 1350 and encapsulant 1362. Furthermore, the first nickel layer of routing line 1340 and solder mask 1350 protect the copper layer of routing line 1340 from the wet chemical etch. Therefore, no appreciable amount of routing line 1340, solder mask 1350 or encapsulant 1362 is removed. Although the wet chemical etch is highly selective of the copper layer of the etch mask and removes the copper layer (and consequently the gold layer and second nickel layer) of the etch mask, and the etch mask becomes much thinner, this is relatively unimportant since the first nickel layer of the etch mask contacts the metal base and remains intact.

The wet chemical etch etches completely through the metal base, thereby effecting a pattern transfer of the etch mask onto the metal base, removing a portion of the metal base within the periphery of chip 1310 without removing another portion of the metal base outside the periphery of chip 1310, exposing routing line 1340 and solder mask 1350, reducing but not eliminating contact area between the metal base and routing line 1340, and reducing and eliminating contact area between the metal base and solder mask 1350. Furthermore, the wet chemical etch electrically isolates routing line 1340 from the other routing lines that are initially electroplated on and electrically connected to one another by the metal base.

The wet chemical etch laterally undercuts the metal base adjacent to the etch mask, causing tapered pillar 1390 to taper inwardly as it extends downwardly. A suitable taper is between 45 and slightly less than 90 degrees, such as approximately 75 degrees.

A suitable wet chemical etch can be provided by the same solution used for etching metal base 120 to form slot 130 and recess 132. The optimal etch time for exposing the metal base to the wet chemical etch in order to form tapered pillar 1390 with the desired dimensions without excessively exposing the nickel layers to the wet chemical etch can be established through trial and error.

Tapered pillar 1390 includes opposing surfaces 1391 and 1392 and tapered sidewalls 1393 therebetween. Surface 1391 of tapered pillar 1390 constitutes an unetched portion of the top surface (corresponding to surface 122) of the metal base (corresponding to metal base 120), and surface 1392 of tapered pillar 1390 constitutes an unetched portion of the bottom surface (corresponding to surface 124) of the metal base (corresponding to metal base 120). Surface 1391 contacts and faces towards routing line 1340 and is spaced from and faces away from the etch mask, and surface 1392 contacts and faces towards the etch mask and is spaced from and faces away from routing line 1340. Surfaces 1391 and 1392 are flat and parallel to one another. Tapered sidewalls 1393 are adjacent to surfaces 1391 and 1392 and slant inwardly towards surface 1392.

Tapered pillar 1390 has a conical shape with a height (between surfaces 1391 and 1392) of 200 microns and a diameter that decreases as the height increases (away from surface 1391 and towards surface 1392). Surface 1391 has a circular shape with a diameter of 300 microns, and surface 1392 has a circular shape with a diameter of 150 microns. Thus, surface 1391 provides the base of tapered pillar 1390, and surface 1392 provides the tip of tapered pillar 1390.

Tapered pillar 1390 contacts routing line 1340, is spaced and separated from metal pillar 1356 and connection joint 1372, is overlapped by and vertically aligned with the enlarged circular portion of routing line 1340 and metal pillar 1356, is disposed outside the periphery of chip 1310 and is disposed downwardly beyond chip 1310, routing line 1340, solder mask 1350, chip adhesive 1354, metal pillar 1356, thermal adhesive 1360, encapsulant 1362, connection joint 1372 and insulative plug 1374. Furthermore, routing line 1340 and tapered pillar 1390 contact one another, adhere to one another, are adjacent to one another, are metallurgically bonded to one another and are not integral with one another.

Surfaces 1391 and 1392 are vertically aligned with the etch mask, the enlarged circular portion of routing line 1340, metal pillar 1356 and one another. In addition, surface 1392 is concentrically disposed within the surface areas of surface 1391, the etch mask, the enlarged circular portion of routing line 1340 and metal pillar 1356.

Thereafter, the etch mask is removed. The etch mask, which at this stage consists of a nickel layer, is removed by wet chemical etching using a nickel etching solution, such as a dilute mixture of nitric and hydrochloric acid, that is highly selective of nickel with respect to the solder mask material and the molding compound. The wet chemical etch also removes the exposed portion of the first nickel layer of routing line 1340 (that extends laterally beyond tapered pillar 1390 and downwardly beyond the copper layer of routing line 1340), and the elongated routing portion of routing line 1340 becomes slightly thinner. However, no appreciable amount of solder mask 1350 or encapsulant 1362 is removed.

Since the etch mask is extremely thin relative to tapered pillar 1390, and the structure is removed from the nickel etching solution soon after the etch mask is stripped, it is not critical that the nickel etching solution be highly selective of nickel with respect to copper. In fact, the nickel etching solution is also selective of copper. As a result, the nickel etching solution also removes a slight amount of the exposed copper surfaces. However, the nickel etching solution is not applied long enough to appreciably affect the copper features.

The nickel etching solution has no significant impact on routing line 1340 or tapered pillar 1390. In addition, encapsulant 1362 protects metal pillar 1356 from the nickel etching solution. The optimal etch time for exposing the etch mask to the wet chemical etch in order to remove the etch mask without significantly impacting routing line 1340 or tapered pillar 1390 can be established through trial and error.

The nickel etching solution converts routing line 1340 from a flat, planar lead to an essentially flat, planar lead due to the slight recess (not shown) previously occupied by a portion of the nickel layer that extended laterally beyond tapered pillar 1390 and a lower portion of a portion of the copper layer that extended laterally beyond tapered pillar 1390. In addition, the nickel etching solution exposes surface 1392 of tapered pillar 1390.

Thereafter, insulative base 1376 is formed with a thickness of 250 microns (rather than 150 microns).

Thereafter, instead of removing the lower portion of insulative base 1376 by plasma etching, the lower portion of insulative base 1376 is removed by grinding. In particular, a rotating diamond sand wheel and distilled water are applied to insulative base 1376. Initially, the diamond sand wheel grinds only insulative base 1376. As the grinding continues, insulative base 1376 becomes thinner as its grinded surface migrates upwardly. Eventually the diamond sand wheel contacts tapered pillar 1390, and as a result, begins to grind tapered pillar 1390 as well. As the grinding continues, insulative base 1376 and tapered pillar 1390 become thinner as their grinded surfaces migrate upwardly. The grinding continues until insulative base 1376 and tapered pillar 1390 have the desired thickness, and then halts before it reaches chip 1310, routing line 1340, solder mask 1350, chip adhesive 1354, thermal adhesive 1360, encapsulant 1362, connection joint 1372 or insulative plug 1374. Thereafter, the structure is rinsed in distilled water to remove contaminants.

The grinding removes a 100 micron thick lower portion of insulative base 1376 and a 50 micron thick lower portion of tapered pillar 1390. Insulative base 1376 and tapered pillar 1390 are laterally aligned with one another and exposed.

Thus, an exposed planarized horizontal surface that faces downwardly includes insulative base 1376 and tapered pillar 1390.

Thereafter, solder terminals 1378 and 1388 are formed on metal pillar 1356 and tapered pillar 1390, respectively.

Semiconductor chip assembly 1398 includes chip 1310, routing line 1340, solder mask 1350, chip adhesive 1354, metal pillar 1356, thermal adhesive 1360, encapsulant 1362, connection joint 1372, insulative plug 1374, insulative base 1376, solder terminals 1378 and 1388 and tapered pillar 1390.

Figure 38A:
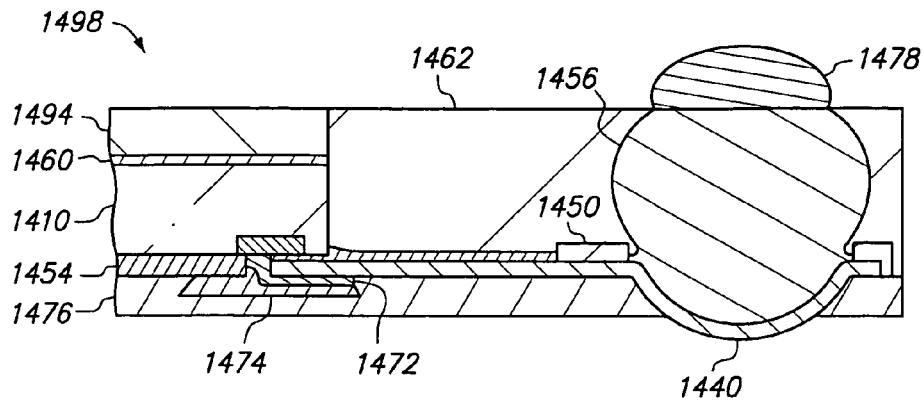
FIGS. 38A, 38B and 38C are cross-sectional, top and bottom views, respectively, of a semiconductor chip assembly in accordance with a fourteenth embodiment of the present invention.
Figure 38B:
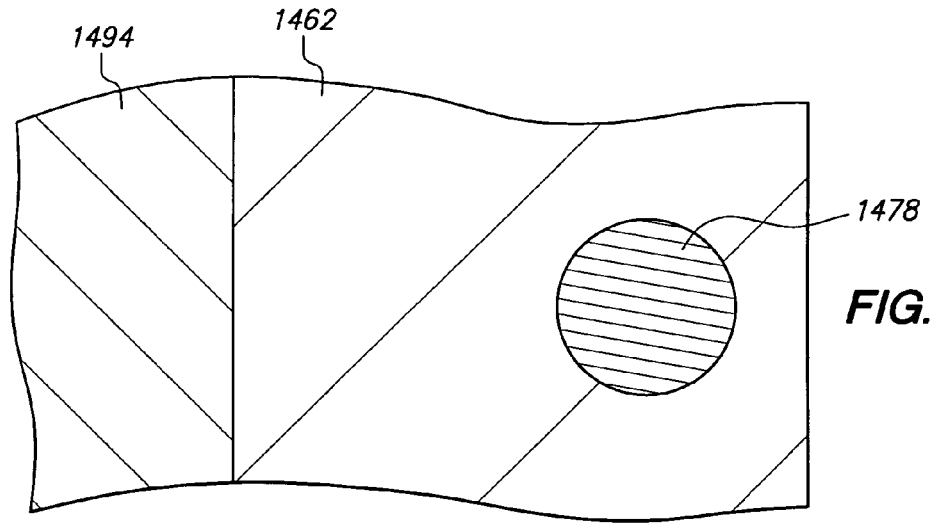
Figure 38C:
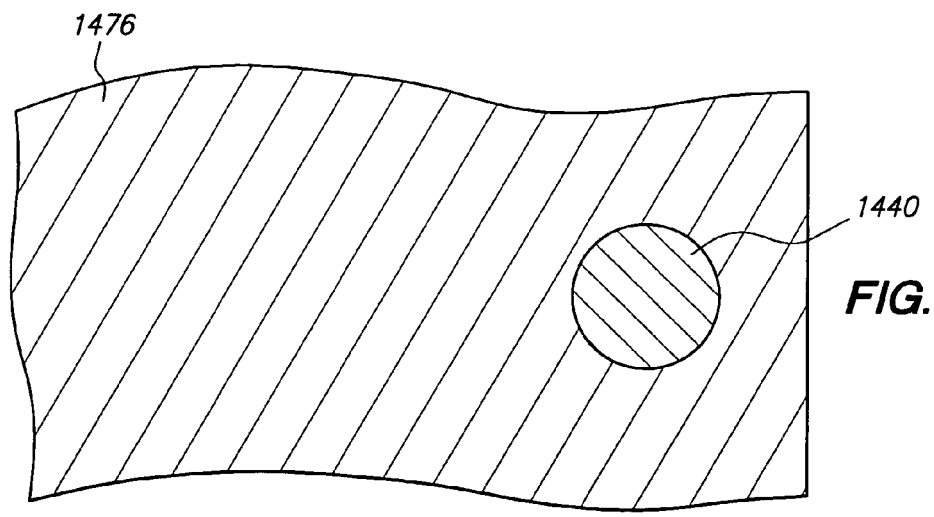

FIGS. 38A, 38B and 38C are cross-sectional, top and bottom views, respectively, of a semiconductor chip assembly in accordance with a fourteenth embodiment of the present invention. In the fourteenth embodiment, the thermal conductor includes the thermal adhesive and a metal plate. For purposes of brevity, any description in the first embodiment is incorporated herein insofar as the same is applicable, and the same description need not be repeated. Likewise, elements of the fourteenth embodiment similar to those in the first embodiment have corresponding reference numerals indexed at fourteen-hundred rather than one-hundred. For instance, chip 1410 corresponds to chip 110, routing line 1440 corresponds to routing line 140, etc.

Thermal adhesive 1460 is deposited as an epoxy paste on chip 1410. Metal plate 1494 is a copper plate with a thickness of 150 microns that is placed on thermal adhesive 1460, and thermal adhesive 1460 contacts and is sandwiched between chip 1410 and metal plate 1494 while thermal adhesive 1460 is an epoxy paste. As a result, thermal adhesive 1460 provides a loose mechanical bond between chip 1410 and metal plate 1494. Thermal adhesive 1460 and metal plate 1494 can be aligned using an automated pattern recognition system.

Thereafter, thermal adhesive 1460 is cured and hardened to form a solid adherent high thermal conductivity adhesive that mechanically attaches metal plate 1494 to chip 1410. Thermal adhesive 1460 has a thickness of 25 microns (rather than 100 microns). Furthermore, thermal adhesive 1460 and metal plate 1494 provide a thermal conductor for chip 1410.

Thereafter, encapsulant 1462 is formed, and then the upper portion of encapsulant 1462 is removed by grinding. In particular, a rotating diamond sand wheel and distilled water are applied to encapsulant 1462. Initially, the diamond sand wheel grinds only encapsulant 1462. As the grinding continues, encapsulant 1462 becomes thinner as its grinded surface migrates downwardly. Eventually the diamond sand wheel contacts metal pillar 1456, and as a result, begins to grind metal pillar 1456 as well. As the grinding continues, metal pillar 1456 and encapsulant 1462 become thinner as their grinded surfaces migrate downwardly. Eventually the diamond sand wheel contacts metal plate 1494, and as a result, begins to grind metal plate 1494 as well. As the grinding continues, metal pillar 1456, encapsulant 1462 and metal plate 1494 become thinner as their grinded surfaces migrate downwardly. The grinding continues until metal pillar 1456, encapsulant 1462 and metal plate 1494 have the desired thickness, and then halts before it reaches chip 1410, routing line 1440, solder mask 1450, chip adhesive 1454 or thermal adhesive 1460. Thereafter, the structure is rinsed in distilled water to remove contaminants.

The grinding removes a 85 micron thick upper portion of metal pillar 1456, a 185 micron thick upper portion of encapsulant 1462 and a 10 micron thick upper portion of metal plate 1494. Thus, the grinding does not reach, damage or expose thermal adhesive 1460.

Metal pillar 1456, encapsulant 1462 and metal plate 1494 are laterally aligned with one another and exposed. Thus, an exposed planarized horizontal surface that faces upwardly includes metal pillar 1456, encapsulant 1462 and metal plate 1494 and excludes thermal adhesive 1460, and thermal adhesive 1460 is unexposed.

Thereafter, solder terminal 1478 is formed.

Semiconductor chip assembly 1498 includes chip 1410, routing line 1440, solder mask 1450, chip adhesive 1454, metal pillar 1456, thermal adhesive 1460, encapsulant 1462, connection joint 1472, insulative plug 1474, insulative base 1476, solder terminal 1478 and metal plate 1494.

Figure 39A:
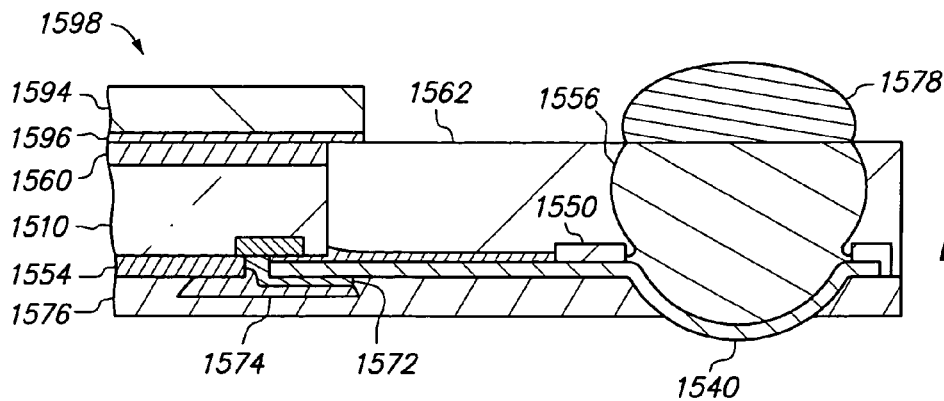
FIGS. 39A, 39B and 39C are cross-sectional, top and bottom views, respectively, of a semiconductor chip assembly in accordance with a fifteenth embodiment of the present invention.
Figure 39B:
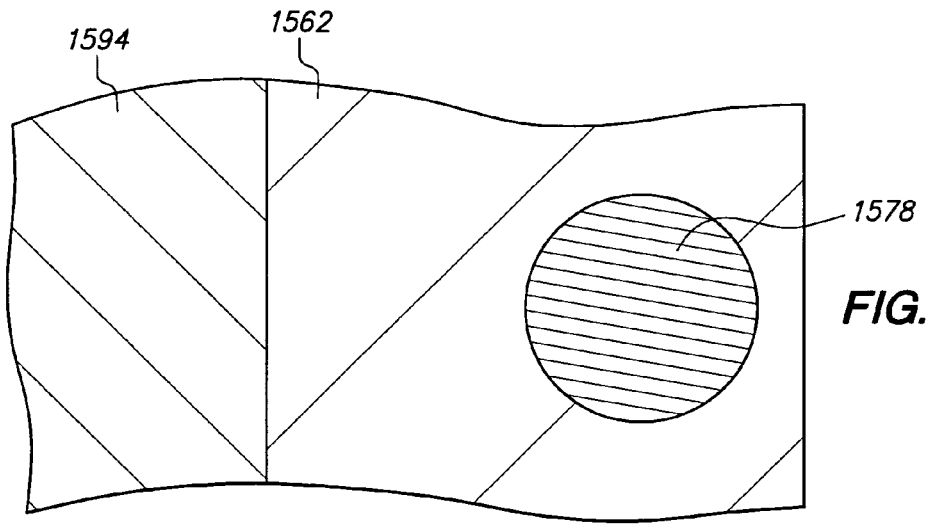
Figure 39C:
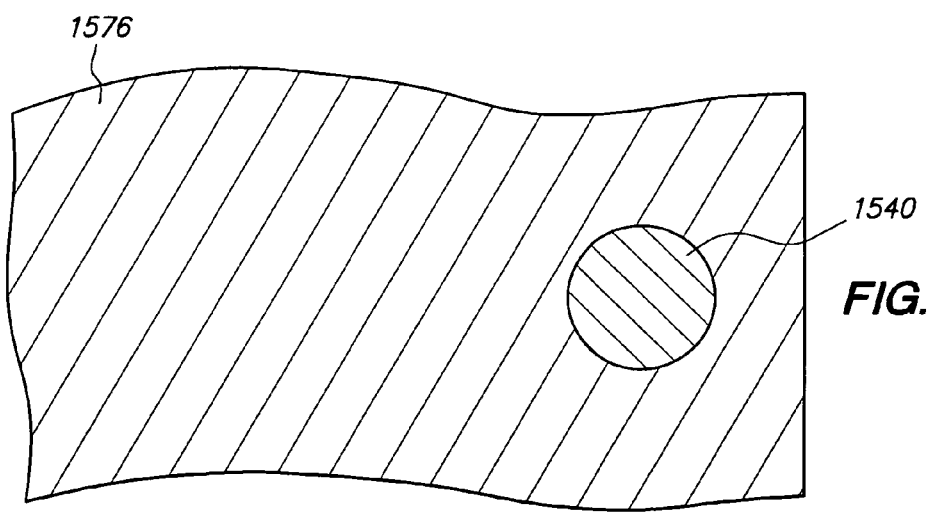

FIGS. 39A, 39B and 39C are cross-sectional, top and bottom views, respectively, of a semiconductor chip assembly in accordance with a fifteenth embodiment of the present invention. In the fifteenth embodiment, the assembly includes a heat sink provided by a metal plate and another thermal adhesive. For purposes of brevity, any description in the first embodiment is incorporated herein insofar as the same is applicable, and the same description need not be repeated. Likewise, elements of the fifteenth embodiment similar to those in the first embodiment have corresponding reference numerals indexed at fifteen-hundred rather than one-hundred. For instance, chip 1510 corresponds to chip 110, routing line 1540 corresponds to routing line 140, etc.

Metal plate 1594 is a copper plate with a thickness of 150 microns covered by a nickel coating with a thickness of 2 microns to reduce corrosion. For convenience of illustration, the copper plate and the nickel coating are shown as a single layer.

Thermal adhesive 1596 is a high thermal conductivity adhesive such as Hysol QMI 536HT with a thickness of 25 microns.

Thermal adhesive 1596 is initially a liquid resin (A stage) such as polyamic acid that is deposited on thermal adhesive 1560 and encapsulant 1562 using stencil printing. Thereafter, the structure is placed in an oven and thermal adhesive 1596 is heated to a relatively low temperature such as 100° C. As a result, thermal adhesive 1596 is partially polymerized (B stage) and forms a gel but is not fully cured. Thereafter, metal plate 1594 is placed on thermal adhesive 1596, and thermal adhesive 1596 contacts and is sandwiched between thermal adhesive 1560 and metal plate 1594, and between encapsulant 1562 and metal plate 1594 while thermal adhesive 1596 is a gel. As a result, thermal adhesive 1596 provides a loose mechanical bond between thermal adhesive 1560 and metal plate 1594, and between encapsulant 1562 and metal plate 1594. Thermal adhesive 1560 and metal plate 1594 are positioned relative to one another so that chip 1510 and thermal adhesive 1560 are disposed within the periphery of and covered by metal plate 1594. Thermal adhesive 1560 and metal plate 1594 can be aligned using an automated pattern recognition system.

Thereafter, the structure is placed in an oven and thermal adhesive 1596 is fully cured (C stage) at relatively low temperature in the range of 200 to 250° C. to form a solid adhesive insulative thermosetting polyimide layer that mechanically attaches metal plate 1594 to the structure.

Metal plate 1594 is spaced and separated from, electrically isolated from and disposed upwardly beyond chip 1510, routing line 1540, solder mask 1550, chip adhesive 1554, metal pillar 1556, thermal adhesive 1560, encapsulant 1562, connection joint 1572 and insulative plug 1574. Metal plate 1594 covers chip 1510, thermal conductor 1560, connection joint 1572 and insulative plug 1574, overlaps but does not cover routing line 1540, chip adhesive 1554, and encapsulant 1562 and does not overlap solder mask 1550 and metal pillar 1556. Thus, thermal adhesive 1560 is unexposed. Furthermore, metal plate 1594 and thermal adhesive 1596 provide a heat sink.

Thereafter, solder terminal 1578 is formed. Solder terminal 1578 extends upwardly beyond and is spaced from metal plate 1594.

Semiconductor chip assembly 1598 includes chip 1510, routing line 1540, solder mask 1550, chip adhesive 1554, metal pillar 1556, thermal adhesive 1560, encapsulant 1562, connection joint 1572, insulative plug 1574, insulative base 1576, solder terminal 1578, metal plate 1594 and thermal adhesive 1596.

Figure 40A:
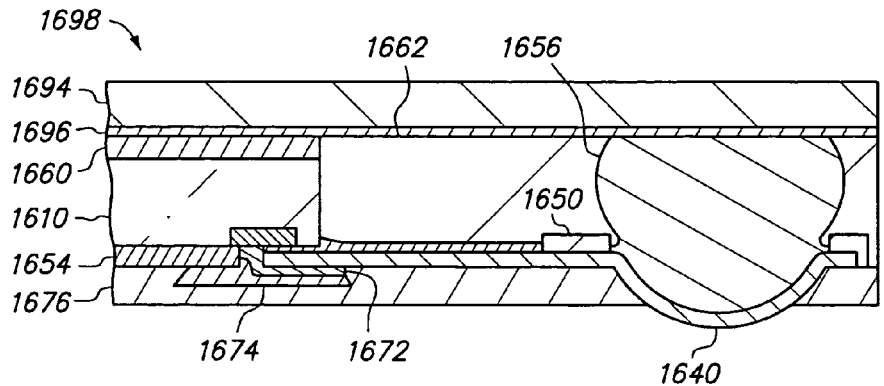
FIGS. 40A, 40B and 40C are cross-sectional, top and bottom views, respectively, of a semiconductor chip assembly in accordance with a sixteenth embodiment of the present invention.
Figure 40B:
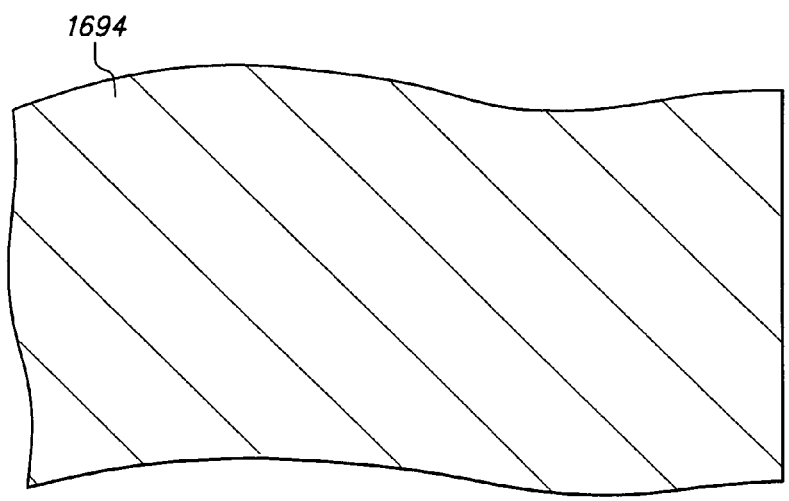
Figure 40C:
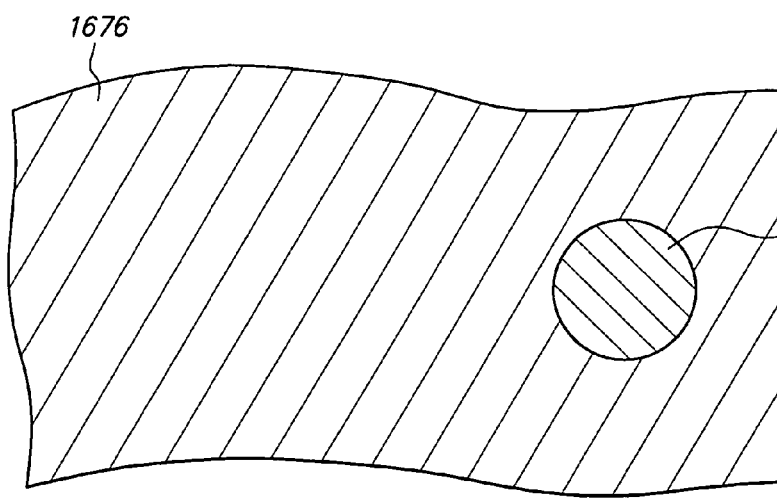

FIGS. 40A, 40B and 40C are cross-sectional, top and bottom views, respectively, of a semiconductor chip assembly in accordance with a sixteenth embodiment of the present invention. In the sixteenth embodiment, the assembly includes a heat sink provided by a metal plate and another thermal adhesive. For purposes of brevity, any description in the first embodiment is incorporated herein insofar as the same is applicable, and the same description need not be repeated. Likewise, elements of the sixteenth embodiment similar to those in the first embodiment have corresponding reference numerals indexed at sixteen-hundred rather than one-hundred. For instance, chip 1610 corresponds to chip 110, routing line 1640 corresponds to routing line 140, etc.

Metal plate 1694 is a copper plate with a thickness of 150 microns covered by a nickel coating with a thickness of 2 microns to reduce corrosion. For convenience of illustration, the copper plate and the nickel coating are shown as a single layer. Metal plate 1694 is spaced and separated from, electrically isolated from, disposed upwardly beyond and covers chip 1610, routing line 1640, solder mask 1650, chip adhesive 1654, metal pillar 1656, thermal adhesive 1660, encapsulant 1662, connection joint 1672 and insulative plug 1674.

Thermal adhesive 1696 is a high thermal conductivity adhesive such as Hysol QMI 536HT with a thickness of 25 microns. Thermal adhesive 1696 is disposed upwardly beyond and covers chip 1610, routing line 1640, solder mask 1650, chip adhesive 1654, metal pillar 1656, thermal adhesive 1660, encapsulant 1662, connection joint 1672 and insulative plug 1674. Thermal adhesive 1696 contacts and is sandwiched between metal pillar 1656 and metal plate 1694, between thermal adhesive 1660 and metal plate 1694, and between encapsulant 1662 and metal plate 1694.

Metal plate 1694 and thermal adhesive 1696 are formed on metal pillar 1656, thermal conductor 1660 and encapsulant 1662 in the same manner that metal plate 1594 and thermal adhesive 1596 are formed on thermal conductor 1560 and encapsulant 1562.

Metal pillar 1656, thermal conductor 1660 and encapsulant 1662 are laterally aligned with one another at an unexposed planarized horizontal surface that faces upwardly. Thus, metal pillar 1656 and thermal conductor 1660 are unexposed.

Routing line 1640 and metal pillar 1656 have high thermal conductivity and much higher thermal conductivity than encapsulant 1662. As a result, routing line 1640 and metal pillar 1656 provide an additional thermal path between chip 1610 and a heat sink provided by metal plate 1694 and thermal adhesive 1696, thereby enhancing thermal dissipation from chip 1610. Thus, metal pillar 1656 provides thermal conduction for chip 1610 rather than upward vertical routing for chip 1610. Furthermore, since thermal adhesive 1696 is an electrical insulator, the conductive traces remain electrically isolated from one another.

The solder terminal (corresponding to solder terminal 178) is omitted.

Semiconductor chip assembly 1698 includes chip 1610, routing line 1640, solder mask 1650, chip adhesive 1654, metal pillar 1656, thermal adhesive 1660, encapsulant 1662, connection joint 1672, insulative plug 1674, insulative base 1676, metal plate 1694 and thermal adhesive 1696.

Figure 41A:
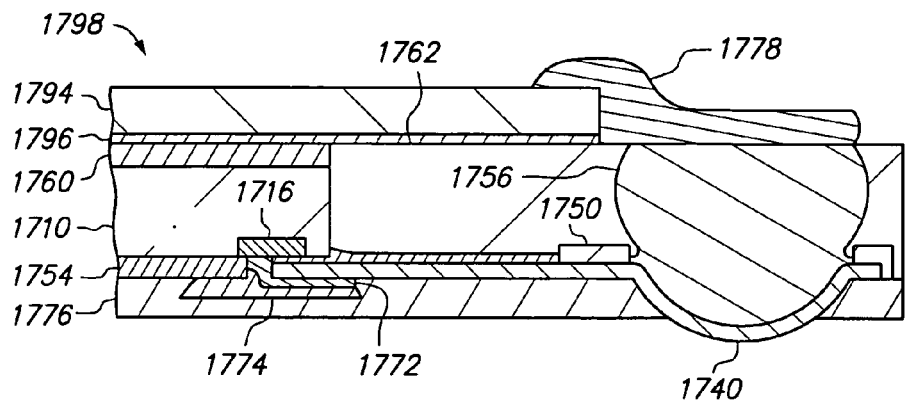
FIGS. 41A, 41B and 41C are cross-sectional, top and bottom views, respectively, of a semiconductor chip assembly in accordance with a seventeenth embodiment of the present invention.
Figure 41B:
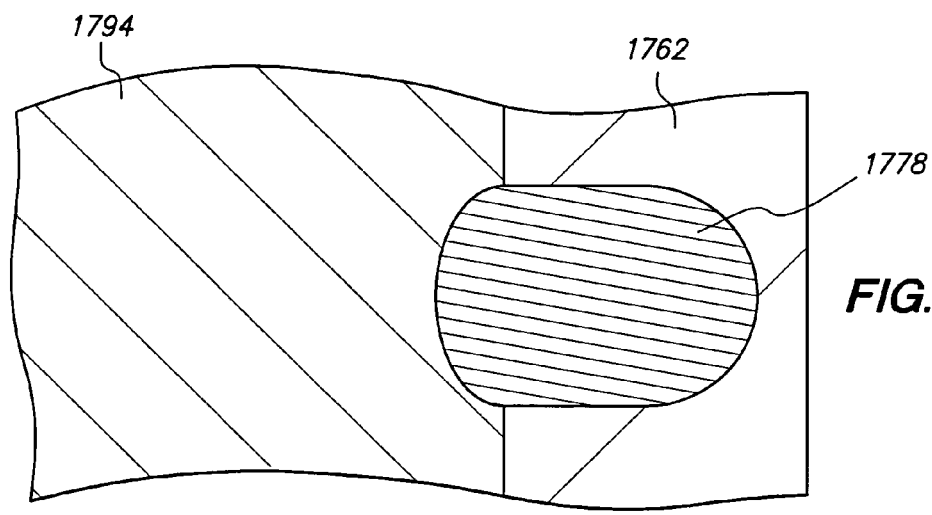
Figure 41C:
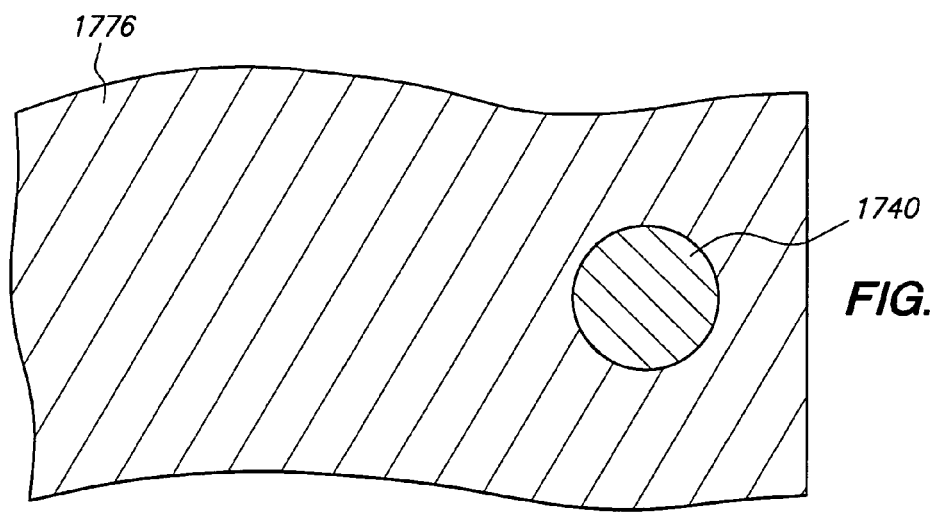

FIGS. 41A, 41B and 41C are cross-sectional, top and bottom views, respectively, of a semiconductor chip assembly in accordance with a seventeenth embodiment of the present invention. In the seventeenth embodiment, the assembly includes a heat sink provided by a metal plate, another thermal adhesive and the solder terminal. For purposes of brevity, any description in the first embodiment is incorporated herein insofar as the same is applicable, and the same description need not be repeated. Likewise, elements of the seventeenth embodiment similar to those in the first embodiment have corresponding reference numerals indexed at seventeen-hundred rather than one-hundred. For instance, chip 1710 corresponds to chip 110, routing line 1740 corresponds to routing line 140, etc.

Metal plate 1794 is a copper plate with a thickness of 150 microns covered by a nickel coating with a thickness of 2 microns to reduce corrosion. For convenience of illustration, the copper plate and the nickel coating are shown as a single layer. Metal plate 1794 is spaced and separated from, electrically isolated from and disposed upwardly beyond chip 1710, routing line 1740, solder mask 1750, chip adhesive 1754, metal pillar 1756, thermal adhesive 1760, encapsulant 1762, connection joint 1772 and insulative plug 1774.

Thermal adhesive 1796 is a high thermal conductivity adhesive such as Hysol QMI 536HT with a thickness of 25 microns. Thermal adhesive 1796 is disposed upwardly beyond chip 1710, routing line 1740, solder mask 1750, chip adhesive 1754, metal pillar 1756, thermal adhesive 1760, encapsulant 1762, connection joint 1772 and insulative plug 1774. Thermal adhesive 1796 contacts and is sandwiched between thermal adhesive 1760 and metal plate 1794, and between encapsulant 1762 and metal plate 1794.

Metal plate 1794 and thermal adhesive 1796 cover chip 1710, chip adhesive 1754, thermal conductor 1760, connection joint 1772 and insulative plug 1774, overlap but do not cover routing line 1740, solder mask 1750 and encapsulant 1762 and do not overlap metal pillar 1756.

Metal plate 1794 and thermal adhesive 1796 are formed on thermal conductor 1760 and encapsulant 1762 in the same manner that metal plate 1594 and thermal adhesive 1596 are formed on thermal conductor 1560 and encapsulant 1562.

Thereafter, solder terminal 1778 is formed on metal pillar 1756 and metal plate 1794. Solder terminal 1778 is deposited on metal pillar 1756 and metal plate 1794 as solder paste and then heated and reflowed into a hardened solder bond in essentially the same manner as conductive bond 984. As a result, solder terminal 1778 contacts and electrically connects and thermally connects metal pillar 1756 and metal plate 1794.

Routing line 1740 and metal pillar 1756 have high thermal conductivity and much higher thermal conductivity than encapsulant 1762. As a result, routing line 1740 and metal pillar 1756 provide an additional thermal path between chip 1710 and a heat sink provided by solder terminal 1778, metal plate 1794 and thermal adhesive 1796, thereby enhancing thermal dissipation from chip 1710. Thus, metal pillar 1756 provides thermal conduction for chip 1710. Furthermore, since pad 1716 is a ground pad and only conductive traces connected to ground pads are soldered to metal plate 1794, the other conductive traces remain electrically isolated from one another and metal plate 1794 provides a ground plane.

Semiconductor chip assembly 1798 includes chip 1710, routing line 1740, solder mask 1750, chip adhesive 1754, metal pillar 1756, thermal adhesive 1760, encapsulant 1762, connection joint 1772, insulative plug 1774, insulative base 1776, solder terminal 1778, metal plate 1794 and thermal adhesive 1796.

Figure 42A:
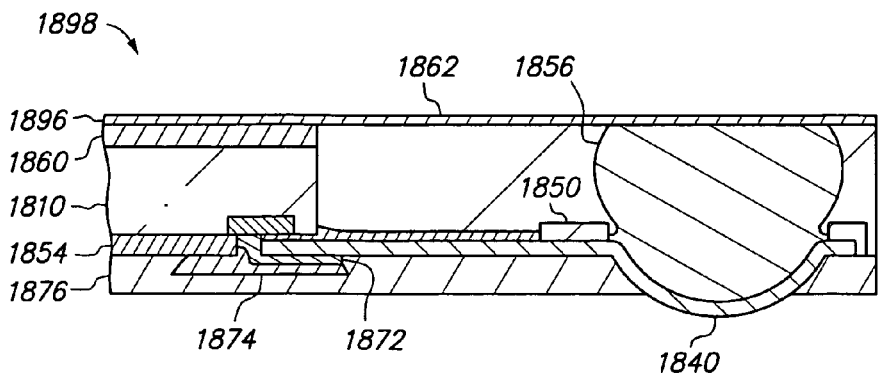
FIGS. 42A, 42B and 42C are cross-sectional, top and bottom views, respectively, of a semiconductor chip assembly in accordance with an eighteenth embodiment of the present invention.
Figure 42B:
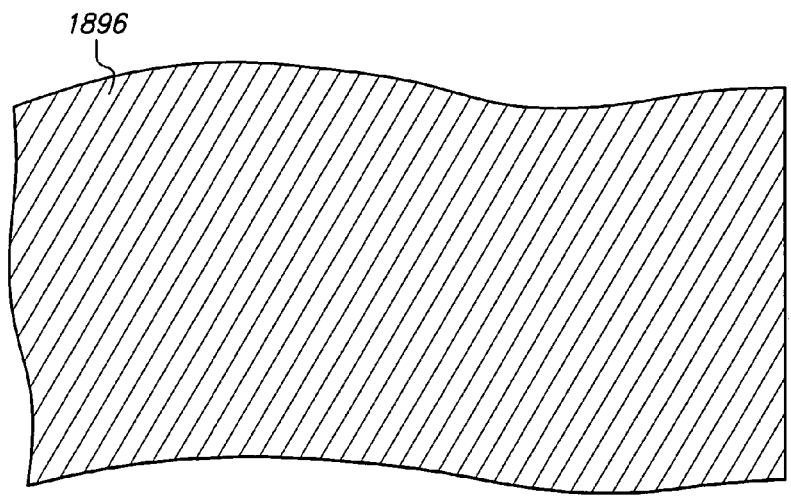
Figure 42C:
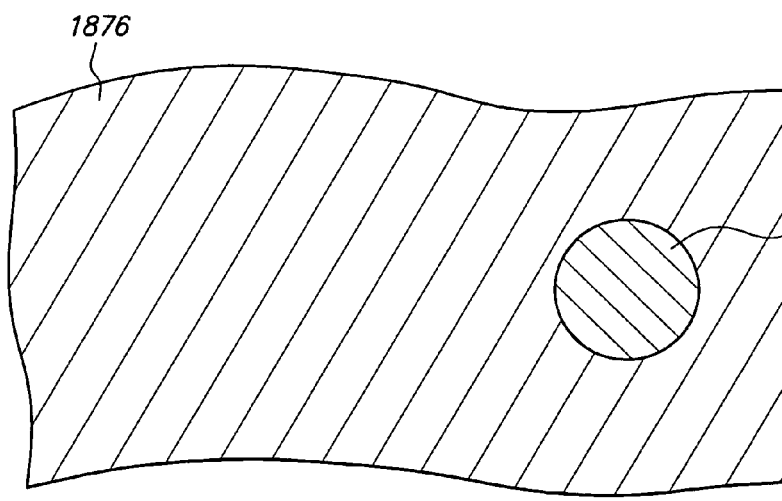

FIGS. 42A, 42B and 42C are cross-sectional, top and bottom views, respectively, of a semiconductor chip assembly in accordance with an eighteenth embodiment of the present invention. In the eighteenth embodiment, the assembly includes a heat sink provided by another thermal adhesive. For purposes of brevity, any description in the first embodiment is incorporated herein insofar as the same is applicable, and the same description need not be repeated. Likewise, elements of the eighteenth embodiment similar to those in the first embodiment have corresponding reference numerals indexed at eighteen-hundred rather than one-hundred. For instance, chip 1810 corresponds to chip 110, routing line 1840 corresponds to routing line 140, etc.

Thermal adhesive 1896 is a high thermal conductivity adhesive such as Hysol QMI 536HT with a thickness of 25 microns. Thermal adhesive 1896 is disposed upwardly beyond and covers chip 1810, routing line 1840, solder mask 1850, chip adhesive 1854, metal pillar 1856, thermal adhesive 1860, encapsulant 1862, connection joint 1872 and insulative plug 1874. Thermal adhesive 1896 contacts metal pillar 1856, thermal adhesive 1860 and encapsulant 1862 and is not overlapped in the upward direction by another material of the assembly.

Thermal adhesive 1896 is formed on metal pillar 1856, thermal conductor 1860 and encapsulant 1862 in the same manner that thermal adhesive 1596 is formed on thermal conductor 1560 and encapsulant 1562. However, the metal plate (corresponding to metal plate 1594) is omitted.

Routing line 1840 and metal pillar 1856 have high thermal conductivity and much higher thermal conductivity than encapsulant 1862. As a result, routing line 1840 and metal pillar 1856 provide an additional thermal path between chip 1810 and a heat sink provided by thermal adhesive 1896 alone, thereby enhancing thermal dissipation from chip 1810. Thus, metal pillar 1856 provides thermal conduction for chip 1810 rather than upward vertical routing for chip 1810. Furthermore, since thermal adhesive 1896 is an electrical insulator, the conductive traces remain electrically isolated from one another.

The solder terminal (corresponding to solder terminal 178) is omitted.

Semiconductor chip assembly 1898 includes chip 1810, routing line 1840, solder mask 1850, chip adhesive 1854, metal pillar 1856, thermal adhesive 1860, encapsulant 1862, connection joint 1872, insulative plug 1874, insulative base 1876 and thermal adhesive 1896.

The semiconductor chip assemblies described above are merely exemplary. Numerous other embodiments are contemplated. For instance, the solder terminals, solder mask, insulative base, metal pillar and/or metal base can be omitted. In addition, the embodiments described above can generally be combined with one another. For instance, the connection joints in the second, third and fourth embodiments and the non-inverted chip in the fifth embodiment can be used in the other embodiments. Likewise, the thermal adhesives in the sixth and seventh embodiments and the encapsulant in the eighth embodiment can be used in the other embodiments. Likewise, the metal pillars in the ninth and tenth embodiments, the omitted metal pillar in the eleventh embodiment, the metal filler in the twelfth embodiment, the tapered pillar in the thirteenth embodiment, the metal plate in the fourteenth embodiment and the heat sinks in the fifteenth, sixteenth, seventeenth and eighteenth embodiments can be used in the other embodiments. The embodiments described above can be mixed-and-matched with one another and with other embodiments depending on design and reliability considerations.

The metal base can be various metals such as copper, copper alloys, nickel, iron-nickel alloys, aluminum, and so on, and can be a single layer or multiple layers.

The opening in the metal base can be formed before or after forming the routing line, and before or after attaching the metal base to the chip. In addition, the opening in the metal base can be formed by selectively etching the metal base through an etch mask or by blanketly etching a slot in the metal base. Furthermore, the opening in the metal base can expose a single pad or a plurality of pads. For instance, the opening in the metal base can expose multiple through-holes in the chip adhesive which each expose a respective routing line and a respective pad, thereby facilitating the flow of electrolytic plating solution for the connection joints. Thereafter, multiple connection joints can be formed which each contact and electrically connect a respective routing line and a respective pad, the insulative plug can be formed in the opening in the metal base and on the connection joints, and then the metal base can be etched, for instance to form the tapered pillar or be removed, while the insulative plug protects the connection joints from the wet chemical etch.

The metal base need not necessarily be removed. For instance, a portion of the metal base that extends across the pad can be selectively etched to permit formation of the through-hole, and another portion of the metal base that is disposed within the periphery of the chip can remain intact and provide a heat sink. Likewise, a portion of the metal base within the periphery of the chip can be selectively etched, and another portion of the metal base that is disposed outside the periphery of the chip can remain intact and provide the tapered pillar.

The etch mask that defines the tapered pillar can be a wide variety of materials including copper, gold, nickel, palladium, tin, solder, photoresist and epoxy, can be formed by a wide variety of processes including electroplating, electroless plating, printing, reflowing and curing, and can have a wide variety of shapes and sizes. The etch mask can be deposited on the metal base before, during or after the routing line is deposited on the metal base and before or after the encapsulant is formed, can be disposed on a planar surface of the metal base or in a recess in the metal base, and if disposed in a recess need not necessarily fill the recess. Furthermore, the etch mask can remain permanently attached to the tapered pillar or be removed after the tapered pillar is formed.

The etch mask that defines the tapered pillar is undercut by a wet chemical etch that forms the tapered pillar but can subsequently be confined to the tip of the tapered pillar, for instance by dislodging a portion of the etch mask outside the tip of the tapered pillar by mechanical brushing, sand blasting, air blowing or water rinsing, or by reflowing a solder etch mask when the tapered pillar does not provide a wettable surface.

Alternatively, a solder etch mask can be reflowed to conformally coat the tapered pillar, for instance by depositing flux on the tapered pillar so that the tapered pillar provides a wettable surface before the solder reflow operation.

The routing line can have various shapes and sizes. The routing line can extend across various portions of the pad, such as one peripheral edge and the center of the pad (FIG. 11E), two opposing peripheral edges and the center of the pad, three peripheral edges but not the center of the pad, two corners and the center of the pad or four peripheral edges but not the center of the pad.

The routing line can be various conductive metals including copper, gold, nickel, silver, palladium, tin, combinations thereof, and alloys thereof. The preferred composition of the routing line will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). Likewise, the routing line can fan-in as well as fan-out.

The routing line can be formed on the metal base by numerous deposition techniques including electroplating and electroless plating. In addition, the routing line can be deposited on the metal base as a single layer or multiple layers. For instance, the routing line can be a 10 micron layer of gold, or alternatively, a 9.5 micron layer of nickel electroplated on a 0.5 micron layer of gold electroplated on a copper base to reduce costs, or alternatively, a 9 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the routing line can consist of a non-copper layer electroplated on a copper base and a copper layer electroplated on the non-copper layer. Suitable non-copper layers include nickel, gold, palladium and silver. After the routing line is formed, a wet chemical etch can be applied that is highly selective of copper with respect to the non-copper layer to etch the copper base and expose the routing line without removing the copper or non-copper layers. The non-copper layer provides an etch stop that prevents the wet chemical etch from removing the copper layer. Furthermore, it is understood that in the context of the present invention, the routing line and the metal base are different metals (or metallic materials) even if a multi-layer routing line includes a single layer that is similar to the metal base (such as the example described above) or a single layer of a multi-layer metal base.

The routing line can also be formed by etching a metal layer attached to the metal base. For instance, a photoresist layer can be formed on the metal layer, the metal layer can be etched using the photoresist layer as an etch mask, and then the photoresist layer can be stripped. Alternatively, a photoresist layer can be formed on the metal layer, a plated metal can be selectively electroplated on the metal layer using the photoresist layer as a plating mask, the photoresist layer can be stripped, and then the metal layer can be etched using the plated metal as an etch mask. In this manner, the routing line can be formed semi-additively and include unetched portions of the metal layer and the plated metal. Likewise, the routing line can be formed subtractively from the metal layer, regardless of whether the plated metal etch mask remains attached to the routing line.

The routing line can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds. The routing line can also be spot plated away from the pad to make it compatible with receiving the metal pillar. For instance, a copper routing line can be spot plated with nickel and then gold to facilitate solder reflow of a solder ball or welding of a gold ball bond.

The metal pillar can be various conductive metals including copper, gold, nickel, silver, palladium, tin, combinations thereof, and alloys thereof, can be formed on the routing line by a wide variety of processes including electroplating, electroless plating, solder reflowing, conductive adhesive curing, and welding, and can have a wide variety of shapes and sizes. Further details regarding a metal pillar that is etched from a metal base and contacts a routing line are disclosed in U.S. application Ser. No. 10/714,794 filed Nov. 17, 2003 by Chuen Rong Leu et al. entitled "Semiconductor Chip Assembly with Embedded Metal Pillar" which is incorporated by reference. Further details regarding a metal pillar provided by a metal particle attached to a routing line by reflowing, solidifying or hardening the metal particle or a conductive bond are disclosed in U.S. application Ser. No. 10/922,280 filed Aug. 19, 2004 by Charles W. C. Lin et al. entitled "Semiconductor Chip Assembly with Embedded Metal Particle" which is incorporated by reference. Further details regarding a metal pillar that is welded to a routing line are disclosed in U.S. application Ser. No. 10/985,579 filed Nov. 10, 2004 by Charles W. C. Lin entitled "Semiconductor Chip Assembly with Welded Metal Pillar" which is incorporated by reference.

The conductive trace can function as a signal, power or ground layer depending on the purpose of the associated chip pad.

The pad can have numerous shapes including a flat rectangular shape and a bumped shape. For instance, a bump-shaped pad may extend into the through-hole. The pad can either be partially or completely exposed prior to forming the connection joint. The pad can have a length and width that are larger than, equal to, or smaller than the diameter of the through-hole. Preferably, a substantial portion of the pad is directly above the through-hole. If desired, the pad can be treated to accommodate the connection joint.

The thermal conductor that contacts the chip and is laterally aligned with the encapsulant at an upwardly facing surface can include, consist essentially of, or consist of the thermal adhesive. Furthermore, the thermal conductor can have much higher thermal conductivity than the encapsulant.

The thermal adhesive can be various thermally conductive materials including epoxy, solder, silicone, and combinations thereof. For instance, the thermal adhesive can be silver filled epoxy, thermal solder, acrylic or RTV silicone. The thermal adhesive can be deposited on the chip as a liquid resin or a paste such as copper paste, silver paste, solder paste or silicic paste and then hardened. Suitable thermal adhesives include Hysol QMI 529HT, Hysol QMI 536HT, Locite 3874, Locite 3880 and Locite 5421. Further details regarding thermal solders are disclosed in the Application Note entitled "Thermal Interface Materials" by Indium Corporation of America, pp. 1-2 (available at http://www.indium.com/techlibrary/applicationnotes.php) which is incorporated by reference.

The thermal adhesive can be deposited on the chip in numerous manners, including dispensing and printing. Furthermore, the thermal adhesive can be deposited on the chip before or after attaching the chip to the routing line, before or after attaching the metal pillar to the routing line, and before or after forming the connection joint. For instance, the thermal adhesive can be formed on the chip before attaching the chip to the routing line and after attaching the metal pillar to the routing line, or alternatively, after attaching the chip to the routing line and before attaching the metal pillar to the routing line, or alternatively, after attaching the chip and the metal pillar to the routing line and forming the connection joint.

The thermal adhesive can be rigid or flexible before, during or after the encapsulant is formed and before, during or after the encapsulant and the thermal adhesive are grinded. For instance, the thermal adhesive can be deposited on the chip as A stage epoxy, then the thermal adhesive can be fully cured as C stage epoxy, then the encapsulant can be formed and then the encapsulant and the thermal adhesive can be grinded. Likewise, the thermal adhesive can be deposited on the chip as solder paste, then the thermal adhesive can be reflowed into hardened solder, then the encapsulant can be formed and then the encapsulant and the thermal adhesive can be grinded. Alternatively, the thermal adhesive can be deposited on the chip as A stage epoxy, then the thermal adhesive can be partially cured as B stage epoxy, then the thermal adhesive can be fully cured as C stage epoxy as the encapsulant is formed, and then the encapsulant and the thermal adhesive can be grinded. Alternatively, the thermal adhesive can be deposited on the chip as silicone gel and remain unhardened.

Numerous chip adhesives can be applied to mechanically attach the chip to the routing line. For instance, the chip adhesive can be applied as a paste, a laminated layer, or a liquid applied by screen-printing, spin-on, or spray-on. The chip adhesive can be a single layer that is applied to the metal base or the solder mask and then contacted to the chip or a single layer that is applied to the chip and then contacted to the metal base or the solder mask. Similarly, the chip adhesive can be multiple layers with a first layer applied to the metal base or the solder mask, a second layer applied to the chip and then the layers contacted to one another. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives are also generally suitable.

The through-hole that extends through the chip adhesive and/or the solder mask and exposes the pad can be formed either before or after mechanically attaching the chip to the routing line. For instance, the chip adhesive can be applied as a liquid or paste (A stage) over the routing line, the chip adhesive can be partially cured (B stage), an etch can form the through-hole in the chip adhesive and/or the solder mask, the partially cured chip adhesive can be brought into contact with the chip, and then the chip adhesive can be fully cured (C stage). Alternatively, the liquid or paste chip adhesive can be sandwiched between the chip and the routing line, the chip adhesive can be fully cured thereby mechanically fastening the chip to the routing line, and then an etch can form the through-hole.

The through-hole can be formed using laser ablation (including laser direct write without a mask and projection laser ablation with a mask) or plasma etching. Similarly, the through-hole can be formed by a combination of laser ablation and plasma etching.

See, for instance, U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

The through-hole can have a circular, ovular, square, rectangular or other shape (as viewed from the bottom surface of the assembly). The through-hole can be aligned with and expose a single pad or multiple pads and may expose one or more peripheral edges of the pad or just a central portion of the pad spaced from the peripheral edges of the pad. Furthermore, the through-hole can have a wide variety of shapes and slopes including vertical sidewalls, tapered sidewalls, continuous sidewalls and stepped sidewalls.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper. Commercially available dielectric materials such as SPEEDBOARD C prepreg by W. L. Gore & Associates of Eau Claire, Wis. are suitable.

The insulative base can be deposited in numerous manners, including printing and transfer molding. Furthermore, the insulative base can be formed before or after attaching the chip and the metal pillar to the routing line, before or after forming the encapsulant and before or after grinding the encapsulant. For instance, the metal base can be removed and the insulative base can be formed after forming the encapsulant and before grinding the encapsulant, or alternatively, after grinding the encapsulant. Likewise, the insulative base can be grinded before or after attaching the chip and the metal pillar to the routing line, before or after forming the encapsulant and before or after grinding the encapsulant. For instance, the insulative base can grinded after forming the encapsulant and before grinding the encapsulant, or alternatively, after grinding the encapsulant.

The insulative base can be laterally aligned with a metal conductor (such as the metal filler or the tapered pillar) along a downwardly facing surface by grinding the insulative base without grinding the metal conductor, and then grinding the insulative base and the metal conductor, and then discontinuing the grinding before reaching the chip.

The encapsulant can be deposited using a wide variety of techniques including printing and transfer molding. For instance, the encapsulant can be printed on the chip and the metal pillar as an epoxy paste and then cured or hardened to form a solid adherent protective layer. The encapsulant can be any of the chip adhesives mentioned above. Moreover, the encapsulant need not necessarily contact the chip or the metal pillar. For instance, the thermal adhesive can be glob-top coated on the chip after attaching the chip to the routing line, and then the encapsulant can be formed on the thermal adhesive. Likewise, a coating (such as flux or solder) can be deposited on the metal pillar, and then the encapsulant can be formed on the coating.

The encapsulant can be laterally aligned with the thermal conductor along an upwardly facing surface by grinding the encapsulant without grinding the thermal conductor, and then grinding the encapsulant and the thermal conductor.

The encapsulant can be laterally aligned with the metal pillar and the thermal conductor along an upwardly facing surface by grinding the encapsulant without grinding the metal pillar or the thermal conductor, then grinding the encapsulant and the metal pillar without grinding the thermal conductor, and then grinding the encapsulant, the metal pillar and the thermal conductor (if the metal pillar extends upwardly beyond the thermal conductor before the grinding occurs), or alternatively, by grinding the encapsulant without grinding the metal pillar or the thermal conductor, then grinding the encapsulant and the thermal conductor without grinding the metal pillar, and then grinding the encapsulant, the metal pillar and the thermal conductor (if the thermal conductor extends upwardly beyond the metal pillar before the grinding occurs).

The thermal conductor, the encapsulant, the insulative base, the metal pillar and the metal conductor (such as the metal filler or the tapered pillar) can be grinded using a wide variety of techniques including lapping, mechanical polishing and chemical-mechanical polishing.

The heat sink can be attached to the thermal conductor using a wide variety of techniques. For instance, the heat sink can be a metal plate and a second thermal adhesive such that the metal plate is attached to the thermal conductor by the second thermal adhesive and is spaced from and in close proximity to and thermally coupled to the thermal conductor by the second thermal adhesive, and the second thermal adhesive contacts and is sandwiched between the metal plate and the thermal conductor. Alternatively, the heat sink can be a thin metal film that is deposited on the thermal conductor by sputtering or physical vapor deposition and contacts the thermal conductor. Alternatively, the heat sink can be the second thermal adhesive that is deposited on the thermal conductor by screen printing and contacts the thermal conductor.

The second thermal adhesive (that attaches the metal plate to the thermal conductor or itself provides the heat sink) can be any of the thermal adhesives mentioned above.

The connection joint can be formed from a wide variety of materials including copper, gold, nickel, palladium, tin, alloys thereof, and combinations thereof, can be formed by a wide variety of processes including electroplating, electroless plating, ball bonding, wire bonding, stud bumping, solder reflowing, conductive adhesive curing, and welding, and can have a wide variety of shapes and sizes. The shape and composition of the connection joint depends on the composition of the routing line as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference. Further details regarding a welded connection joint are disclosed in U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together. Furthermore, the plating bus can be disconnected by etching the metal base.

A soldering material or solder ball can be deposited on the conductive trace by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

Various cleaning steps, such as a brief oxygen plasma cleaning step, or a brief wet chemical cleaning step using a solution containing potassium permanganate, can be applied to the structure at various stages, such as after forming the through-hole and before forming the connection joint to clean the routing line and the pad.

It is understood that, in the context of the present invention, the thermal adhesive is a thermally conductive material that contacts and adheres to the chip. This is true regardless of whether the thermal adhesive is electrically conductive. This is also true regardless of whether the thermal adhesive is deposited on the chip in non-solidified form (such as A stage epoxy or solder paste) and then is hardened (such as C stage epoxy or solder) and strongly adheres to the chip before the encapsulant is formed, or the thermal adhesive remains in non-solidified form (such as B stage epoxy or silicone gel) and weakly adheres to the chip before the encapsulant is formed.

The "upward" and "downward" vertical directions do not depend on the orientation of the assembly, as will be readily apparent to those skilled in the art. For instance, the thermal adhesive extends vertically beyond the chip in the "upward" direction, the encapsulant extends vertically beyond the routing line in the "upward" direction, and the insulative base extends vertically beyond the chip in the "downward" direction, regardless of whether the assembly is inverted and/or mounted on a printed circuit board. Likewise, the routing line extends "laterally" beyond the metal pillar towards the chip regardless of whether the assembly is inverted, rotated or slanted. Thus, the "upward" and "downward" directions are opposite one another and orthogonal to the "lateral" direction, and the "laterally aligned" surfaces are coplanar with one another in a lateral plane orthogonal to the upward and downward directions. Moreover, the chip is shown above the routing line and the insulative base, and the encapsulant is shown above the chip, the routing line and the insulative base with a single orientation throughout the drawings for ease of comparison between the figures, although the assembly and its components may be inverted at various manufacturing stages.

The working format for the semiconductor chip assembly can be a single assembly or multiple assemblies based on the manufacturing design. For instance, a single assembly that includes a single chip can be manufactured individually. Alternatively, numerous assemblies can be simultaneously batch manufactured on a single metal base with a single insulative base and a single encapsulant and then separated from one another. For example, routing lines for multiple assemblies can be simultaneously electroplated on the metal base, then separate spaced chip adhesives for the respective assemblies can be selectively disposed on the metal base, then the chips can be disposed on the corresponding chip adhesives, then the chip adhesives can be simultaneously fully cured, then the metal pillars can be disposed on the corresponding routing lines, then separate spaced thermal adhesives can be disposed on the corresponding chips, then the thermal adhesives can be simultaneously fully cured, then the encapsulant can be formed, then the metal base can be etched to form the openings for the respective assemblies, then the through-holes can be formed, then the connection joints can be simultaneously electroplated, then separate spaced insulative plugs for the respective assemblies can be formed in the corresponding openings, then the metal base can be etched and removed, then the insulative base can be formed, then the encapsulant can be grinded to simultaneously expose the thermal adhesives, then the encapsulant and the thermal adhesives can be simultaneously grinded, then the insulative base can be etched to expose the bumped terminals, then the solder terminals can be deposited and simultaneously reflowed on the respective metal pillars, and then the encapsulant and the insulative base can be cut, thereby separating the individual single chip-substrate assemblies.

The semiconductor chip assembly can have a wide variety of packaging formats as required by the next level assembly. For instance, the conductive traces can be configured so that the assembly is a grid array such as a ball grid array (BGA), column grid array (CGA), land grid array (LGA) or pin grid array (PGA).

The semiconductor chip assembly can be a first-level package that is a single-chip package or a multi-chip package. Furthermore, a multi-chip first-level package can include chips that are stacked and vertically aligned with one another or are coplanar and laterally aligned with one another.

Advantageously, the semiconductor chip assembly of the present invention is reliable and inexpensive. The thermal conductor can be exposed or in contact with a thermally conductive element without constraint by the encapsulant, thereby improving thermal dissipation from the chip. The encapsulant and the insulative base can protect the chip from handling damage, provide a known dielectric barrier for the conductive trace and protect the assembly from contaminants and unwanted solder reflow during the next level assembly. The encapsulant can provide mechanical support for the conductive trace after the metal base is removed. The mode of the chip connection can shift from the initial mechanical coupling to metallurgical coupling to assure sufficient metallurgical bond strength. The metal pillar can extend vertically across most or all of the chip thickness and the conductive trace can extend vertically across the assembly thickness and be exposed in the upward and downward directions to provide vertical routing that facilitates a three-dimensional stacked arrangement. Furthermore, the conductive trace can be mechanically and metallurgically coupled to the chip without wire bonding, TAB, solder or conductive adhesive, although the process is flexible enough to accommodate these techniques if desired. The process is highly versatile and permits a wide variety of mature connection joint technologies to be used in a unique and improved manner. As a result, the assembly of the present invention significantly enhances throughput, yield and performance characteristics compared to conventional packaging techniques. Moreover, the assembly of the present invention is well-suited for use with materials compatible with copper chip requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A method of making a semiconductor chip assembly, comprising:
   providing a routing line; then
   mechanically attaching a semiconductor chip to the routing line, wherein the chip includes first and second opposing surfaces, and the first surface of the chip includes a conductive pad;
   forming a connection joint that electrically connects the routing line and the pad;
   forming a thermal conductor on the chip, wherein the thermal conductor includes first and second opposing surfaces and a thermal adhesive that contacts the chip;
   forming an encapsulant after attaching the chip to the routing line and forming the thermal conductor on the chip, wherein the encapsulant includes first and second opposing surfaces, the first surfaces of the thermal conductor and the encapsulant face in a first direction, the second surfaces of the thermal conductor and the encapsulant face in a second direction opposite the first direction, the chip is embedded in the encapsulant and extends vertically beyond the routing line in the first direction, the thermal conductor extends vertically beyond the chip in the first direction, and the encapsulant contacts the thermal conductor and covers and extends vertically beyond the chip and the thermal conductor in the first direction; and
   grinding the encapsulant without grinding the thermal conductor and without grinding the chip such that the first surface of the encapsulant migrates in the second direction, then grinding the encapsulant and the thermal conductor without grinding the chip such that the first surfaces of the encapsulant and the thermal conductor migrate in the second direction, and then halting the grinding before the grinding reaches the chip, thereby exposing the thermal conductor without exposing the chip such that the thermal conductor and the encapsulant are laterally aligned with one another at a lateral surface that faces in the first direction.

2. The method of claim 1, wherein providing the routing line includes selectively depositing the routing line on a metal base, attaching the chip to the routing line includes positioning the chip such that the metal base extends vertically beyond the chip in the second direction, and after forming the encapsulant, etching the metal base thereby reducing contact area between the metal base and the routing line.

3. The method of claim 2, wherein forming the routing line includes:
   providing a plating mask on the metal base, wherein the plating mask includes an opening that exposes a portion of the metal base; and then
   electroplating the routing line on the exposed portion of the metal base through the opening in the plating mask.

4. The method of claim 2, wherein etching the metal base removes a first portion of the metal base that contacts the routing line without removing a second portion of the metal base that contacts the routing line, thereby reducing but not eliminating contact area between the metal base and the routing line.

5. The method of claim 2, wherein etching the metal base removes a first portion of the metal base within a periphery of the pad without removing a second portion of the metal base outside the periphery of the pad.

6. The method of claim 2, wherein etching the metal base forms a tapered pillar from an unetched portion of the metal base, and the tapered pillar contacts the routing line, is disposed outside a periphery of the chip and extends vertically beyond the chip, the routing line and the encapsulant in the second direction.

7. The method of claim 2, wherein etching the metal base eliminates contact area between the metal base and the routing line.

8. The method of claim 2, wherein etching the metal base removes the metal base.

9. The method of claim 2, wherein etching the metal base electrically isolates the routing line from other routing lines formed on the metal base.

10. The method of claim 2, wherein etching the metal base electrically isolates the pad from other conductive pads of the chip.

11. The method of claim 1, wherein forming the thermal conductor consists of forming the thermal adhesive on the chip, and grinding the thermal conductor includes grinding the thermal adhesive such that the thermal adhesive and the encapsulant are laterally aligned with one another at the lateral surface.

12. The method of claim 11, wherein the thermal adhesive is epoxy.

13. The method of claim 11, wherein the thermal adhesive is solder.

14. The method of claim 11, wherein the thermal adhesive is silicone.

15. The method of claim 1, wherein forming the thermal conductor includes forming the thermal adhesive on the chip and then attaching a metal plate to the thermal adhesive, and grinding the thermal conductor includes grinding the metal plate and excludes grinding the thermal adhesive such that the metal plate and the encapsulant are laterally aligned with one another at the lateral surface.

16. The method of claim 15, wherein the thermal adhesive is epoxy.

17. The method of claim 15, wherein the thermal adhesive is solder.

18. The method of claim 15, wherein the thermal adhesive is silicone.

19. The method of claim 1, wherein forming the thermal conductor on the chip includes depositing the thermal adhesive on the chip and then hardening the thermal adhesive.

20. The method of claim 1, wherein forming the encapsulant includes transfer molding.

21. The method of claim 1, wherein grinding the encapsulant includes applying a rotating diamond sand wheel to the encapsulant, and grinding the encapsulant and the thermal conductor includes applying the rotating diamond sand wheel to the encapsulant and the thermal conductor.

22. The method of claim 1, wherein the thermal conductor covers the chip in the first direction.

23. The method of claim 1, wherein the encapsulant contacts the chip.

24. The method of claim 1, wherein the encapsulant surrounds and is adjacent to the thermal conductor at the lateral surface.

25. The method of claim 1, including forming the thermal conductor on the chip before attaching the chip to the routing line.

26. The method of claim 1, including forming the thermal conductor on the chip after attaching the chip to the routing line.

27. The method of claim 1, including forming the connection joint before forming the encapsulant.

28. The method of claim 1, including forming the connection joint after forming the encapsulant.

29. The method of claim 1, including attaching a heat sink to the thermal conductor after grinding the encapsulant and the thermal conductor, wherein the heat sink contacts the thermal conductor and covers and extends vertically beyond the chip and the thermal conductor in the first direction.

30. The method of claim 1, wherein the assembly is a first-level package.

31. A method of making a semiconductor chip assembly, comprising:
providing a routing line; then
mechanically attaching a semiconductor chip to the routing line, wherein the chip includes first and second opposing surfaces, and the first surface of the chip includes a conductive pad;
forming a connection joint that electrically connects the routing line and the pad;
forming a thermal conductor on the chip after attaching the chip to the routing line, wherein the thermal conductor includes first and second opposing surfaces and contacts the chip and is a thermal adhesive that is epoxy, solder or silicone;
forming an encapsulant after forming the thermal conductor on the chip, wherein the encapsulant includes first and second opposing surfaces, the first surfaces of the thermal conductor and the encapsulant face in a first direction, the second surfaces of the thermal conductor and the encapsulant face in a second direction opposite the first direction, the chip is embedded in the encapsulant and extends vertically beyond the routing line in the first direction, the thermal conductor extends vertically beyond the chip in the first direction, and the encapsulant contacts the entire first surface of the thermal conductor and covers and extends vertically beyond the chip and the thermal conductor in the first direction; and
grinding the encapsulant without grinding the thermal conductor and without grinding the chip such that the first surface of the encapsulant migrates in the second direction, then grinding the encapsulant and the thermal conductor without grinding the chip such that the first surfaces of the encapsulant and the thermal conductor migrate in the second direction, and then halting the grinding before the grinding reaches the chip, thereby exposing the thermal conductor without exposing the chip such that the thermal conductor and the encapsulant are laterally aligned with one another at a lateral surface that faces in the first direction and the encapsulant surrounds and is adjacent to the thermal conductor at the lateral surface.

32. The method of claim 31, wherein providing the routing line includes selectively depositing the routing line on a metal base, attaching the chip to the routing line includes positioning the chip such that the metal base extends vertically beyond the chip in the second direction, and after forming the encapsulant, etching the metal base thereby reducing contact area between the metal base and the routing line.

33. The method of claim 32, wherein forming the routing line includes:
providing a plating mask on the metal base, wherein the plating mask includes an opening that exposes a portion of the metal base; and then
electroplating the routing line on the exposed portion of the metal base through the opening in the plating mask.

34. The method of claim 32, wherein etching the metal base removes a first portion of the metal base that contacts the routing line without removing a second portion of the metal base that contacts the routing line, thereby reducing but not eliminating contact area between the metal base and the routing line.

35. The method of claim 32, wherein etching the metal base eliminates contact area between the metal base and the routing line.

36. The method of claim 32, wherein etching the metal base removes the metal base.

37. The method of claim 32, wherein etching the metal base electrically isolates the routing line from other routing lines formed on the metal base.

38. The method of claim 31, wherein forming the thermal conductor on the chip includes depositing the thermal adhesive on the chip and then hardening the thermal adhesive.

39. The method of claim 31, wherein forming the encapsulant includes transfer molding.

40. The method of claim 31, wherein grinding the encapsulant includes applying a rotating diamond sand wheel to the encapsulant, and grinding the encapsulant and the thermal conductor includes applying the rotating diamond sand wheel to the encapsulant and the thermal conductor.

41. The method of claim 31, wherein the thermal conductor covers the chip in the first direction.

42. The method of claim 31, wherein the thermal adhesive is epoxy.

43. The method of claim 31, wherein the thermal adhesive is solder.

44. The method of claim 31, wherein the thermal adhesive is silicone.

45. The method of claim 31, wherein the encapsulant contacts the chip.

46. The method of claim 31, wherein the encapsulant is spaced from the chip.

47. The method of claim 31, including forming the connection joint before forming the encapsulant.

48. The method of claim 31, including forming the connection joint after forming the encapsulant.

49. The method of claim 31, including attaching a heat sink to the thermal conductor after grinding the encapsulant and the thermal conductor, wherein the heat sink contacts the thermal conductor and covers and extends vertically beyond the chip and the thermal conductor in the first direction.

50. The method of claim 31, wherein the assembly is a first-level package.

51. A method of making a semiconductor chip assembly, comprising:
providing a routing line; then
mechanically attaching a semiconductor chip to the routing line, wherein the chip includes first and second opposing surfaces, and the first surface of the chip includes a conductive pad;
forming a metal pillar on the routing line, wherein the metal pillar includes first and second opposing surfaces;
forming a connection joint that electrically connects the routing line and the pad;
forming a thermal conductor on the chip, wherein the thermal conductor includes first and second opposing surfaces and a thermal adhesive that contacts the chip;
forming an encapsulant after attaching the chip to the routing line, forming the metal pillar on the routing line and forming the thermal conductor on the chip, wherein the encapsulant includes first and second opposing surfaces, the first surfaces of the metal pillar, the thermal conductor and the encapsulant face in a first direction, the second surfaces of the metal pillar, the thermal conductor and the encapsulant face in a second direction opposite the first direction, the chip is embedded in the encapsulant and extends vertically beyond the routing line in the first direction, the routing line extends laterally beyond the metal pillar towards the chip and extends vertically beyond the chip and the metal pillar in the second direction, the metal pillar is embedded in the encapsulant and disposed outside a periphery of the chip and extends vertically beyond the chip in the first direction and extends vertically across most or all of a thickness of the chip between the first and second surfaces of the chip, the thermal conductor extends vertically beyond the chip in the first direction, and the encapsulant contacts the metal pillar and the thermal conductor and covers and extends vertically beyond the chip, the metal pillar and the thermal conductor in the first direction; and
grinding the encapsulant without grinding the metal pillar and without grinding the thermal conductor and without grinding the chip such that the first surface of the encapsulant migrates in the second direction, then grinding the encapsulant, the metal pillar and the thermal conductor without grinding the chip such that the first surfaces of the encapsulant, the metal pillar and the thermal conductor migrate in the second direction, and then halting the grinding before the grinding reaches the chip, thereby exposing the metal pillar and the thermal conductor without exposing the chip such that the metal pillar, the thermal conductor and the encapsulant are laterally aligned with one another at a lateral surface that faces in the first direction.

52. The method of claim 51, wherein providing the routing line includes selectively depositing the routing line on a metal base, attaching the chip to the routing line includes positioning the chip such that the metal base extends vertically beyond the chip in the second direction, and after forming the encapsulant, etching the metal base thereby reducing contact area between the metal base and the routing line.

53. The method of claim 52, wherein forming the routing line includes:
providing a plating mask on the metal base, wherein the plating mask includes an opening that exposes a portion of the metal base; and then
electroplating the routing line on the exposed portion of the metal base through the opening in the plating mask.

54. The method of claim 52, wherein etching the metal base removes a first portion of the metal base that contacts the routing line without removing a second portion of the metal base that contacts the routing line, thereby reducing but not eliminating contact area between the metal base and the routing line.

55. The method of claim 52, wherein etching the metal base eliminates contact area between the metal base and the routing line.

56. The method of claim 52, wherein etching the metal base removes the metal base.

57. The method of claim 52, wherein etching the metal base electrically isolates the routing line from other routing lines formed on the metal base.

58. The method of claim 51, wherein forming the thermal conductor consists of forming the thermal adhesive on the chip, and grinding the thermal conductor includes grinding the thermal adhesive such that the thermal adhesive and the encapsulant are laterally aligned with one another at the lateral surface.

59. The method of claim 58, wherein the thermal adhesive is epoxy.

60. The method of claim 58, wherein the thermal adhesive is solder.

61. The method of claim 58, wherein the thermal adhesive is silicone.

62. The method of claim 51, wherein forming the encapsulant includes transfer molding.

63. The method of claim 51, wherein grinding the encapsulant includes applying a rotating diamond sand wheel to the encapsulant, and grinding the encapsulant, the metal pillar and the thermal conductor includes applying the rotating diamond sand wheel to the encapsulant, the metal pillar and the thermal conductor.

64. The method of claim 51, wherein the encapsulant surrounds and is adjacent to the metal pillar at the lateral surface, the encapsulant surrounds and is adjacent to the thermal conductor at the lateral surface and the metal pillar and the thermal conductor are spaced from one another at the lateral surface.

65. The method of claim 51, including forming the thermal conductor on the chip before attaching the chip to the routing line.

66. The method of claim 51, including forming the thermal conductor on the chip after attaching the chip to the routing line.

67. The method of claim 51, including forming the connection joint before forming the encapsulant.

68. The method of claim 51, including forming the connection joint after forming the encapsulant.

69. The method of claim 51, including attaching a heat sink to the thermal conductor after grinding the encapsulant, the metal pillar and the thermal conductor, wherein the heat sink contacts the metal pillar and the thermal conductor and covers and extends vertically beyond the chip, the metal pillar and the thermal conductor in the first direction.

70. The method of claim 51, wherein the assembly is a first-level package.

71. A method of making a semiconductor chip assembly, comprising:
provide a routing line; then
mechanically attaching a semiconductor chip to the routing line, wherein the chip includes first and second opposing surfaces, and the first surface of the chip includes a conductive pad;
forming a connection joint that electrically connects the routing line and the pad;
forming a thermal conductor on the chip, wherein the thermal conductor includes first and second opposing surfaces and a thermal adhesive that contacts the chip;
forming an encapsulant after attaching the chip to the routing line and forming the thermal conductor on the chip, wherein the encapsulant includes first and second opposing surfaces, the first surfaces of the thermal conductor and the encapsulant face in a first direction, the second surfaces of the thermal conductor and the encapsulant face in a second direction opposite the first direction, the chip is embedded in the encapsulant and extends vertically beyond the routing line in the first direction, the thermal conductor extends vertically beyond the chip in the first direction, and the encapsulant contacts the thermal conductor and covers and extends vertically beyond the chip and the thermal conductor in the first direction;
forming an insulative base after forming the encapsulant, wherein the insulative base includes a first surface that faces in the first direction and a second surface that faces in the second direction, and the insulative base contacts and covers and extends vertically beyond the routing line in the second direction and covers and is spaced from and extends vertically beyond the chip and the thermal conductor in the second direction;
grinding the encapsulant without grinding the thermal conductor and without grinding the chip such that the first surface of the encapsulant migrates in the second direction, then grinding the encapsulant and the thermal conductor without grinding the chip such that the first surfaces of the encapsulant and the thermal conductor migrate in the second direction, and then halting the grinding of the encapsulant and the thermal conductor before the grinding of the encapsulant and the thermal conductor reaches the chip, thereby exposing the thermal conductor without exposing the chip such that the thermal conductor and the encapsulant are laterally aligned with one another at a first lateral surface that faces in the first direction; and
grinding the insulative base without grinding a metal conductor that includes a first surface that faces in the first direction and a second surface that faces in the second direction and that contacts the routing line and without grinding the routing line and without grinding the chip such that the second surface of the insulative base migrates in the first direction, then grinding the insulative base and the metal conductor without grinding the chip such that the second surfaces of the insulative base and the metal conductor migrate in the first direction, and then halting the grinding of the insulative base and the metal conductor before the grinding of the insulative base and the metal conductor reaches the chip, thereby exposing the metal conductor without exposing the chip such that the insulative base and the metal conductor are laterally aligned with one another at a second lateral surface that faces in the second direction.

72. The method of claim 71, wherein providing the routing line includes selectively depositing the routing line on a metal base, attaching the chip to the routing line includes positioning the chip such that the metal base extends vertically beyond the chip in the second direction, and after forming the encapsulant and before forming the insulative base, etching the metal base thereby reducing contact area between the metal base and the routing line.

73. The method of claim 72, wherein forming the routing line includes:
providing a plating mask on the metal base, wherein the plating mask includes an opening that exposes a portion of the metal base; and then
electroplating the routing line on the exposed portion of the metal base through the opening in the plating mask.

74. The method of claim 72, wherein etching the metal base removes a first portion of the metal base that contacts the routing line without removing a second portion of the metal base that contacts the routing line, thereby reducing but not eliminating contact area between the metal base and the routing line.

75. The method of claim 72, wherein etching the metal base eliminates contact area between the metal base and the routing line.

76. The method of claim 72, wherein etching the metal base removes the metal base.

77. The method of claim 72, wherein etching the metal base electrically isolates the routing line from other routing lines formed on the metal base.

78. The method of claim 71, wherein forming the thermal conductor consists of forming the thermal adhesive on the chip, and grinding the thermal conductor includes grinding the thermal adhesive such that the thermal adhesive and the encapsulant are laterally aligned with one another at the first lateral surface.

79. The method of claim 78, wherein the thermal adhesive is epoxy.

80. The method of claim 78, wherein the thermal adhesive is solder.

81. The method of claim 78, wherein the thermal adhesive is silicone.

82. The method of claim 71, wherein forming the encapsulant includes transfer molding.

83. The method of claim 71, wherein grinding the encapsulant includes applying a rotating diamond sand wheel to the encapsulant, and grinding the encapsulant and the thermal conductor includes applying the rotating diamond sand wheel to the encapsulant and the thermal conductor.

84. The method of claim 71, wherein the encapsulant surrounds and is adjacent to the thermal conductor at the first lateral surface, and the insulative base surrounds the metal conductor at the second lateral surface.

85. The method of claim 71, including forming the thermal conductor on the chip before attaching the chip to the routing line.

86. The method of claim 71, including forming the thermal conductor on the chip after attaching the chip to the routing line.

87. The method of claim 71, including forming the connection joint before forming the encapsulant.

88. The method of claim 71, including forming the connection joint after forming the encapsulant.

89. The method of claim 71, including attaching a heat sink to the thermal conductor after grinding the encapsulant and the thermal conductor, wherein the heat sink contacts the thermal conductor and covers and extends vertically beyond the chip and the thermal conductor in the first direction.

90. The method of claim 71, wherein the assembly is a first-level package.

91. A method of making a semiconductor chip assembly, comprising:
providing a routing line; then
mechanically attaching a semiconductor chip to the routing line, wherein the chip includes first and second opposing surfaces, and the first surface of the chip includes a conductive pad;
forming a metal pillar on the routing line, wherein the metal pillar includes first and second opposing surfaces;
forming a connection joint that electrically connects the routing line and the pad;
forming a thermal conductor on the chip after attaching the chip to the routing line, wherein the thermal conductor includes first and second opposing surfaces and contacts the chip and is a thermal adhesive;
forming an encapsulant after forming the metal pillar on the routing line and forming the thermal conductor on the chip, wherein the encapsulant includes first and second opposing surfaces, the first surfaces of the metal pillar, the thermal conductor and the encapsulant face in a first direction, the second surfaces of the metal pillar, the thermal conductor and the encapsulant face in a second direction opposite the first direction, the chip is embedded in the encapsulant and extends vertically beyond the routing line in the first direction, the routing line extends laterally beyond the metal pillar towards the chip and extends vertically beyond the chip and the metal pillar in the second direction, the metal pillar is embedded in the encapsulant and disposed outside a periphery of the chip and extends vertically beyond the chip in the first direction and extends vertically across most or all of a thickness of the chip between the first and second surfaces of the chip, the thermal conductor extends vertically beyond the chip in the first direction, and the encapsulant contacts the entire first surfaces of the metal pillar and the thermal conductor and covers and extends vertically beyond the chip, the metal pillar and the thermal conductor in the first direction; and
grinding the encapsulant without grinding the metal pillar and without grinding the thermal conductor and without grinding the chip such that the first surface of the encapsulant migrates in the second direction, then grinding the encapsulant, the metal pillar and the thermal conductor without grinding the chip such that the first surfaces of the encapsulant, the metal pillar and the thermal conductor migrate in the second direction, and then halting the grinding before the grinding reaches the chip, thereby exposing the metal pillar and the thermal conductor without exposing the chip such that the metal pillar, the thermal conductor and the encapsulant are laterally aligned with one another at a lateral surface that faces in the first direction, the encapsulant surrounds and is adjacent to the metal pillar at the lateral surface, the encapsulant surrounds and is adjacent to the thermal conductor at the lateral surface and the metal pillar and the thermal conductor are spaced from one another at the lateral surface.

92. The method of claim 91, wherein providing the routing line includes selectively depositing the routing line on a metal base, attaching the chip to the routing line includes positioning the chip such that the metal base extends vertically beyond the chip in the second direction, and after forming the encapsulant, etching the metal base thereby reducing contact area between the metal base and the routing line.

93. The method of claim 91, wherein forming the thermal conductor on the chip includes depositing the thermal adhesive on the chip and then hardening the thermal adhesive.

94. The method of claim 91, wherein forming the encapsulant includes transfer molding, grinding the encapsulant includes applying a rotating diamond sand wheel to the encapsulant, and grinding the encapsulant, the metal pillar and the thermal conductor includes applying the rotating diamond sand wheel to the encapsulant, the metal pillar and the thermal conductor.

95. The method of claim 91, including attaching a heat sink to the thermal conductor after grinding the encapsulant, the metal pillar and the thermal conductor, wherein the heat sink contacts the metal pillar and the thermal conductor and covers and extends vertically beyond the chip, the metal pillar and the thermal conductor in the first direction.

96. A method of making a semiconductor chip assembly, comprising:
providing a routing line; then
mechanically attaching a semiconductor chip to the routing line, wherein the chip includes first and second opposing surfaces, and the first surface of the chip includes a conductive pad;
forming a metal pillar on the routing line, wherein the metal pillar includes first and second opposing surfaces;
forming a connection joint that electrically connects the routing line and the pad;
forming a thermal conductor on the chip after attaching the chip to the routing line, wherein the thermal conductor includes first and second opposing surfaces and contacts the chip and is a thermal adhesive;
forming an encapsulant after forming the metal pillar on the routing line and forming the thermal conductor on the chip, wherein the encapsulant includes first and second opposing surfaces, the first surfaces of the metal pillar, the thermal conductor and the encapsulant face in a first direction, the second surfaces of the metal pillar, the thermal conductor and the encapsulant face in a second direction opposite the first direction, the chip is embedded in the encapsulant and extends vertically beyond the routing line in the first direction, the routing line extends laterally beyond the metal pillar towards the chip and extends vertically beyond the chip and the metal pillar in the second direction, the metal pillar is embedded in the encapsulant and disposed outside a periphery of the chip and extends vertically beyond the chip in the first direction and extends vertically across most or all of a thickness of the chip between the first and second surfaces of the chip, the thermal conductor extends vertically beyond the chip in the first direction, and the encapsulant contacts the entire first surfaces of the metal pillar and the thermal conductor and covers and extends vertically beyond the chip, the metal pillar and the thermal conductor in the first direction;

grinding the encapsulant without grinding the metal pillar and without grinding the thermal conductor and without grinding the chip such that the first surface of the encapsulant migrates in the second direction, then grinding the encapsulant, the metal pillar and the thermal conductor without grinding the chip such that the first surfaces of the encapsulant, the metal pillar and the thermal conductor migrate in the second direction, and then halting the grinding before the grinding reaches the chip, thereby exposing the metal pillar and the thermal conductor without exposing the chip such that the metal pillar, the thermal conductor and the encapsulant are laterally aligned with one another at a lateral surface that faces in the first direction, the encapsulant surrounds and is adjacent to the metal pillar at the lateral surface, the encapsulant surrounds and is adjacent to the thermal conductor at the lateral surface and the metal pillar and the thermal conductor are spaced from one another at the lateral surface; and attaching a heat sink to the thermal conductor after grinding the encapsulant, the metal pillar and the thermal conductor, wherein the heat sink contacts the metal pillar and the thermal conductor and covers and extends vertically beyond the chip, the metal pillar and the thermal conductor in the first direction.

97. The method of claim 96, wherein attaching the heat sink to the thermal conductor includes depositing a second thermal adhesive on the metal pillar, the thermal conductor and the encapsulant and then hardening the second thermal adhesive such that the second thermal adhesive contacts the metal pillar, the thermal conductor and the encapsulant and is not overlapped in the first direction.

98. The method of claim 96, wherein attaching the heat sink to the thermal conductor includes depositing a second thermal adhesive on the thermal conductor, placing a metal plate on the second thermal adhesive and then hardening the second thermal adhesive such that the second thermal adhesive contacts and is sandwiched between the metal plate and the thermal conductor.

99. The method of claim 96, wherein attaching the heat sink to the thermal conductor includes depositing a second thermal adhesive on the metal pillar, the thermal conductor and the encapsulant, placing a metal plate on the second thermal adhesive and then hardening the second thermal adhesive such that the second thermal adhesive contacts and is sandwiched between the metal plate and the metal pillar, the metal plate and the thermal conductor and the metal plate and the encapsulant.

100. The method of claim 96, wherein attaching the heat sink to the thermal conductor includes depositing a metal film on the metal pillar, the thermal conductor and the encapsulant using sputtering or physical vapor deposition such that the metal film contacts the metal pillar, the thermal conductor and the encapsulant.

* * * * *